(12) United States Patent
Bashyam et al.

(10) Patent No.: US 7,881,544 B2
(45) Date of Patent: Feb. 1, 2011

(54) METHODS AND APPARATUS FOR REDUCING STORAGE SIZE

(75) Inventors: Murali Bashyam, Fremont, CA (US);
Goutham Rao, San Jose, CA (US);
Carter George, Portland, OR (US); Eric Brueggemann, Cupertino, CA (US)

(73) Assignee: Dell Products L.P., Round Rock, TX (US)

( * ) Notice: Subject to any disclaimer, the term of this patent is extended or adjusted under 35 U.S.C. 154(b) by 878 days.

(21) Appl. No.: 11/774,278

(22) Filed: Jul. 6, 2007

(65) Prior Publication Data

US 2008/0050047 A1 Feb. 28, 2008

Related U.S. Application Data

(60) Provisional application No. 60/840,378, filed on Aug. 24, 2006, provisional application No. 60/874,657, filed on Dec. 12, 2006.

(51) Int. Cl.
*G06K 9/36* (2006.01)

(52) U.S. Cl. .................... 382/232; 382/233; 382/236; 382/239

(58) Field of Classification Search ................ 382/232, 382/233, 236, 238, 239, 224, 243, 305; 341/51, 341/107; 345/473, 422, 418, 426; 707/999.101, 707/E17.002; 1/1
See application file for complete search history.

(56) References Cited

U.S. PATENT DOCUMENTS 6,990,242 B2    1/2006    Malvar .................... 382/ 238

7,161,507 B2 *  1/2007    Tomic ......................... 341/51
2006/0104525 A1  5/2006   Gringeler et al. ............ 382/244
2006/0104526 A1  5/2006   Gringeler et al. ........... 382/ 232

OTHER PUBLICATIONS

V K Govindan and B.S. Shajeemohan, "An Intelligent Text Data Encryption and Compression for High Speed and Secure Data Transmission Over Internet," (6 pages).

* cited by examiner

*Primary Examiner*—Anh Hong Do
(74) *Attorney, Agent, or Firm*—Haynes & Boone, LLP.

(57) ABSTRACT

Prediction-based compression engines are spoon-fed with sequentially efficiently compressible (SEC) streams of input data that make it possible for the compression engines to more efficiently compress or otherwise compact the incoming data than would be possible with streams of input data accepted on a TV-raster scan basis. Various techniques are disclosed for intentionally forming SEC input data streams. Among these are the tight packing of alike files or fragments into concatenation suitcases and the decomposition of files into substantially predictably consistent (SPC) fragments or segments that are routed to different suitcases according to their type. In a graphics-directed embodiment, image frames are partitioned into segment areas that are internally SPC and multidirectional walks (i.e., U-turning walks) are defined in the segment areas where these defined walks are traced during compression and also during decompression. A variety of pre-compression data transformation methods are disclosed for causing apparently random data sequences to appear more compressibly alike to each other. The methods are usable in systems that permit substantially longer times for data compaction operations than for data decompaction operations.

33 Claims, 20 Drawing Sheets

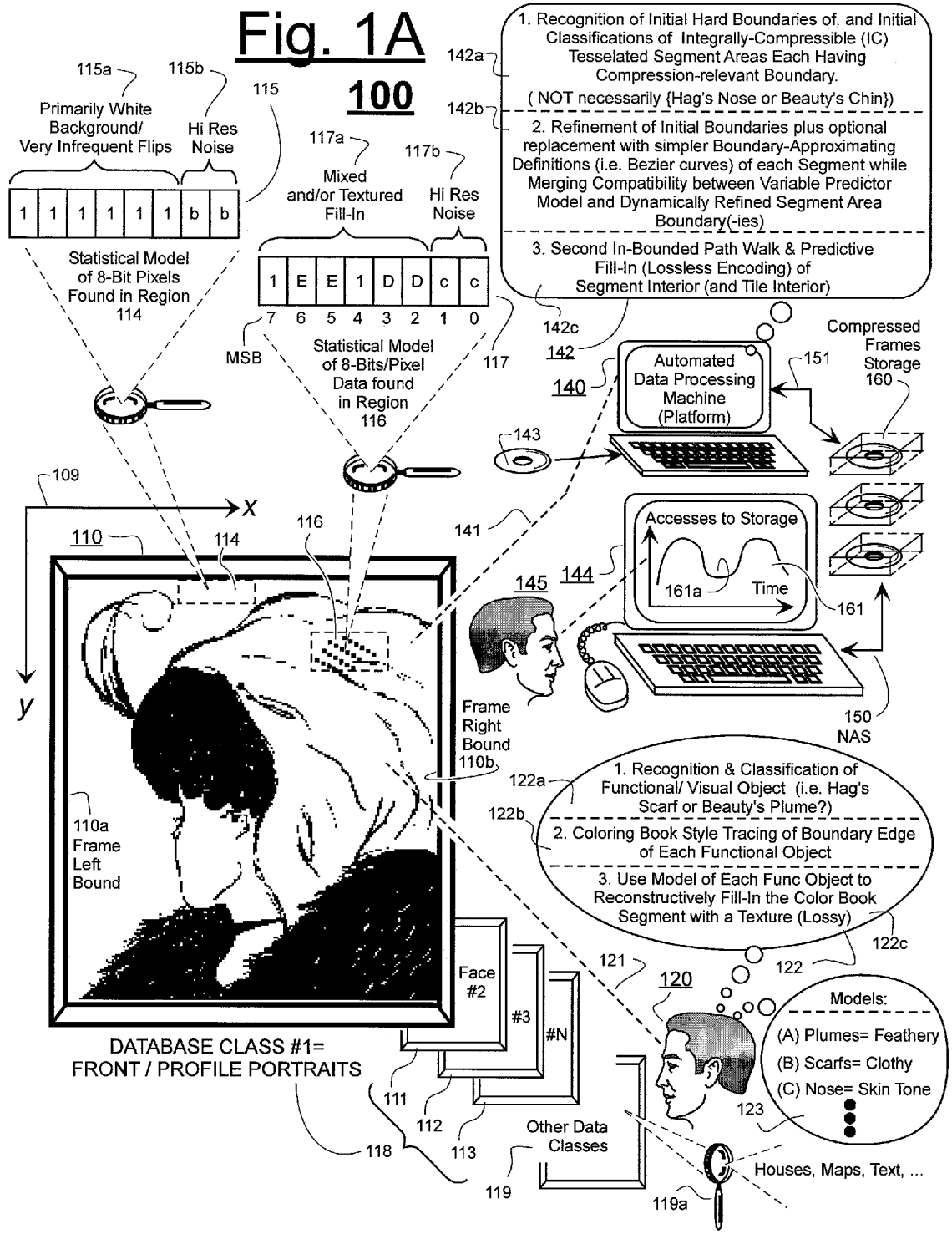

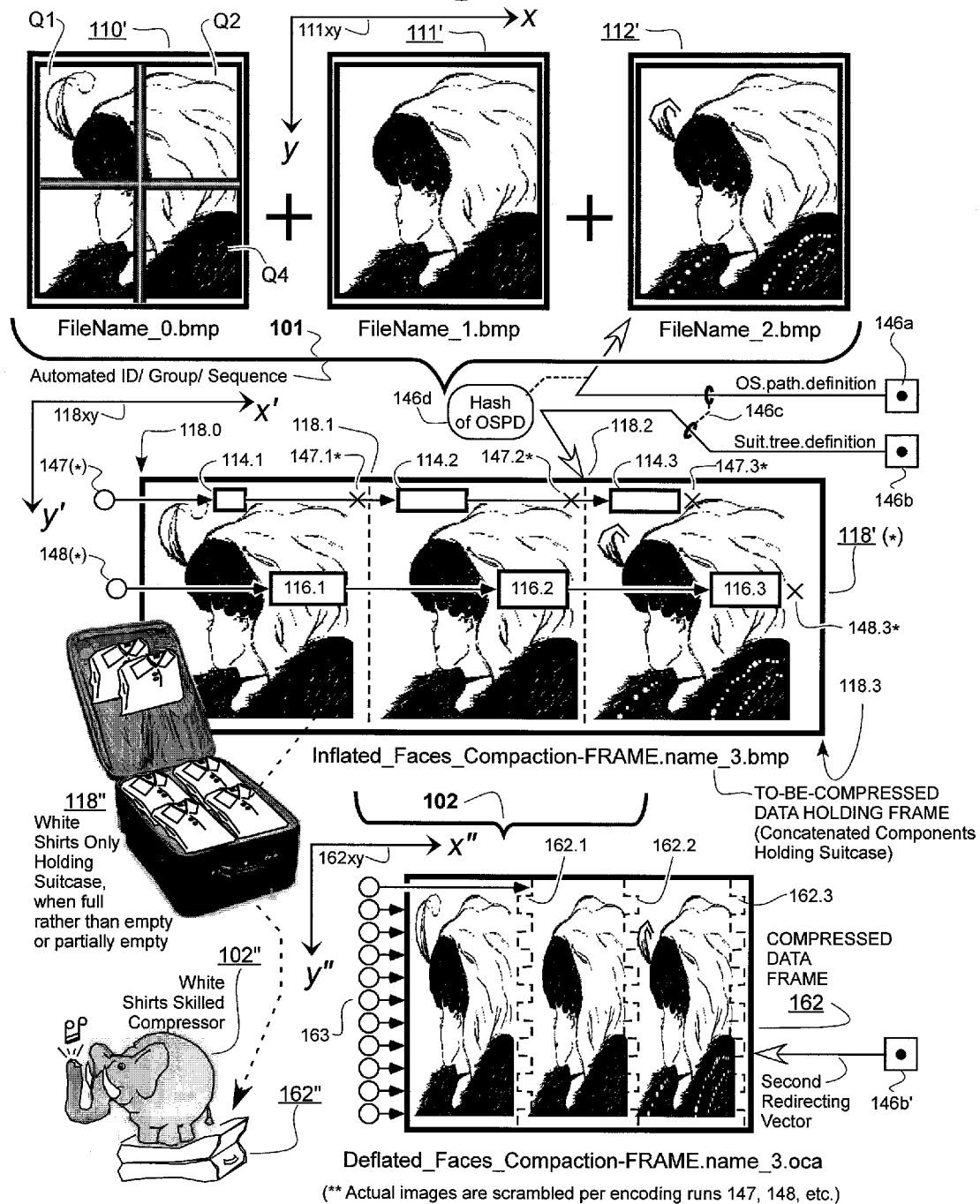

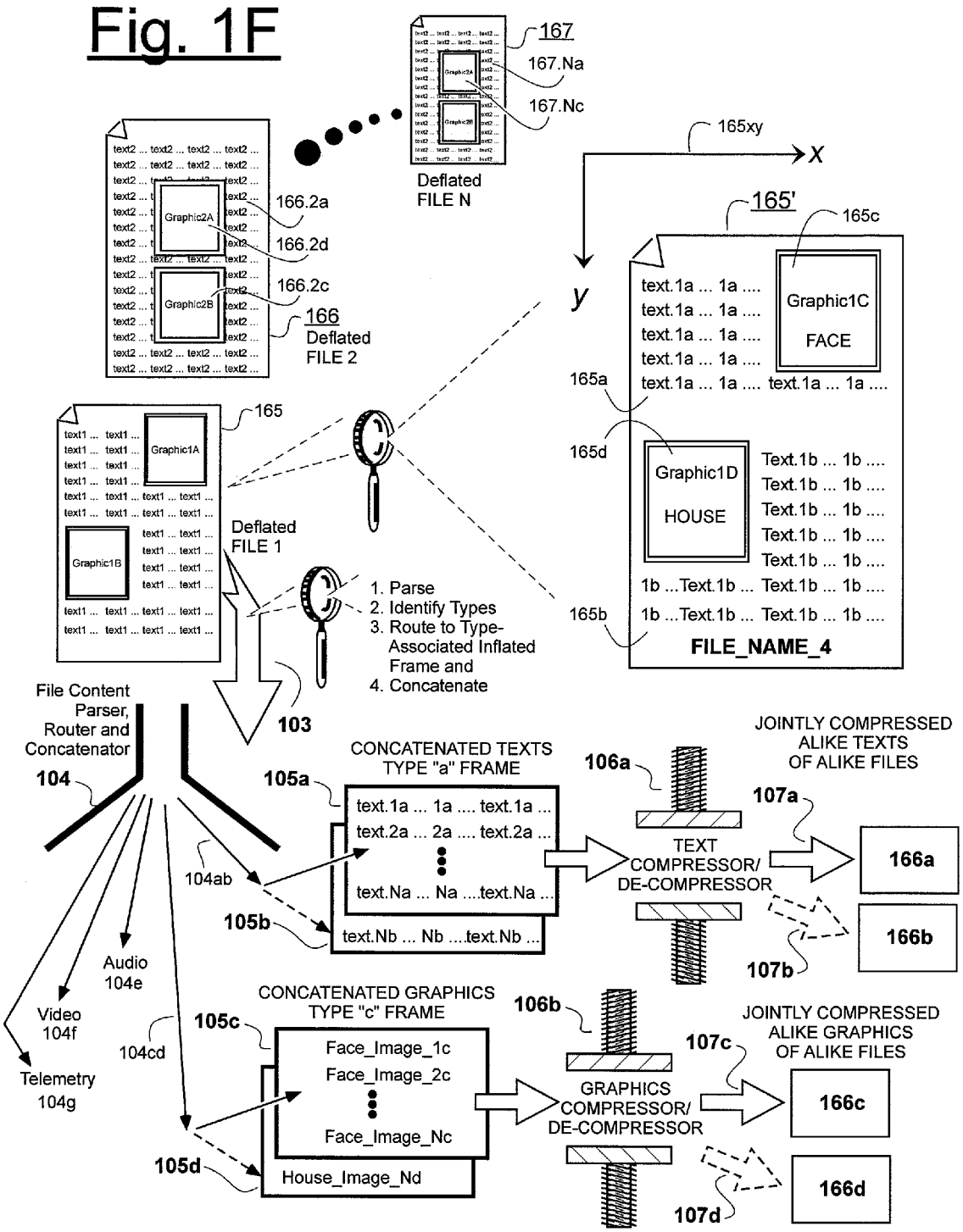

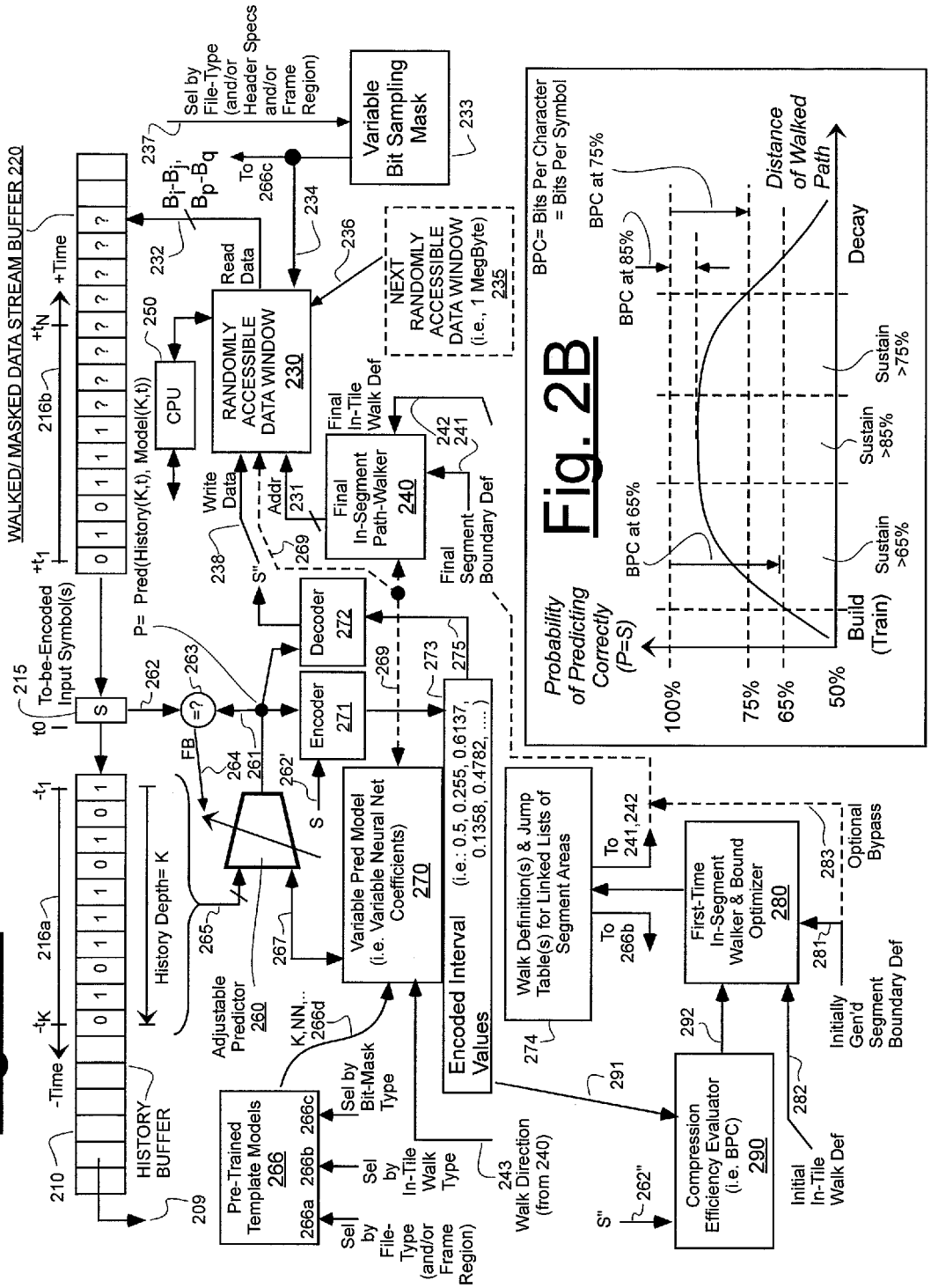

Fig. 6A  Jump Table 600

| Row (Index) | Seg Area Top Left Corner | Ptr to Left Border Def(s) | Seg Area Bot Right Corner | Ptr to Right Border Def(s) | Seg Area Gravity Coeff's | Ptr to Index of Next Seg Area to Jump to |
|---|---|---|---|---|---|---|
| 1 | $(x_1,y_1)$ | $Ptr_{L11}$ | $(x_2,y_2)$ | $Ptr_{R22}$ | R00, Texture01 | 2 (541') |
| 2 | $(x_3,y_3)$ | $Ptr_{L33}$ | $(x_4,y_4)$ | $Ptr_{R44}$ | R10, Texture01 | 5 (547') |
| 3 | $(x_5,y_5)$ | $Ptr_{L55}$ | $(x_6,y_6)$ | $Ptr_{R66}$ | G30, Texture03 | 6 (551') |
| 4 | $(x_7,y_7)$ | $Ptr_{L77}$ | $(x_8,y_8)$ | $Ptr_{R88}$ | V60, Texture16 | 7 |
| 5 | $(x_9,y_9)$ | $Ptr_{L99}$ | $(x_a,y_a)$ | $Ptr_{Raa}$ | O20, Texture02 | 12 |
| 6 | $(x_b,y_b)$ | $Ptr_{Lbb}$ | $(x_c,y_c)$ | $Ptr_{Rcc}$ | G40, Texture04 | 8 |
| 7 | $(x_d,y_d)$ | $Ptr_{Ldd}$ | $(x_e,y_e)$ | $Ptr_{Ree}$ | V70, Texture16 | 13 |
| 8 | $(x_f,y_f)$ | $Ptr_{Lff}$ | $(x_g,y_g)$ | $Ptr_{Rgg}$ | G50, Texture04 | 15 |

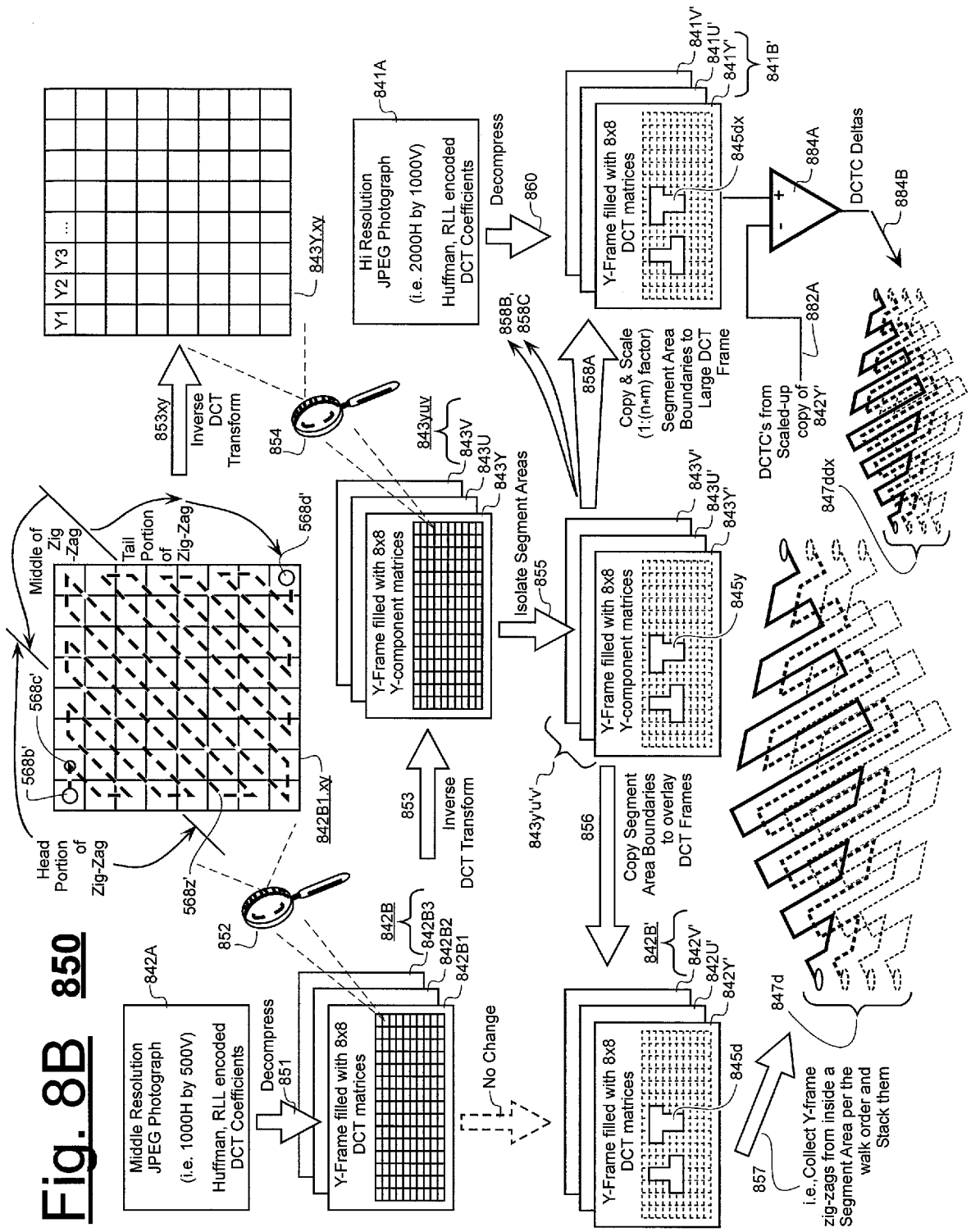

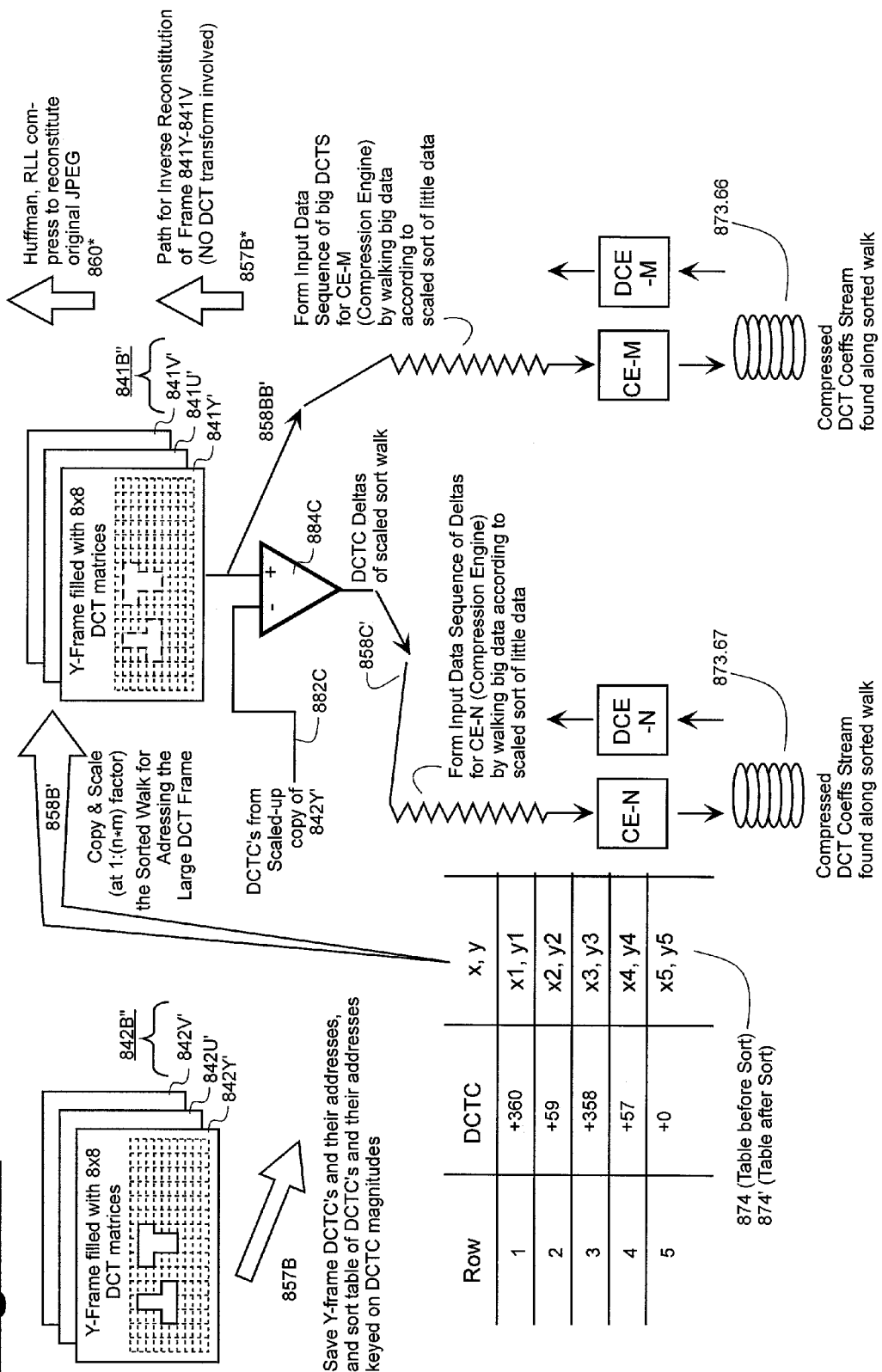

METHODS AND APPARATUS FOR REDUCING STORAGE SIZE

REFERENCE TO COPENDING APPLICATIONS

The following copending U.S. provisional patent applications are owned by the owner of the present application, and benefit is claimed pursuant to 35 USC §119 and their disclosures are incorporated herein by reference:

(A) U.S. Patent Ser. No. 60/840,378, filed on Aug. 24, 2006 on behalf of Murali Bashyam, and entitled "Storage Optimization And Reduction In A File Area Network, At The Storage Admission Tier"; and (B) U.S. Patent Ser. No. 60/874,657, filed on Dec. 12, 2006 on behalf of Murali Bashyam, and entitled "HYBRID NETWORK ATTACHED STORAGE DEVICE".

FIELD OF DISCLOSURE

The present disclosure of invention relates to reducing size of storage consumed by data for representing information where such reducing may include compression and decompression of digital data. The disclosure relates more specifically to lossless reduction of consumed storage space in a multi-file storage system and yet more particularly to situations where it is feasible to spend substantially more time compressing data (or otherwise reducing the storage space it consumes) than to decompressing the data.

DESCRIPTION OF RELATED ART

Techniques for compression and decompression of digital data (hereinafter also "comp/decomp operations") are well known. Many algorithms have been developed including lossy ones and lossless ones.

Generally, it is desirable to balance comp/decomp throughput rates so that time, T1 taken for converting original (and usually intelligible) data into compressed format (where the latter is usually an unintelligible, encoded format) is about the same as the time, T2 taken for converting the compressed data back into its original format. By intelligible data, what is meant here is that the data is useful in some informative or instructive way to a human or to a predefined machine that uses the data, such as computer or another kind of data processing machine that uses the data while executing a predefined algorithm.

Comp/decomp processes are typically employed when large amounts of data need to be written to and then read back from bulk memory (e.g., one or more magnetic disk drives) and/or when large amounts of data need to be transmitted through a network of limited bandwidth. At least in the latter case, the comp/decomp processes generally need to have equal throughput rates so that data can flow through network links continuously on a smooth and sustainable basis. Given that comp/decomp processes are typically designed for generic use both in file storage applications and in data transmission applications, conventional wisdom calls for maintaining a balance between comp/decomp data throughput rates and for maximizing the data throughput rates of both operations.

One class of compression techniques relies on something known as entropy encoding. As implied by its name, an entropy encoding process receives a first sequence of data (e.g., a sequence of consecutive symbols) and responsively outputs an encoded sequence whose content has a greater level of disorderliness (higher entropy) than found in the original input sequence. The supplied input sequence has to have some form of innate orderliness in it for compression to take place. When a compression algorithm produces an output of reduced orderliness relative to the input stream, that reduction of orderliness often indicates that redundant information has been removed by the compression process. A data sequence consisting of only random 1's and 0's may be considered to have a zero level of orderliness (or contrastingly, a highest amount of entropy). Signals that include non-random sequences of 1's and 0's (or non-random sequences of other predefined symbols) may be considered to have higher levels of orderliness, with degree of orderliness increasing as randomness decreases.

A consequence of the above theoretical considerations is that entropy encoding may not be used to effectively compress a signal consisting of totally random 1's and 0's. This is so because there is no lower level of orderliness (or higher level of disorderliness, higher amount of entropy) to step forward into when attempting a compression. Practitioners are often surprised when they apply a conventional compression algorithm to a highly disordered file (whose state of disorderliness is not known to them at the time) and they discover that the encoded output file is not reduced in size and is often larger in size. In other words, the desired reduction of file size was not achieved. One reason this sometimes happens is because the best that could be hoped for when dealing with a fully random or a highly disordered sequence of input data is that the compression algorithm will not substantially increase the number of bits seen in its encoded output relative to the number of bits seen in the input sequence. Generally, however, machine-implemented compression algorithms are not designed to have intelligence for recognizing that they are working on highly disordered input data and as a result they blindly crunch out an encoded result that is larger in size than the original input.

A second reason why a conventional compression algorithm may fail to reduce file size has to do with file storage blocking. Many operating systems (OS's) and or file servers group their storage data into standard sized storage blocks (file system blocks) when storing the data on various media such as a magnetic hard disk for example. One commonly used File System Block (FSB) size is 4 KiloBytes (4 KB). Another common FSB is 128 KB. If the nominal FSB (file system block) size of a given storage system is 4 KB, then all files will consume storage in sizes that are integer multiples of 4 KB. Each 1 KB file will be stored as a 4 KB storage block that contains 75% empty space. Each 8.1 KB file will be stored as a 12 KB set of storage blocks that is 32.5% empty. Even if a compression algorithm succeeds in deflating a 12 KB file down to 8.1 KB (a 32.5% size reduction, which is fairly good compression), the result will nonetheless consume 12 KB of storage space that is 32.5% empty, the reason being that the OS (or file server) stores the data as a three-storage blocks long file anyway. Conventional compression algorithms are generally designed to perform their job independently of operating system or file server considerations. Once a compression algorithm succeeds in shrinking 12 KB of input data down to say, 8.1 KB, the algorithm simply hands off the result to the OS for storage and washes its hands of further responsibility until time comes for decompressing the data. As a result of file storage blocking, actual storage size often does not decrease and time and energy are wasted in blindly performing comp/decomp operations on small sized files (i.e., files of size less than about 10 to 20 times the base storage block size) without actually achieving reduction of consumed storage space.

In the art of data compression, there are different kinds of entropy encoding techniques. One subclass of entropy encoding is known as variable length entropy encoding. Another is known as limited length encoding. When the latter, limited length variety is employed, a compression engine is forced every so often to halt its encoding process and to flush itself clean of past history (of context) and/or to flush itself clean of an adaptively changing prediction model running inside the compression engine and to start afresh. Such a slate cleaning flush may be forced after a fixed number of pre-compression symbols have been encoded and/or after a fixed number of compressed data bits have been output and/or after a pre-defined time period has elapsed. Routine cleansings of this kind can help keep a compression engine from falling into a self-created quagmire where feedback within the engine causes the engine to persistently make bad encoding decisions, and as a result to persistently compress input data inefficiently or to fail to compress it at all. The downside of such often-repeated cleansings is that compression efficiency is disadvantageously reduced in cases where the engine happens to be on a good prediction run and is persistently making good encoding decisions for a current patch of input data due to the engine having adaptively (and perhaps luckily) evolved itself into a good prediction mode. Routine flushes in this case tend to indiscriminatingly erase good prediction models as well as bad ones and to thus hurt the overall compression efficiency.

When variable length entropy encoding is instead employed, the compression engine is allowed to keep its current entropy encoding process going as long as practical without being forced to perform routine flushes. This can have good or bad consequences depending on circumstances. If the compression engine is on a good prediction roll (good forecasting roll) and is consistently making good encoding decisions as it processes its input sequence of data, compression efficiency will be relatively high. However, if the compression engine (or more correctly, its internal prediction model) falls into a bad forecasting rut and thus a bad decision making rut, compression efficiency will disadvantageously drop and stay that way until the engine somehow purges itself of its ill formed prediction model and adaptively transitions towards one that is good for the currently incoming stream of data. Hybrid combinations of length-unlimited and run-length limited encodings are possible. Routinely forced cleansings may take place on a macro scale while length-unlimited encoding is allowed to take place on a micro scale. For example, a macro-encoding length might be limited to 3 KB of encoded output even in a system whose operating system groups data into 4 KB file storage blocks. Thus, when 3 KB of compressed output has been produced, the compression engine is halted and flushed of its context irrespective whether it is in a good or bad prediction run, the 3 KB of compressed output is stored (as a 4 KB long storage block that is 25% empty), and the flushed compression engine begins anew with a remaining part of the input data stream without retaining any memory (i.e., context) as to what was encountered immediately before.

Huffman encoding is one well known species among the various encoding techniques that may be used during compression. For example, the industry standard JPEG image compression algorithm employs Huffman encoding on DCT coefficients (Discrete Cosine Transform factors) extracted from a to-be-compressed input image (typically, a YCrCb coded image). While Huffman encoding may perform well in some instances, the encoding technique of choice for variable length and/or limited length entropy encoding is known as arithmetic encoding. Arithmetic encoding (ARI for short) relies on the maintaining of a running history of recently received un-compressed values (alphabet characters or symbols) and on the maintaining of a fixed or variable prediction model that indicates with fairly good accuracy what next un-compressed value (character or symbol) is most likely to appear in a sampled stream of input data given an input history of finite length. A seminal description of arithmetic encoding may be found in U.S. Pat. No. 4,122,440 issued Oct. 24, 1978 to Langdon, Jr., et al. A more modern example may be found in U.S. Pat. No. 6,990,242 issued Jan. 24, 2006 to Malvar. The latter provides a background explanation regarding a conventional arithmetic encoding scheme and how it may be coupled with an adaptive predicting model.

Academic papers on entropy encoding theory can be mathematically dense. Put into simple English terms, when an input stream of not-yet-compressed symbols (or characters) is somewhat but not totally random, good compression can be achieved if prediction (forecasting) can be carried out to a high degree of accuracy. Think of a radio weather forecaster who advices you on whether to bring an umbrella to work or not in the morning. If you follow his advice (i.e., because he said there was an 85% chance of heavy showers tonight) and it does rain in the evening as you head home, you find that your forecast dependent behavior, namely that of keeping the umbrella with you all morning was a good and worthwhile one. If it fails to rain at the time you head home, you find that your forecast dependent action of keeping the umbrella with you all morning was a bad and cumbersome one. You became less efficient because you were more so hampered rather than helped by the presence of the hung onto umbrella.

It is sort of the same for a compression engine that relies on good forecasting by its internal prediction model. If the on-going prediction process guesses well regarding what the likelihood is of each member of the symbol alphabet showing up in a next sampling slot (i.e., there is an 85% chance that the letter "u" will follow the "q" we just saw), then when the prediction based compression engine consequently hangs onto a corresponding encoding behavior that comports with the forecast, the encoder performs well. It compresses well. If, on the other hand, the forecast is more often wrong rather than right, the compression engine performs poorly because it hung onto an encoding behavior that turned out to be a compression-hampering one rather than a helpful one. If an input stream is totally random, then all symbols have equal probability of showing up in the next sample slot; there is no differential between symbol probabilities, and it is not possible to predict which symbol will come ahead of another. As a result it is not theoretically possible to efficiently compress the size of the input stream by means of entropy encoding—this assuming each symbol is already minimized in size to the extent possible. In terms of the simplistic analogy to the radio weather forecaster, what this means is that if there is a 50/50 chance that it will rain this evening irrespective of what the radio weather forecaster says, you are wasting your time and energy listening to that weather forecaster and following his advice. You may be better off simply flipping a coin or always bringing your umbrella.

Given the need in the compression arts for accurate predicting (forecasting), it is often desirable to provide a unit known as an adaptive predictor inside a compression engine. An adaptive predictor can adapt to changing input terrains (often doing so only slowly) and can thereby return to predicting with good accuracy the likelihood of each member of the alphabet set appearing next in the sampled input stream even as the statistics of the incoming stream changes. For example, if the symbols happen to be the letters of the English language, and the incoming (but not yet known) text is English prose, the adaptive predictor may initially indicate that there is a 13% chance that an "E" will appear next; a 10% chance that a "T" will appear next; an 8% chance that an "A" will appear next; and so on for all the letters of the utilized alphabet set (i.e., A-Z). However, if the received prose shows itself to have a slightly different statistical distribution of symbol appearance (e.g., "E" appears only 6% of the time and "A" appears at a 12% rate because the prose is in a piece discussing "aardvarks"), the adaptive predictor can often slowly transform itself to reflecting this alternate statistical distribution and to guessing well again regarding what the likelihood is that an "A" will appear next in the sampled input stream.

Adaptive predictors are typically configured to look at an accumulated history (also known as the "context") of recent un-compressed values received in the input stream so that the predictor can shift towards providing a more accurate prediction of what is expected to come next as the stream changes. A good predictor bases its prediction not only on the number of times that each symbol appeared in recent history but also on the specific sequences of symbols that more often precede the expected next symbol. Adaptive predictors keep adaptively modifying themselves in view of their recent prediction successes and failures so that the predictor (or prediction model as it is often also called) trends towards an error-minimizing state. If the error-minimizing state is maintained, the predictor has a good chance of indicating with fairly good accuracy what the probabilities are for seeing each of a limited number of alphabet members as being the next character in a sampled stream of incoming characters. A character, by the way, can be a single bit or a plurality of bits such as groups of 4 bits apiece or 8 bits apiece or 24 bits apiece or variable length bit runs whose terminus is defined based on bit sequence. Reference here to the 26 basic letters of the English language is merely for purpose of providing a simple example. In general, symbols can come in a wide variety of forms. Alphabets may have any finite number of plural and unique symbols as their members. Different sequences of first symbols of a first alphabet may define unique second symbols of a second alphabet set. (A member of the second alphabet may be viewed as a "super-symbol" relative to the first alphabet.) That is why in one application, a single bit may be considered as a symbol whereas in another application a bit is not a symbol but rather each uniquely colored one of 24 bit-long RGB pixels is considered a symbol. The term "symbol" as used below is not intended by the way, to refer to an abstract mathematical construct but rather to a recordable signal that has practical utility. For example, when a pixel signal in a graphics image is defined as a fundamental symbol within that image, that indicates that the pixel signal will have a discernable physical consequence if and when the image is displayed or printed or otherwise used in a practical way. Similarly, when a text character signal in a text array is defined as a fundamental symbol within that array, that indicates that the text character signal will have a discernable physical consequence if and when the text array is displayed or printed or otherwise used in a practical way.

If an input stream of to-be-compressed data is perfectly ordered, for example a 32 KiloByte (32 KB) long file that is filled repeatedly to its end with only a short hexadecimal sequence like A5E7, then compression and decompression can be no brainers. One can fashion a simple and small sequence recognizer and sequence duplicator that will output the entire 32 KB sequence with essentially no error. That is almost never the problem in the practical world though. The problem comes when input files are substantially filled with less than perfectly orderly data, and particularly when the input data constitutes a sampling of naturally occurring phenomenon such as sound waves detected in the wild or photographs taken in uncontrolled environments and so forth.

Despite significant advances made to date in the art of digital data compression and decompression, much more is needed. A crisis looms. The amount of data that system maintainers are being asked to store in computer readable memory (e.g., in magnetic hard disks or in other forms of digital data storage) keeps growing by leaps and quantum jumps. More and more data intensive applications are constantly being added to the knowledge and utilization base of mankind. Growing numbers of people want to digitally store voluminous amounts of data in the form of, for example, high resolution color photographs and home-made digitized movie footage. More generally, exponentially growing volumes of data are being generated in a wide variety of domestic and commercial applications. This may include pictures taken in natural background settings, medical imaging records taken across widely varying patient populations, snapshots taken by round the clock security equipment, sound and/or video recordings, telemetry collected from scientific logging equipment, and so forth. Storage is typically demanded in all such applications.

Great hope was initially placed in conventional arithmetic encoding (ARI) coming to the rescue. However it turns out that the compression efficiency of straight forward arithmetic encoding, even with variable length runs, is not too spectacular. The technique especially loses luster when it tries to deal with naturally-originated data (e.g., digitized pictures taken of natural phenomenon) as opposed to artificially-originated data. Artificially generated pictures (e.g., computer generated pictures) tend to have repeated data sequences, a high level of orderliness, and therefore these patterns are fairly easy to predict based on history and to compress with relatively high efficiency. Naturally-originated pictures on the other hand, tend to have non-repeating data sequences and therefore the content of these patterns is much more difficult to predict with good accuracy. Regrettably, the data that people most often want to collect and store is of the naturally-originated kind rather than the computer-generated artificial kind. A new way to deal with this burgeoning mountain of data and the looming storage crisis is much needed in the industry.

SUMMARY

A first principle that is pursued herein is the idea of seeing to it that a predictor (e.g., an adaptive predictor) substantially persistently receives sequences of symbols where the sequences are: (1) perfectly alike to each other, in other words they are duplicates; (2) predictively alike to each other or (3) progressively alike to each other, in other words, where they are sufficiently close to each other in their symbol statistics and they are predictively overlapping with earlier streamed-in sequences in terms of symbol occurrence statistics (and/or super-symbol statistics) so that the predictor, if adaptive, will usually be able to smoothly and quickly transition from one successful prediction model to a next as it progresses through consecutive ones of such progressively alike sequences. The term "super-symbol", by the way, is used herein to mean a predefined sequence of symbols. A "sub-symbol" is a subset of bits within a symbol. For example, the two least significant bits in a given gray scale pixel signal of a digitized photograph may be considered as a fast changing sub-symbol when the pixel itself is considered as a symbol. An image tile that is filled with a particular arrangement and sequence of pixels may be considered as a super-symbol. One embodiment described herein uses 3-by-3 tiles that consist of 9 pixels arranged as a square image region. Special memory-addressing walks are taken inside of each tile and/or when sequencing from one tile to a next tile so as to present an adaptive predictor with a fairly continuous stream of sequentially efficiently compressible data. The term "sequentially efficiently compressible" (SEC) will be used herein to refer to data sequences that are either: (1) perfectly alike to each other, or (2) predictively alike to each other, or (3) progressively alike to each other, such that a prediction-based compression engine can continue to use a substantially same prediction model for efficiently compressing the predictively alike sequences and/or the perfectly alike sequences and such that the compression engine (e.g., an adaptive one) can smoothly and quickly transition from one successful prediction model to a next as it progresses through consecutive ones of the progressively alike data sequences. The term "compressibly alike" will be used herein from time to time to refer to a group of files or file fragments (e.g., those that are packed together into a concatenation suitcase) where the members of the group are sequentially efficiently compressible (SEC) when successively presented to an adaptive predictor in the form of one or more particular sequences of such files or file fragments (or subfragments). The term "substantially predictably consistent" (SPC) will be used herein to refer to unbroken data sequences that internally within themselves and when walked through in a substantially consistent way, will provide a stream of bits (i.e., subsymbols) or a stream of symbols and/or a stream of supersymbols whose statistics over the data stream are relatively predictively consistent on a substantial basis although perhaps not perfectly consistent, where the relative consistency is one that allows an adaptive predictor to maintain a correspondingly locked-on good prediction model or to smoothly transitioning from one successful prediction model to a next as a data-feeding walk supplies the adaptive predictor with consecutive ones of progressively different and yet substantially predictably consistent (SPC) subsequences of data sampled out of the encompassing SPC sequence of data.

A second principle pursued herein is the idea of preventing or at least reducing the average rate at which an adaptive predictor receives prediction-disrupting sequences interposed between what would otherwise be SEC sequences. The prediction-disrupting sequences are often substantially different in terms of their symbol occurrence statistics (and/or their super-symbol occurrence statistics or their sub-symbol occurrence statistics) from those of the otherwise SEC sequences that precede and follow them in the input data stream. The interspersing of compressively unalike sequences among otherwise SEC sequences can impede an adaptive predictor from maintaining a desired prediction model or smoothly transitioning from one successful prediction model to a next as it progresses through consecutive ones of progressively alike sequences presented to it.

A counter intuitive counterpart to the second principle is the idea of preventing or at least reducing the average rate at which an adaptive predictor receives perfectly-ordered bit sequences or perfectly-ordered data sequences interposed between otherwise merely predictively alike or predictively overlapping sequences. Recall that a perfectly-ordered bit sequence could be one that consistently duplicates the short hexadecimal sequence like A5E7 over and over again. Or more simply, a perfectly-ordered bit sequence could be the consistent repetition of the bits, "11" in the two most significant bit (MSB) positions of a continuous stream of memory data words (i.e., bytes). Although an adaptive predictor can learn to predict the 100% likelihood of the "11" bit pattern always appearing in the two MSB's of a continuous stream of such memory data words, this is actually a waste of the predictor's resources, time and energy. A simple pattern duplicator can be instead programmed to fill in the "11" bit pattern in the two MSB's during reconstruction of the original input data stream. Perfectly-ordered data sequences may include simple counting sequences such as 1, 2, 3, etc. A simple counter rather than a sequence duplicator can be used for generating the counting sequence (with up or down counting as appropriate).

A further extension of the counter intuitive counterpart is the idea of not bothering to compress data for which a perfect copy (a duplicate) already exists and is easily obtained. (See FIG. 6B.) A yet further extension of the counter intuitive counterpart is the idea of subtracting out (stripping out) a constant DC bias from a series of data values streamed into a compression engine. Consider the data sequence: 101, 105, 103, 107, 104, . . . , where all values are consistently above 100. The constant DC bias of 100 can be subtracted out to thereby provide a sequence of much smaller values: 1, 5, 3, 7, 4, . . . . These can be represented with fewer bits. Strip-out of perfectly-ordered embedded patterns or consistent DC bias values can help to reduce the amount of storage consumed by the output code of a compression engine (to reduce the storage footprint of the encoded output). A post-decompression transformation can back fill in the stripped-out, perfectly-ordered embedded patterns or to add back the stripped-out DC bias.

A third principle that is pursued herein is the idea of transforming (e.g., reorganizing, remapping, stripping, etc.) an input data stream prior to presenting it to a compression engine (e.g., one including a variable length entropy encoder and an adaptive predictor) so that the transformed data has a higher level of orderliness (lower entropy) than does the original input data stream, albeit preferably not perfect orderliness. Specific techniques are disclosed herein. Included among these are those that reorganize the order in which files or file fragments (or subfragments) or data strings are presented to a compression engine. Also included among these techniques are those that remap symbols into a different symbol space, those that strip-out disruptive sub-symbols from otherwise predictively alike streams of symbols and/or those that strip-out perfectly orderly biases or embedded perfectly orderly patterns from otherwise compressively alike streams of symbols.

A fourth principle that is pursued herein is the idea of packing together alike data streams, including the idea of packing together sequentially efficiently compressible (SEC) streams of data into so-called suitcases and of spoon-feeding the packed together SEC and/or otherwise alike streams to a prediction-based compressor. One immediate outcome of such packing is that the file storage blocking (FSB) problem mentioned above is overcome. Even if each of plural SEC or otherwise alike streams is say, 0.5 KB long, the system will tend to pack a sufficient number (i.e., 8, 16, 32, etc.) of them together to substantially fill a large number of file storage blocks (i.e., 4 KB FSB's) used by the storage system so that slack space at the end of the last file storage block that stores post-compression data does not significantly affect the efficiency of storage space reduction. A corollary of the fourth principle is that of packing together small files even if they are not all SEC into a concatenation suitcase (explained below) and using a common file-referencing redirection mechanism for redirecting operating system (OS) references to specific small files instead to the locations in packing suitcases where the packed data is kept.

A first class of methods that evolve out of these four principles are those that: (1) automatically identify symbol sequences that are perfect copies of one another (perfectly-alike sequences); (2) automatically identify symbol sequences that are predictively alike to each other and/or (3) automatically identify symbol sequences that are sufficiently predictively overlapping (progressively-alike) so as to allow smooth transitioning by an adaptive predictor from one corresponding and successful prediction model to a next as it progresses through consecutive ones of such predictively overlapping sequences, and/or (4) automatically identify sequences that are reversibly transformable prior to compression so that the reversible transformation of the identified sequences causes them to become SEC. The identification of such symbol sequences is normally followed by the step of (5) automatically identifying among the alike files, file fragments, subfragments or other data strings those that are sufficiently alike to one another to warrant packing them together, stringing them together or otherwise causing them to be physically or logically grouped together as SEC data streams that are to be presented in unbroken succession to a compression engine that includes an adaptive predictor or a nonadaptive predictor.

A second class of methods that evolve out of the first class of identifying methods and the four principles are those that automatically pre-transform other ones of the identified sequences that are not yet SEC into ones that are sequentially efficiently compressible (into ones that are SEC) and automatically grouping together those data sequences that are to be transformed in same way prior to compression so they will be transformed to become SEC data streams.

A third class of methods that evolve out of the first and second classes as well as from the four principles are those that automatically strip out disruptive data (e.g., disruptive sub-symbols) from symbol sequences that are otherwise predictively alike or sufficiently predictively overlapping or transformable to be such, where the disruptive data (e.g., disruptive sub-symbols) reduces the predictive alikeness of, or the progression-wise predictive overlappingness of, or the transformability of identified ones of such symbol sequences into SEC data. The stripped out data is filled back in during a later reconstruction of the original data stream at the time that compressed data is inflated back towards its uncompressed state so as to reconstitute the original symbol sequence. It is to be noted that strip-out is a subset of the more general concept of decomposition. Decomposition occurs when a file or fragments thereof or other extracted/transformed data strings are decomposed into more orderly (lower entropy) components and into less orderly (higher entropy) components where orderliness may be measured relative to a set of predefined files or fragments (predefined templates or exemplars of different levels of orderliness). The decomposition products of a given file or of a file fragment may be subjected to different treatments depending on how orderly or disorderly the symbol sequences are (or the sub-symbol sequences are) in that decomposition product and/or how compressibly alike or compressibly unalike each decomposition product is relative to other decomposition products of the same or different files (or how alike they are to the predefined templates or exemplars). Decomposition products that are highly disordered (have high entropy) may be simply stored (packed) away as is (without any compression) for later retrieval and recombination with other products that had been compressed and then decompressed. Decomposition products that are perfectly ordered (have essentially zero entropy) may be replaced by pattern regenerators that regenerate their perfectly ordered patterns.

A fourth class of methods that evolve out of the first through third classes as well as from the four principles are those that automatically pack together in a physical sense, original or transformed and/or stripped symbol sequences that originally are, or are transformed-to-be (including by way of strip out) predictively alike or progression-wise sufficiently predictively overlapping so that the formed packs (also referred to as "suitcases herein) can be presented to a compression engine as homogenous accumulations of sequentially efficiently compressible (SEC) sequences for compression by the engine. Included in this fourth class of methods are those that automatically re-order SEC sequences inside a suitcase so as to make the reordered sequences more so progression-wise predictively overlapping relative to one another.

The first through fourth classes of methods may be fully or partially realized as machine-implemented methods that provide tangible, useful and concrete results as well as industrially applicable technical effects, namely; they enable large compression efficiencies (e.g., as measured in bits per character or symbol, BPC) and they allow for quick and lossless recreation of original data after such data has been efficiently compressed with use of one or more of the first through fourth classes of methods.

A machine-implemented flow of processes in accordance with the disclosure (that may be carried out by one computer for example or in respective parts by different arrays of parallel processing cores) comprises: (a) Classifying files or fragments of files or data strings according to their alikeness to each other and/or to supplied reference files or fragments or data strings; (b) Decomposing relatively large files or file fragments or data strings into smaller fragments or subfragments or data string segments having respectively more orderly symbol content internally (being more substantially predictably consistent (SPC) in terms of internal symbol content) or less orderly symbol content (being less substantially predictably consistent (SPC) in terms of internal symbol content) and/or having predictive alikeness as measured relative to one another or to predefined reference files or reference fragments or reference data string segments (where such decomposition includes the optional step of stripping-out noise bits or other highly disordered sub-symbols and/or stripping-out perfectly ordered embedded patterns or DC biases); (c) Packing SEC or otherwise alike fragments into corresponding suitcases and reordering the packed pieces (i.e. for pre-fetch) within the suitcases; (d) Compressing filled suitcase(s); (e) Transparently intercepting an operating system request that references the file of a suitcase member for fetching purposes and redirecting the intercepted request to a corresponding one or more suitcases containing the desired file or its fragments; (f) Partially decompressing copies of the one or more suitcases each to a depth needed for inflating the suitcase member that has been requested; (g) Recomposing the file or fragment from its re-inflated fragments or subfragments; and (h) Transparently serving the recomposed data to the file requester.

As already mentioned, a subclass of the SEC data grouping methods is one that physically packs two or more often a larger number (e.g., 10, 16, 20, 32, 40, higher) of alike files or file (sub)fragments into a data structure referred to herein as a "concatenation suitcase". Physical packing uses fewer overhead bits than logical packing. The packed together files or file fragments or data segments should be originally sequentially efficiently compressible (SEC) relative to one another or they should be transformed to be so (including by way of strip-out of disruptive data). The suitcase packing method may optionally include a physical reordering of the packed files or file (sub)fragments or data segments so as to provide for: (a) faster retrieval of certain files during decompression; (b) smoother progression by an adaptive predictor through predictively overlapping ones of the packed entities and/or (c) intelligent out-of-sequence pre-fetching of disparate parts of a file in anticipation of a same out-of-sequence fetching by an associated application program. Concomitant with use of such packing is the use of an interception method as mentioned that intercepts an original reference made to the data of a desired file or a desired file fragment by way of, for example, an operating system (OS) navigation defining signal (e.g., a path name and file name and file component identification). The interception method transparently substitutes a redirecting reference to a suitcase position holding the desired data or at least part of the desired data in place of the original storage location where the data was originally held. The interception-wise referenced suitcase is typically filled with data from other files originating from different folders or perhaps even different storage drive besides that of the desired file. When referenced, the suitcase is typically in a deflated (compressed) state. The method automatically inflates a copy of the suitcase (decompresses it) to an extent or depth needed for inflating the desired data, fetches that portion of the inflated suitcase contents corresponding to the desired data (or part of the desired data) and it optionally applies one or more inverse transformation operations to the fetched data (e.g., back filling-in stripped out noise bits) so as to produce therefrom a replica of the desired original data.

When one or more of the above principles and methods are applied, a stream of more orderly, reorganized or "pre-transformed" and/or concatenation-wise lengthened input data (with less storage block slack) is formed. This stream is supplied to an entropy encoder during compression. The reduced entropy and/or increased length of the modified input stream allows the corresponding compression engine to keep running efficiently with an appropriately trained prediction model (which model may be adaptively variable) over a much longer length of data than it could have run through efficiently had the original (not pre-transformed) input data been instead supplied to it in the form of one random file at a time after another or in the form of random collections of compressibly unalike files or compressibly unalike data strings. As a result of the lengthened runs by the compression engine in efficient compression mode and/or as a result of the smoothed transitions by the compression engine from one prediction model to the next (if needed), substantially improved reduction of consumed storage space can be attained in comparison to what would have been attained by presenting the original data in its raw, untransformed and/or un-re-ordered state to the compression engine.

Storage reduction in accordance with the disclosure is not limited to entropy-lowering pre-transformations followed by entropy-increasing encoding. Sharing of one dictionary copy for duplicate data blocks may be employed as well. When a large number of alike data files (from different original folders and/or from different storage media drives) are packed into a same concatenation suitcase (even if they are composite files that have not been decomposed into respective text, graphic and/or other fragments), it is often the case that the files contain blocks of same data; for example a company logo or boilerplate form content. In one embodiment, a running hash with a predefined hash-length window is maintained of the plaintext data stream that is encountered within a suitcase while the suitcase is being compressed. If a repeat of an earlier hash is encountered, the hash value coincidence is taken to mean that data which has already been once encoded (compressed) is being encountered a second or further time while compressing the suitcase. Rather than encoding the second occurrence, a backward pointer is inserted to point back to the location of the twin plaintext in the suitcase and the compression encoding process skips around the duplicate plaintext rather than encoding that same sequence given that it has already been encoded when earlier encountered in the suitcase. During decompression, when the backward pointer is encountered, the already decompressed plaintext of the twin is fetched from its earlier position in the being-inflated suitcase and inserted into the skipped around region.

Storage reduction in accordance with the disclosure may include the step of migrating fully packed suitcases from different media drives into a suitcase accumulating drive or a suitcase accumulating drive area so as to thereby free up contiguous empty spaces in other storage drives or areas from which the migrating suitcases originated. The migration process tightly packs deflated or not-deflated suitcases one after the other in the destination drive (or drive area) while encouraging the formation of contiguous spans of large free space in the source drives (or source drive areas) from which the migrated suitcases originated. Users may then utilize the enlarged contiguous runs of free space in the source drives (or source drive areas) for other purposes. In one embodiment; when one or more source drives are fully emptied due to migration, the system may automatically shut off a number of such empty drives that are in excess of a predefined amount of desired empty storage so as to thereby save energy by not having to power the disk(s) and/or motor(s) of those excess drives and by no longer having to cool the excess number of empty drives.

Apparatus are disclosed herein for realizing the various methods. Systems are disclosed herein for taking advantage of the various methods. In particular, the systems include those where compression and decompression throughput rates can be substantially out of balance with one another, namely, where the data throughput rates of compressions can be much smaller than the data throughput rates of the corresponding decompression operations.

Other aspects of the disclosure will become apparent from the below detailed description.

BRIEF DESCRIPTION OF THE DRAWINGS

The below detailed description section makes reference to the accompanying drawings, in which:

FIG. 1A is a schematic diagram showing an environment in which a stream of frontal or profile portraits is to be compressed and placed in nonvolatile storage for later retrieval and decompression;

FIG. 1B shows a simplified packing of content from three alike graphic files into a concatenation suitcase and a compressing of the data-holding suitcase, as well as showing how a redirection signal can be formulated;

FIG. 1F shows how composite files may be disassembled or decomposed into simpler component parts so that component parts of alike types can be packed into respective, pre-compression suitcases that are dedicated to those alike types;

FIG. 2A is a schematic diagram of a compression and decompression system in accordance with the present disclosure;

FIG. 2B is a hypothetical graph for explaining build up and decay of predictor accuracy;

FIG. 6A shows the data structure of a segment-to-segment jump table that may be employed in accordance with the disclosure;

FIG. 8B diagrams a process for compressing JPEG coded files of differing resolutions;

FIG. 8D diagrams other methods for sharing walk information from one compressor working on a first file of given resolution to another compressor working on an alike but higher resolution file.

DETAILED DESCRIPTION

Overview

Figure 1C:
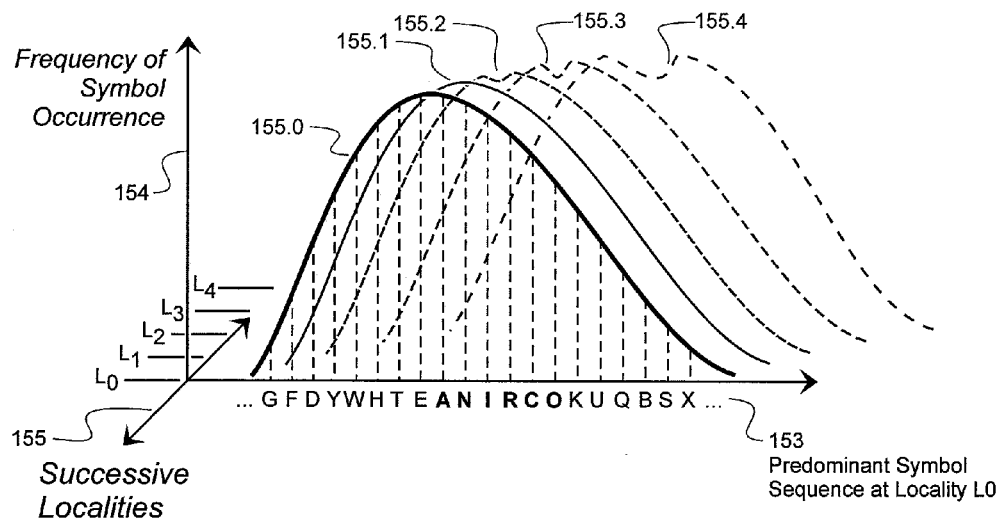
FIG. 1C shows a plurality of symbol distribution histograms that may be generated from statistical analysis of predictively overlapping symbol sequences found in respective storage localities.

A variety of specific machine implemented techniques are disclosed herein for reducing storage size of information represented initially by first digital data stored in first storage space or in a first plurality of storage drives. The detailed discussion will first take a bird's eye overview flight of the material disclosed herein and then a more detailed look at exemplary embodiments represented in the various drawings.

One of the machine-implemented automated methods disclosed herein comprises the steps of: (a) decomposing a data file or a user-formed compilation of files (e.g., from a user folder) into a plurality of data sequences; (b) identifying among the decomposed sequences those that are sequentially efficiently compressible (SEC) with respect to one another in terms of symbol occurrence statistics and/or super-symbol occurrence statistics and/or sub-symbol occurrence statistics; and (c) identifying among the decomposed sequences those that are not SEC with respect to one another.

Another of the machine-implemented automated methods disclosed herein comprises the step of: (d) presenting the identified SEC data sequences consecutively to a prediction-based compression engine. Such consecutive presentation of SEC data sequences to a prediction-based compression engine often allows a predictor within the engine to well predict the symbol sequences and/or super-symbol sequences and/or sub-symbol sequences found in the presented stream of consecutive SEC data sequences. In the case where the presented stream of consecutive SEC data sequences defines a slowly changing set of symbol statistics and where the predictor within the engine is an adaptive predictor, such consecutive presentation of SEC data sequences to the compression engine allows the adaptive predictor to smoothly transition from using a first predicting model that is developed (built up) for use with a first one or more of the presented SEC data sequences to a next well predicting model used for a next one or more of the sequences as the compression engine continues to receive the data input stream defined by the consecutively presented ones of the identified SEC data sequences.

Another of the machine-implemented automated methods disclosed herein comprises the step of: (e) packing the identified SEC data sequences consecutively into a concatenation suitcase prior to presenting the identified SEC data sequences consecutively to a respective prediction-based compression engine. Addressing walks are defined through the address space of each suitcase. One or more compression engines then follow along the defined addressing walks as they encode data contained in the suitcase. FIG. 1B shows a bird's eye view of one such addressing walk as having a starting pointer 148 pointing into a first graphics segment area 116.1 in suitcase 118'. The compression walk (148) exhaustively walks through the inside of the first graphics segment area 116.1, discontinuously jumps into a second graphics segment area 116.2, exhaustively walks the interior of the second graphics segment area 116.2, and so on. Another such walk 147 covers alike segment areas 114.1-114.3. After more such compression walks through alike areas have been taken and all relevant areas of the suitcase covered, compressed code will have been generated that represents a deflated version 162 of the suitcase 118'. Later, same retracing walks 148*, 147*, etc. are taken through the address space of an originally empty suitcase copy 118'*. The code of deflated suitcase 162 is decompressed during the walks and rendered back into respective segment areas such as 116.1, 116.2, etc. of retrace walk 148*.

A variety of specific techniques are disclosed here for re-organizing or pre-transforming data inside of input data streams (or data that has been packed into concatenation suitcases) prior to compression in accordance with one or more of the principles set forth in the above summary, namely: (a) the reconfiguring of input data streams so as to achieve a higher levels of orderliness in the reconfigured data (e.g., see briefly segmentation process 156.5 of FIG. 1D); (b) skipping around attempted compressions of highly disorderly and thus disruptive data (i.e., noise) (e.g., see the skip over 156.6 from L0 to L1 in FIG. 1D); and creating extended lengths of compressively alike data runs by packing identical and/or predictively alike content together and/or packing progressive-wise predictively overlapping content together each into a respective same suitcase whether from similar files or dissimilar files or from different folders (see 119*a*" of FIG. 2C) or from different storage drives (see 865A of FIG. 8A) all while reducing the amount of slack space wasted by storage blocking (e.g., see the file decomposition and fragment repacking operations of FIG. 1F). The disclosed techniques include those for automatically identifying predictively alike data sequences and/or identifying predictively overlapping data sequences and/or identifying transformable data (data that is reversibly transformable into being SEC data). See briefly FIGS. 1C, 1D and 1H.

In terms of more detail, a first level of improved compression efficiency may be realized simply by packing or concatenating together identical data sequences and/or by packing or concatenating together sequentially efficiently compressible (SEC) data sequences, usually from alike data files (i.e., all dot.bmp files or all dot.txt files), into a same to-be-compressed memory window (also referenced here as a concatenation suitcase), and by compressing (deflating) the packed window as a whole. At minimum, the packing of multiple files or multiple file fragments (even if they are predictively unalike and are disruptive fragments relative to one another) into a single storage suitcase of significant depth (i.e., 1 MegaByte deep) reduces slack overhead due to file storage blocking, particularly if the original files are small in size (e.g., less than 10 storage blocks worth apiece). However, since the packed together data is often intentionally caused to be SEC, the compression engine which receives the packed together SEC data can adaptively develop a good prediction model (by way of model training, perfecting or "building"—see FIG. 2B) when beginning to compress the first of the concatenated ones of the compressibly alike files or file fragments. Then the engine can use the built up or perfected prediction model to more efficiently compress subsequent ones of the alike data that had been packed into the same concatenation suitcase. If alike data files are originally pre-compressed by a standard compression method (e.g., PNG, TIFF, JPEG, PDF), they are first re-inflated (decompressed) and analyzed in their inflated state so as to thereby identify the compressibly alike data sequences within them and to pack the same into one or more concatenation suitcases. Then each concatenation suitcase is deflated with one or more of the compression techniques disclosed herein (e.g., using linked list jumps that leap from one compressibly alike segment to the next for example—see FIG. 5B). The original file data is deleted from its original storage medium (e.g., from the disk bank) so as to thereby reduce the amount of storage space used to represent the corresponding information.

Upon receipt and interception of an access reference made to the non-compressed data of an original file (e.g., a normal OS mediated reference), the process automatically redirects the access reference to the appropriate deflated suitcase(s). The contents of each appropriate concatenation suitcase are temporarily copied and inflated to the extent needed for inflating the desired data. The inflated copy of the desired inflated data is extracted from the partially inflated suitcase(s) copy(ies) and forwarded to the requester as if it had been retrieved from the original file (transparently) instead of from the deflated concatenation suitcase(s). Then if the requester does not return a rewritten or appended version of the extracted data within a given time period, the temporarily and selectively inflated copy of the suitcase contents is deleted (the original deflated suitcase typically remains as it was in storage) so as to thereby reduce the storage footprint of the corresponding data in the corresponding storage medium (e.g., the magnetic disk bank). While there is a slight performance penalty for carrying out these multiple steps of interception, redirection, and temporary data re-inflation; this performance penalty can be offset at least partially by the increased speed at which well compressed data is retrieved from storage media such as spinning magnetic media. Additionally in one embodiment, concatenated file contents are queued in the suitcase according to their expected frequency of use and/or their expected order of use (i.e., per the pre-fetch concept) with the more often accessed file contents being stacked at or closer to the front of the concatenation suitcase in the expected order of fetching and the less frequently accessed file contents being stacked deeper towards the end of the concatenation suitcase. (See 118' of FIG. 1B.) Decompression runs need only extend through the in-suitcase queues to the depth in the suitcase needed for inflating the desired data as well as any other data that precedes it within the concatenation suitcase queue. (See stoppage points 162.1-162.3 of FIG. 1B.) Less time (T2) is therefore consumed for inflating desired data that has been queued near the front of its suitcase and/or ordered in the suitcase according to an expected order of fetching by a corresponding application program.

According to one variation of the above suitcase packing concepts, composite files do not have all their contents packed into a single concatenation suitcase. Instead each composite file is subdivided (decomposed) intelligently and/or unintelligently into a plurality of file fragments and the fragments are distributed (see 104 of FIG. 1F) into different concatenation suitcases according to data type and/or compressible alikeness with other data already in the suitcases and/or according to how orderly or disorderly the symbol sequences or sub-symbol sequences are in each decomposition product. By way of example, a composite file may contain a collection of different data objects such as graphic objects, text objects, audio playback objects and so forth. Some of the objects may be more orderly internally than are others. Some of the objects may be more compressibly alike relative to predefined model objects than are others. Objects may be routed to respective suitcases for packing therein according to their internal orderliness and/or according to their compressible alikeness to the predefined model objects.

One can think of a composite file (i.e., 165 of FIG. 1F) as being like a single closet filled with hanging outfits of different kinds of clothing including shirts of different single colors (very orderly) or mixed colors (less internally orderly) or of complex patterns (i.e., red and green plaid shirts), including pants of different styles (i.e., pleated and unpleated) and business suits of different colors and styles (i.e., blue-two button or pin striped black with three buttons, etc.). One can think of a user-defined compilation of composite files (i.e., folders 119*b*" of FIG. 2C) as an apartment or dwelling filled with many closets each containing its respective assortment of different kinds of clothing. One can think of a concatenation suitcase as being like a traveling suitcase into which the user packs his clothing when going on a trip. Except that in accordance with one aspect of the disclosure, purely red shirts from different hangers (and/or different closets or drawers) are packed into one suitcase that is dedicated for storing only red-like shirts. (In other words, the suitcase is dedicated to one system-defined type of compressibly alike file fragments.) Plaid shirts from different suit hangers are packed into a second suitcase that is dedicated for storing only plaid-like shirts (dedicated to a second type of alike file components) and so forth. Then each of the suitcases is deflated with use of a deflation device (compression engine) that is predisposed to efficiently compressing that kind of data (e.g., text versus graphics as shown in FIG. 1F) and/or is predisposed to adaptively custom tailoring itself (by for example learning and building with the first of the packed file fragments) to efficiently deflating the uniquely typed and grouped contents of that suitcase. Alternatively or additionally, an adaptively optimizing prediction model that has optimized itself to one extent or another by compressing a first suitcase of a given type, and that has learned from that experience to more accurately predict symbol sequences for that type of concatenation suitcase, is copied in its more experienced form to serve as a template for application to other suitcases of the same type. (See 266d of FIG. 2A.) Alternatively or additionally walk information or segmentation developed by a first compression engine is shared with a second compression engine that is about to compress a similar file. (See 886 of FIG. 8A.) Thus, experience garnered from one or more of first compression attempts is advantageously passed forward for use in subsequent compression attempts directed to other files or file fragments of a same type or likeness that are stored either in the same suitcase or in another suitcase. (Shared experience can also come in the form of a shared prediction model built in one run and passed over to another, in the form of shared segmentation information and/or in the form of shared address space walking information—see again sharing step 886 of FIG. 8A between compressors 883 and 885.)

The order in which files or file fragments are packed into their respective suitcases can be of significance. Consider again the metaphor of shirts being packed into a suitcase. (See item 118" of FIG. 1B.) If unpacking involves taking shirts out one at time in layers, starting at the top of the suitcase (or starting at the front line 118.0 as it will be referred to in FIG. 1B), then it will take longest to get to a shirt that was packed deep towards the back end of the suitcase. It will take less time to get to a shirt near the top. Once an access "walk" has sequenced to the depth that includes the desired shirt, there is no need to keep walking yet deeper into the suitcase and to process through more of the shirts that lie deeper within the recesses of the suitcase. Time and energy are saved by not walking through unneeded deeper suitcase content that is deeper than the content needed. This concept relates to decompression stoppage boundaries like 162.2 of FIG. 1B (detailed below).

Along this same vein of thought, when a user (or the user's computer) asks for access to a particular file or a particular file portion that had been decomposed, packed into plural suitcases and deflated during compression of those suitcases, just the deflated suitcases that contain decomposition fragments belonging to that one composite file or to a desired portion within the composite file are fetched and each such suitcase is partially inflated to a depth needed with respective inflation tools. The inflated file fragments of the requested file are fetched from their respective, partially re-inflated suitcases and the fragments are combined (composed, reassembled) to thereby recreate the composite original file or desired portion of that file. (See step 188 of FIG. 1G.) Although it may sound like much extra work to move files or file fragments into suitcases, to decompose files into fragments or subfragments, and to shuffle each into a specific relative depth within its dedicated suitcase, the result often can be a much higher degree of compression efficiency and a fairly good fetch and decompression speed than would have occurred without such intelligent reorganizing of the data packed into each suitcase. That means that more highly-deflated suitcases can be formed and that these can be more tightly packed into a storage vehicle (i.e., a migration destination drive such as 813 of FIG. 8A) of a given size. Packing more such suitcases into the fixed-size vehicle (i.e., migration destination) reduces storage costs, reduces energy consumption (e.g., see 817-818 of FIG. 8A) and usually also reduces time for retrieval of data from the storage means. Strategic placement of files or file fragments packed into a suitcase allows for quick retrieval of the more frequently needed files or fragments. Also, because a well deflated suitcase often occupies a significantly smaller amount of storage space than does an inflated one, efficient compression works to reduces time, energy and space needed performing storage backup. The increase in speed of retrieval from primary storage or writing to backup storage offsets the time penalty incurred in the unpacking of the plural suitcases and in the reassembly of composite files when fetching their decomposed components from different suitcases. In one embodiment, parallel processing is used to simultaneously inflate the plural suitcases and to fetch replicas therefrom of the desired data fragments.

In one embodiment, an intelligent pre-fetching operation is used to begin fetching and reconstituting strategically-packed fragments of a decomposed file as soon as a file open command is sent by the operating system and is intercepted by the decompression subsystem of this disclosure. The intelligent pre-fetching operation determines from the registered extension portion of the file name (e.g., dot.bmp; dot.txt; dot.doc; etc.) which application program is most probably asking for the file. Then, because certain application programs have a known pattern of behavior in that they routinely fetch certain file headers or file trailers or ancillary files before fetching working data within the referenced file; the intelligent pre-fetching algorithm consults a behavior database maintained by the decompression subsystem and it pre-fetches and reinflates the file headers, trailers, etc., sometimes even before the registry-identified application program actually asks for those file fragments. In this way, the intelligent pre-fetching algorithm proactively anticipates what will be asked for and it reduces decompression latency by getting it ahead of time on its own rather than waiting for the application program to ask for the data.

As mentioned above, each suitcase may have a custom tailored compression device (i.e. a predefined initial or template prediction model as well as a specific compression approach dedicated to text or graphics or other forms of representing information—see 106a of FIG. 1F) associated therewith for efficiently compressing the alike data files or alike file fragments stored in that dedicated suitcase. This brings the overview discussion to a first form of data pre-transformation that may be practiced together with and/or independently from the above technique of packing compressibly alike data sequences from various files into respective ones of dedicated suitcases. Each suitcase can have a unique set of pre-compression symbol re-sequencing algorithms associated therewith and/or a unique set of pre-compression bit-masking algorithms associated therewith where a complementary reversing version (inverse version) of these algorithms is carried out after inflation so as to reverse the effects of pre-transformation processes carried out on original data prior to deflation. These unique reversal algorithms are generally fast ones that may be practiced by machine-implemented techniques so as to quickly replicate original data after or while the suitcase is being inflated even though the process for identifying transformable data and the process for transforming it and/or parsing it, decomposing it into corresponding fragments and routing the fragments to appropriate suitcases may have been a much slower and time consuming one (having a slower throughput rate as compared to the decompression process) when the suitcase was first formed and thereafter deflated. Aside from use of efficiently compressed suitcases, it is within the contemplation of the disclosure to have uncompressed suitcases which contain uncompressed small files or raw bit-masked 1's and zeroes (or which contain other predefined raw sub-symbols) that have not had any compression and/or special pre-transformation algorithm applied to them. The contents of these uncompressed suitcases may be back filled into reconstituted replicas of original files as needed. By packing small chunks of even disruptive data into substantially larger carrying suitcases, effects of the file storage blocking slack problem are reduced.

The above last point regarding disruptive data leads the overview discussion to a first form of bit-masking which is easy to explain at this preliminary, stage. Recall that effective compression of random noise is generally not possible because white noise has a very high level of disorderliness (high entropy) and it is very difficult, if not impossible to increase its disorderliness via entropy encoding. Accordingly, in one embodiment, if a first suitcase contains graphic images whose pixels each have one or more least significant bits (LSB's) that generally constitute random noise rather than intelligently meaningful graphic information; those noise-carrying LSB's are stripped out from each of the pixels and stored as uncompressed data in a second suitcase (one dedicated to storing stripped out and still raw sub-symbols). In a case for example where only the lowest LSB contains noise, each 8-bit long pixel is reduced to a 7-bit pixel by this process of stripping out disruptive data (which process can be viewed as a decomposing of 8-bit pixel symbols each into a 7-bit sub-symbol and a 1-bit sub-symbol). Only the 7-bit sub-symbols are consecutively supplied to a compression engine as part of an input stream for compression by the engine. The saved but uncompressed LSB stream is later back-filled into the pixels when they (the 7-bit versions) are reconstituted into their original form (the 8-bit versions) by a data inflation process. As a result of such a combination of intelligent strip-out and backfill operations, time and energy are not wasted trying to compress very disorderly (noisy) information or information with a relatively flat, non-differentiated symbol occurrence histogram (see L4C of FIG. 1D) where the latter forms of information generally cannot be compressed well to begin with. Time and energy are not wasted re-inflating the hard to deflate information. And more importantly, the orderliness of the remaining data (i.e., the left behind 7-bits in each pixel super-symbol) is increased because the interposed disorderly and disruptive data has been removed. This may advantageously increases the compressibility of the left behind information. In another embodiment, high frequency bits (e.g., LSB's) are not diverted away from a compression engine during final compression although the high frequency bits (e.g., LSB's) may be ignored during segmentation of the initial data stream into segments (e.g., into segment areas) and during initial trial and error modifications of segment boundaries.

Determining which bits (or other sub-symbols) to strip out or skip over if at all and which to keep and stream consecutively to a compression engine during segmentation and/or during final compression can vary from application to application and from file type to file type. For example, in a first class of graphic images it could be that only the one least significant bit (1 LSB) constitutes noise or highly disordered data. (In the same class, segmentation may nonetheless mask out the lowest 2 LSB's.) In another class of graphic images however, it could be that the three least significant bits (3 LSB's) constitute noise or three bits distributed among spread apart tri-coloration components (i.e., RGB, YUV) of each pixel. (In the same class, segmentation may nonetheless mask out the 4 LSB's of every 8 bit coloration component if a pixel is represented by 24 bits.) That is why each different type of graphic image is typically packed into a suitcase dedicated to its class. This is also why a different permutation of bit-masking and back refill is typically logically associated with that specific suitcase.

Figure 1D:
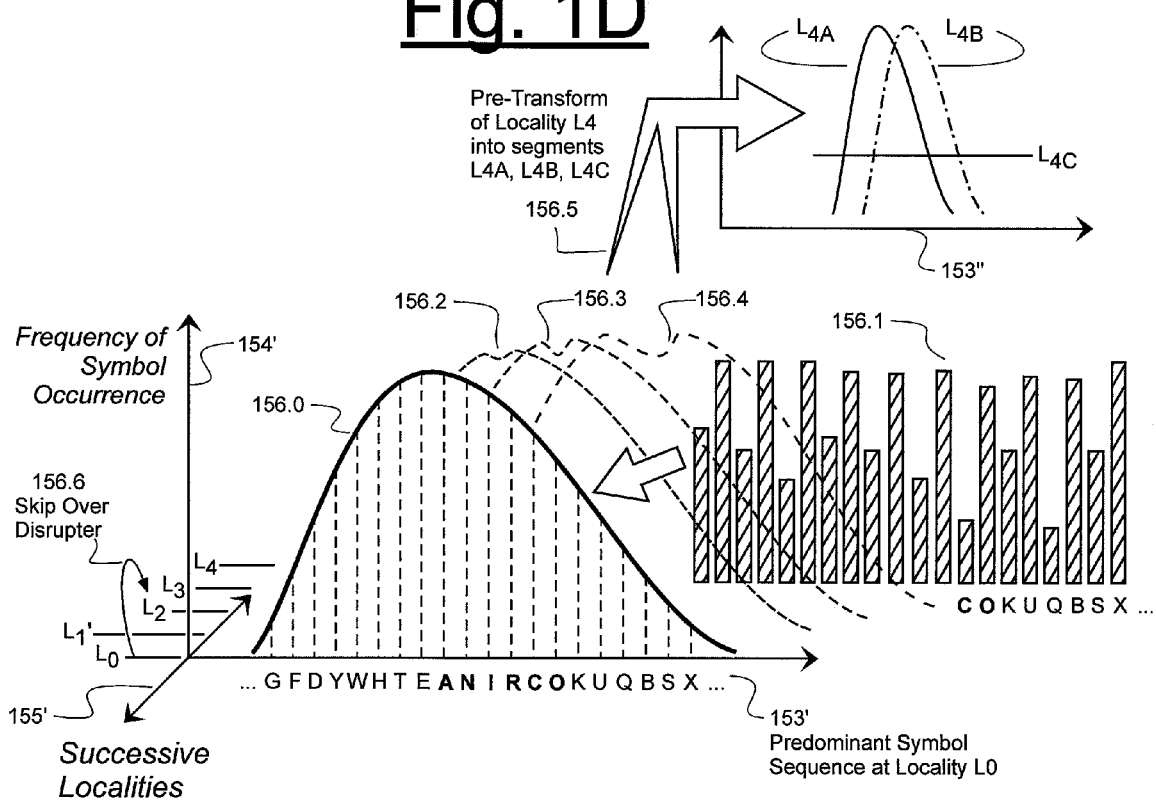
FIG. 1D shows how a predictively unalike distribution can be disruptively interposed between predictively overlapping or predictively alike symbol sequences and also how the symbol statistics of a given locality (L4) might be segmented into fragments having more peaked and/or flatter symbol distributions by intelligently subdividing the given locality into segments each of more orderly or more disorderly data content than what was contained in the given locality (L4) taken as a whole.

A first machine-implemented method that may be used in accordance with the present disclosure for automatically determining which data to strip out and/or which to skip around when defining a final compression walk or an earlier trial and error walk that walks through a storage space may comprise: (a) automatically scanning a suspect sequence of bits or other symbols or other sub-symbols so as to develop a corresponding one or more statistical histograms of respective symbol occurrences and/or super-symbol occurrences and/or sub-symbol occurrences in the suspect sequence; (b) automatically determining if the developed one or more histograms are substantially flat across at least a predominant portion of their alphabets, whereby this indicates possible presence of random or highly disordered information in the suspect sequence; and (c) in response to a determination that a given suspect sequence contains a substantial amount of highly disordered information at its symbol and/or sub-symbol level, automatically identifying the suspect sequence as one that is to be subjected to a skipping over process or to a strip-out process that strips out the disruptive sub-symbols from that sequence. This aspect of the disclosure will become clearer when FIGS. 1C-1D are detailed. Note that some symbol sequences associated with optical fiber transmissions are intentionally encoded to be DC-balanced at the bit level even though they contain non-random data when examined as multi-bit symbols. So a flat-band histogram technique carried out at the bit-by-bit level will not always correctly identify sequences that are to be deemed as highly disordered ones. It may be necessary to generate histograms at higher super-symbol levels rather than the rudimentary bit-by-bit level. Some degree of intelligence should be practiced in defining what constitutes a symbol for purposes of this method (e.g., a disruptive sub-symbol may be defined as being the last two or three bits of each color field of each pixel in a graphics object rather than the least significant bit taken alone). It is left to the practitioner to exercise some judgment in this matter.

A second machine-implemented method that may be practiced in accordance with the disclosure and that may be used for automatically determining which data to identify as being a potentially disruptive sequence of symbols, sub-symbols or super-symbols comprises: (a) automatically scanning a first suspect sequence of stored bits or higher order sub-symbols or higher order symbols or higher order super-symbols and also scanning corresponding second stored bits, sub-symbols, symbols or super-symbols in immediately neighboring ones of stored other data sequences of an application storage space so as to develop corresponding statistical histograms of frequency of occurrences of the stored bits, sub-symbols, symbols and/or super-symbols in the suspect sequence and in the immediately neighboring sequences; and (b) automatically determining if the developed histogram or histograms for the suspect sequence are substantially different across at least a predominant portion of their alphabet than the corresponding histograms for the immediately neighboring sequences. A data re-ordering or segmentation method that may be practiced in response to such automated identification of a substantially different and interposed sequence is that of automatically defining a compression walk that walks through a storage space and skips over the disruptive sequence (see the L1' locality skip-over 156.6 of FIG. 1D) and/or defining a pre-transformation algorithm that strips out the disruptive sequence of data (see 237 of FIG. 2A). These aspects will become clearer when details regarding walk definitions (see 241-242 of FIG. 2A) and regarding strip-out pre-transformations are spelled out below. In addition to stripping-out disruptive sequences of data, it may at times be beneficial to strip-out perfectly-ordered sequences of data such highest MSB's that are always padded, say with leading zeros ("000") throughout a to-be-compressed segment of an application space. It may at times be beneficial to additionally or alternatively subtract out a constant DC bias that is present in all stored data of a to-be-compressed segment of the storage space. Just like the stripped out disruptive data, the perfectly-ordered sequences of data (e.g., leading zeros) may be filled back in at the time of data reconstitution and/or the persistent DC bias may be added back in at the time of data reconstitution.

The term "predominant" as used above is to be understood as referring to the more often occurring symbols of a given alphabet as they appear in a supplied data file or file component. Some alphabets are very wide (they have a large number of unique symbols) and some of the symbols in these wide alphabets are used rarely if at all in routine data sequences. So of course, even in a highly disorderly (high entropy) sequence, the rarely-used symbols will typically have a frequency of occurrence that is still markedly below an average flat line (or almost flat line) which might be observed for the more predominantly used symbols. FIGS. 1C-1D for example are organized to show their more predominantly used symbols (i.e., the text characters E, T, and A) as being near the peaked centers of the drawn histograms. Some of the more rarely used symbols (i.e., Z, ^, A, etc.) may be thought of as being positioned around the peripheral tails of the Gaussian like distributions. A purely random sequence of symbols will of course not exhibit a strongly Gaussian distribution but rather one that predominantly looks like a flat line (e.g., L4C of FIG. 1D) at least across the predominantly used portion of its respective alphabet.

When discussing immediately neighboring ones of stored data sequences in the above text, the term "neighboring" is to be understood as possibly applying not only to storage space (through which an address counter may increment as the data is read) but also to an application utilization space of the data. More specifically, text data may be viewed as often having a one dimensional (1D) unidirectional application space in that users typically intake the text data in a purely left-to-right raster scanning manner when reading it. See box 336' of FIG. 3. More specifically, a monotonically incrementing address counter (not shown) is typically used to address a memory unit containing desired text and to thereby output an unbroken string of data representing the desired text when that text is to be read. By contrast, 2D graphics may be viewed as often having a two dimensional (2D) multidirectional application space in that users typically view individually displayed pixels each in combination with pixels that are vertically above and below, diagonally above and below, as well as horizontally to the left and right of the taken-in individual pixels. Despite such user intake of displayed pixels, a monotonically incrementing address counter (not shown) is typically used to address a memory unit containing desired graphics and to thereby output an unbroken string of data that includes lines of display data representing the desired graphics. It is typically left to a graphics display driver to align the output lines of data one above the other so as to form a composite picture. There may be applications which store data on the basis of a three dimensional (3D) or higher application space. For example, a 3D engineering model may store its data as an array of logically-stacked together 2D planes. The same may be true for medical CAT or MRI files. Although users may consider individual symbols of two dimensional (2D) or higher applications as neighboring all the immediately neighboring other symbols in the given application space, machine-implemented algorithms described herein may nonetheless be programmed to ignore some prespecified parts of an application neighborhood during compression because the corresponding compression walk (and retracing decompression walk) will temporarily not see those parts. For example, in a 2D graphics application space, the visible neighborhood of a given pixel during compression operations may be reduced to only the other pixels immediately to the left, immediately above and diagonally to the left and above that current pixel. During a retracing decompression walk, symbols below or to the right may not yet be available because that area of the application space has not yet been rendered by the decompression walk. (See 561 of FIG. 5C.)

The term "segment" as used herein by itself incidentally, is to be understood as applying broadly to any contiguous partition of a storage space or an application space. A contiguous string of text characters may be deemed to be stored in a corresponding segment. A contiguous string of pixels that forms a subset of a single display line may be deemed to be stored in a corresponding segment. At the same time, a set of graphics display lines that abut each other or a set of display line segments that abut each other to define a 2D picture area (a 2D "segment area") may be deemed to be stored in a corresponding segment. Moreover, immediately abutting 3D prismatic regions in a 3D application memory space may also be deemed to define a segment in the 3D application memory space. Two segments are deemed to be spaced apart from each other in a storage space if the storage space includes intervening data that fully separates the first segment from the second segment in the storage space. Typically this occurs when two segments filled with data are spaced apart addresswise in a common storage address space from one another by other data that fills the intervening address space.

The above-mentioned sub-symbol strip-outs (e.g., noisy LSB strip-out and/or perfectly-ordered MSB strip-out) are not the only form of bit-masking (or more generally, decomposing and/or segmentation) that may be practiced in accordance with the disclosure during final compression or during earlier, trail and error compression attempts. The other forms of bit-masking are more difficult to explain at this preliminary, overview stage. Suffice it to say for the moment that different fields of certain kinds of data words may call for different neighborhood segmentation strategies and different prediction models. Automated machine-implemented methods may be used for determining when this is the case and for responsively applying these other types of selective bit-masking operations to thereby generate and concatenate more compressibly-alike segments of data for consecutive presentation to a compression engine and to thereby increase compression efficiency where warranted for a given suitcase.

Reordering of symbol sequences (reordering of segments each filled with respective data) may be used even if only a single file or single file fragment is to be compressed (rather than a suitcase full of compressibly alike files or of alike file fragments) and it may be used with or without the aid of bit masking. Conventionally, English text for example (whose symbols include the letters A-Z) is scanned in only a left-to-right TV-raster fashion and this is done progressively from top to bottom of a given file when presented to a compression engine. See again box 336' of FIG. 3. In accordance with the present disclosure however, the progressive top to bottom scan is altered in appropriate situations so that blocks of pattern-wise alike text are presented to a compression engine in sequentially closer proximity to one another (as if they had been concentrated together or by actually so concatenating them together) rather than in their original order within a file. For example, a compression engine in accordance with the disclosure may receive the last line of a page of text immediately after having received the top line of the same text page because an automated block re-sequencer has decided that the topmost and bottommost lines are more compressibly alike to each other than are the first and second top lines of the page. After the segments re-sequencing process is completed, suitcases full of concatenated together or of logically linked together and pattern-wise alike blocks of text (compressibly alike text blocks) may be presented as unitary strings of to-be-encoded text to a text-specific compression engine; such as one that implements a Burrows-Wheeler Transform (BWT) at its front end. (See 106a of FIG. 1F.) As understood by practitioners, a BWT algorithm generates a matrix type of prediction model by filling rows of a matrix with rotated permutations of the same text string and sorting the rows so as to isolate predicting prefixes for certain string runs. By compacting alike runs of alike text immediately next to one another to form a more uniformly patterned text string, the text-directed pre-transformation algorithm of the present disclosure reduces entropy in the re-sequenced text string that is supplied to the BWT encoder and it thus improves the prediction accuracy of the BWT-produced, post sorting table. A data stream that is encoded according to the sorted BWT table is then piped into an MTF processor (Move To Front processor) and then into a RLE (Run Length encoder) and finally into an ARI or Huffman encoder. When a decompression is carried out, the re-inflated data is subjected to a reverse block re-sequencing transformation process that undoes (inverses) the entropy-increasing shuffling of data segments that was performed by the block re-sequencing process. In other words, after decompression the second line of a decompressed page may be shuffled to the very bottom of that page so as to correctly reproduce the original.

Aside from re-sequencing the way that blocks of English text are presented to a text-centric compression engine, entropy-reducing pre-compression transformations in accordance with the present disclosure may include a re-sequencing of the way that graphic data is presented to a graphics-centric compression engine. (See 106b of FIG. 1F.) Rather than supplying an original graphics input matrix (e.g., a matrix with H pixels per horizontal row and V rows per frame) in left-to-right TV-raster fashion to a compression engine, the original input matrix is pre-transformed by way of segments re-sequencing and/or symbol remapping (see FIG. 1E) and/or other entropy-increasing steps (e.g., bit-masking, concatenation) so that the transformed data is presented to the compression engine as a more optimally compressible input stream of data than the raw data stream that would have resulted from conventional left-to-right TV-raster scanning of the original input matrix. In one embodiment, the graphics pre-transformation process includes an intelligent partitioning of an image matrix into a plurality of tessellated 2D segment areas and a performing of U-turn addressing walks (or more generally, multi-directional walks) inside each 2D segment area (see 540' of FIG. 5B) and also, optionally performing a linked list jump from one 2D segment area to the next (see 542 of FIG. 5B), where the linked list sequence is a function of how similar the sequenced-through segment areas are one to the next. See briefly, FIGS. 4, 5B and 6A. It is within the contemplation of the disclosure to perform 3D U-turn addressing walks inside of tessellated 3D segments if the application storage space is a 3D one and to perform higher-dimensioned walks inside segments of higher orders of dimensionality where warranted. In terms of example, a 3D U-turn addressing walk may step between 3×3×3 pixel cubes in place of the two dimensional 3×3 tiles detailed below. (See 561 of FIG. 5C.)

The segment re-sequencing and/or bit masking and/or symbol re-mapping pre-transformation operations that are disclosed herein are of types that can be quickly reversed so that, after data has been pre-transformed and thereafter compressed, the reversing operations (inverse transforms) can be performed much more quickly. The reversing operations typically include decompression of compressed data followed by one or more inverse transformation operations, where the latter inverse transformations are ones that complement the entropy-lowering pre-transformation operations carried out on the original or raw data. As a result, a replica of the original data sequence is quickly reconstituted. (See briefly, step 185 of FIG. 1G.)

More specifically, for the case where a to-be-pre-transformed graphics object includes a high precision digital color image (e.g., one having a resolution of 24 bits per RGB pixel or better and at least 300 pixels in each of the horizontal (H) and vertical (V) directions; a 300×300 array or larger), the H×V rectangular image matrix is automatically partitioned into fully bounded segment areas that are contoured so that the 24-bit pixels inside each bounded segment area will define data sequences approximately alike to one another when analyzing sequence statistics from one row to the next of the formed segment area (e.g., in terms of color and/or texturing pattern). For example, in FIG. 5A a particular segment area bounded by hard boundary lines 502-503 is shown to contain only reddish pixels (of intensity values R0-R4). As a result of the row-to-row alikeness of data found inside that system-identified segment area 502-503, when such pixel data is taken alone, namely, only the pixel data inside the contoured segment area (i.e., that bounded between 502-503) and is streamed to a compression engine, such pixel information will generally be compressible at a relatively higher compression efficiency than if the pixel data inside the contoured segment area (i.e., 502-503) had been interspersingly mixed with unalike data from pixels (i.e., the green pixels G0-G3 to the right of 503) residing outside the contoured segment area and then presented to a compression engine as intermixed data. In accordance with the disclosure, a segment-to-segment jump table (a linked list structure, see FIG. 6A) is automatically generated for causing a data stream supplying process to jump discontinuously from one bounded segment (i.e., 2D segment area) to a next, compressibly-similar but address-wise spaced apart segment (i.e., 2D segment area) as compression proceeds, where the jump is typically to a next segment most similar to the one just exited. Thus for example, in FIG. 5A after a substantially continuous in-segment walk is exhaustively finished within the segment area bounded by thick lines 502-503, a jump is taken to the reddish segment area bounded between lines 522-523. The concept of the segment-to-segment jump process is better seen in FIG. 5B. For example, segment area 540 (which has an average color value weighting of "R00") has a jump pointer 541 at its bottom right end where that pointer 541 defines an addressing jump 542 next to the top left corner of a spaced-apart segment area 545 (which has an average color value weighting of "R10"). Such successive jumping from one compressibly alike segment to the next allows the compression engine to continue compressing efficiently on the basis of a smoothly evolving context and a correspondingly smoothly evolving adaptive prediction model. While it is compressing the data inside segment area 540, the prediction model will adaptively shift towards a prediction histogram having the R00 value as its center of prediction. When the jump 542 is taken to the spaced-apart segment area 545, the prediction model will eventually shift its internal prediction histogram by a relatively small amount to lock in on to the R10 average value of segment area 545, where R10 is not substantially divergent from R00. By contrast, if pointer 541 had instead directed the same compression walk to next jump into the immediately adjacent, but very green (G30) segment area 550, the adaptive predictor inside the compression engine would have had to shift its internal prediction model by a substantially larger amount to lock in on the G30 average value of segment area 550. The R00 value that it had locked onto while walking inside area 540 would be a disruptive detriment rather than a help when the compression engine next encounters the compressibly unalike G30-averaged data inside area 550 as opposed to next encountering the compressibly similar R10-averaged data inside area 545.

Figure 5A:
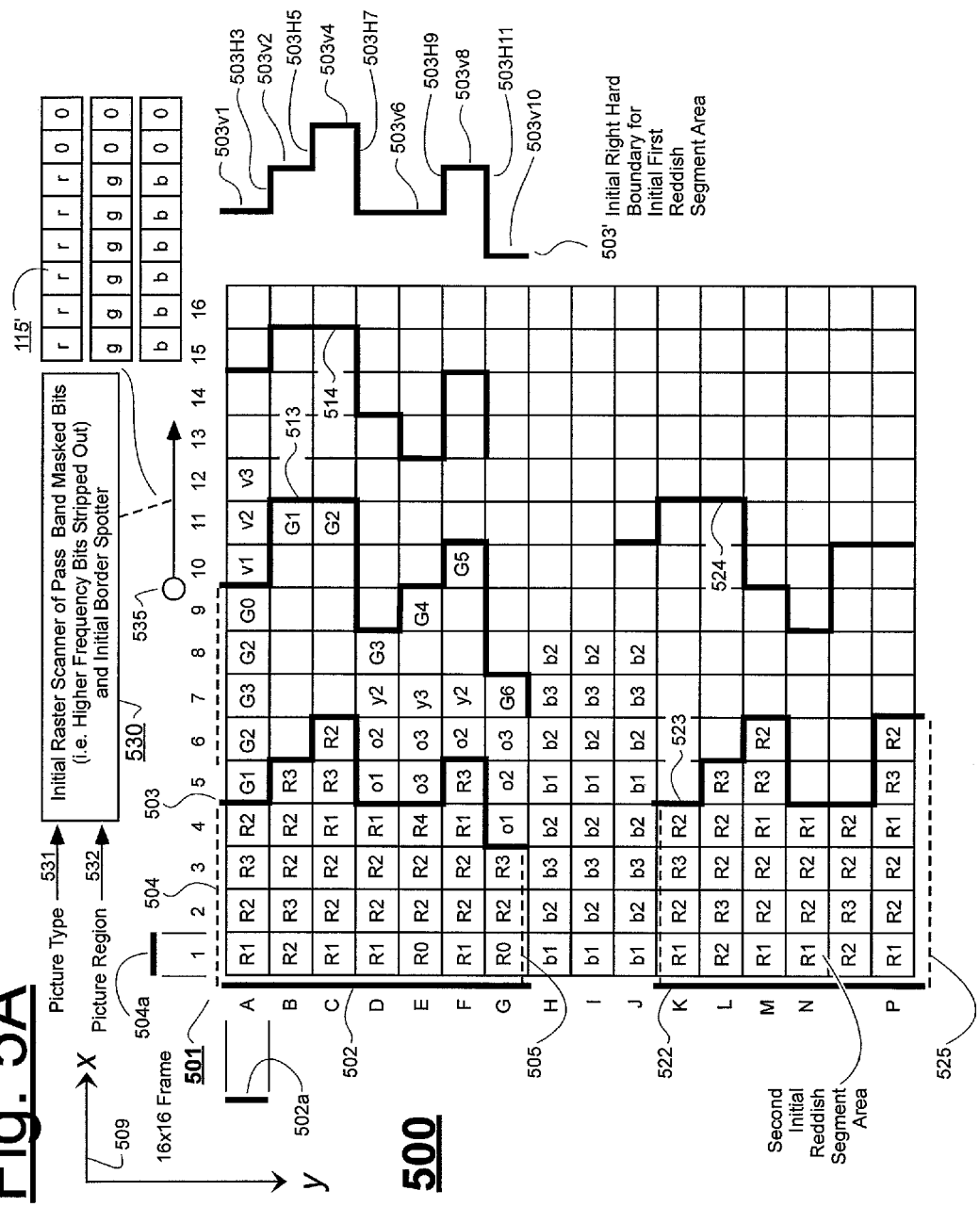
FIG. 5A provides details regarding initial formation of hard boundary definitions for segment areas.
Figure 5B:
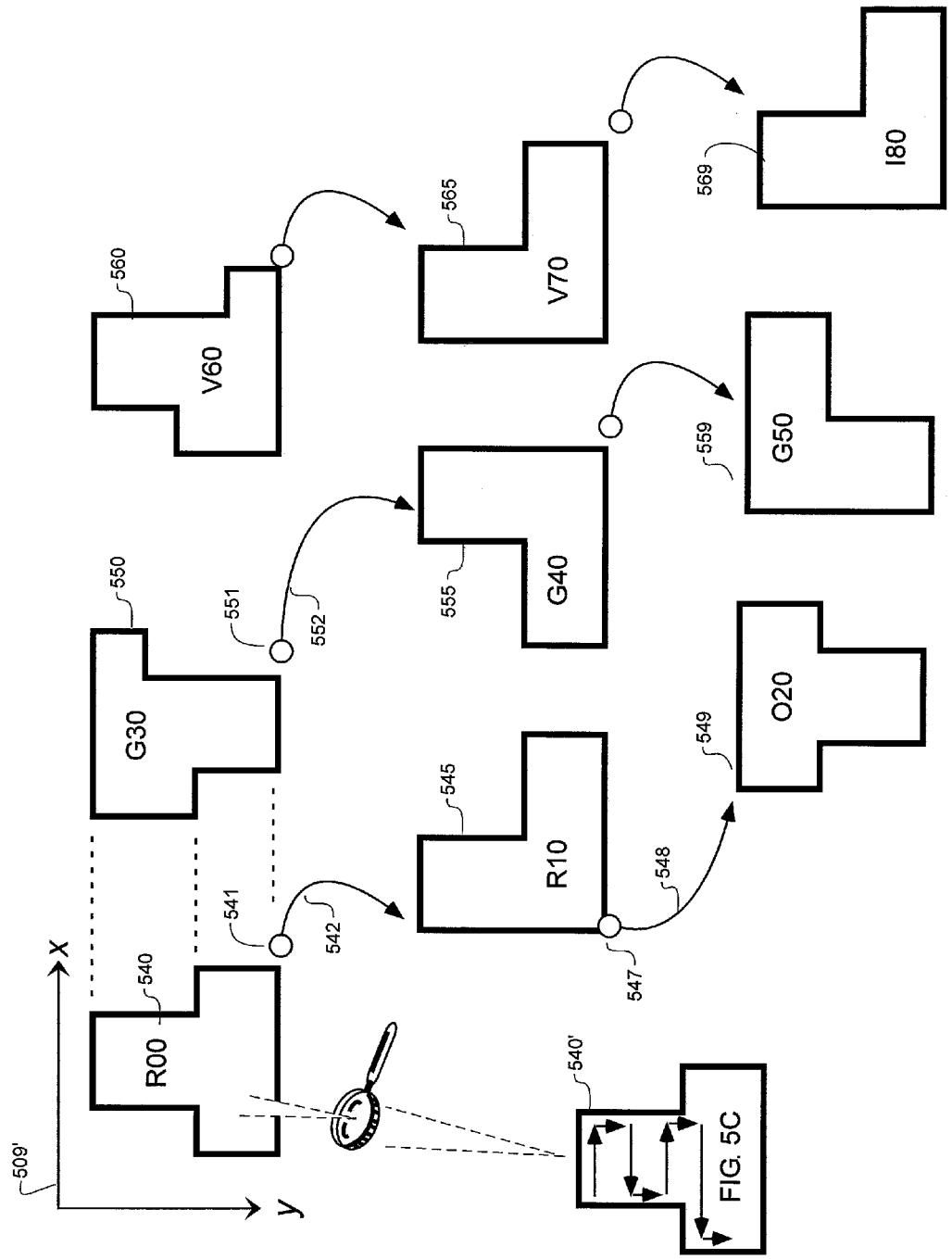
FIG. 5B illustrates a plurality of linked lists each defining an optimally compressible sequence of data from alike segment areas where the linked lists can be simultaneously traversed by parallel processing units if desired.
Figure 5C:
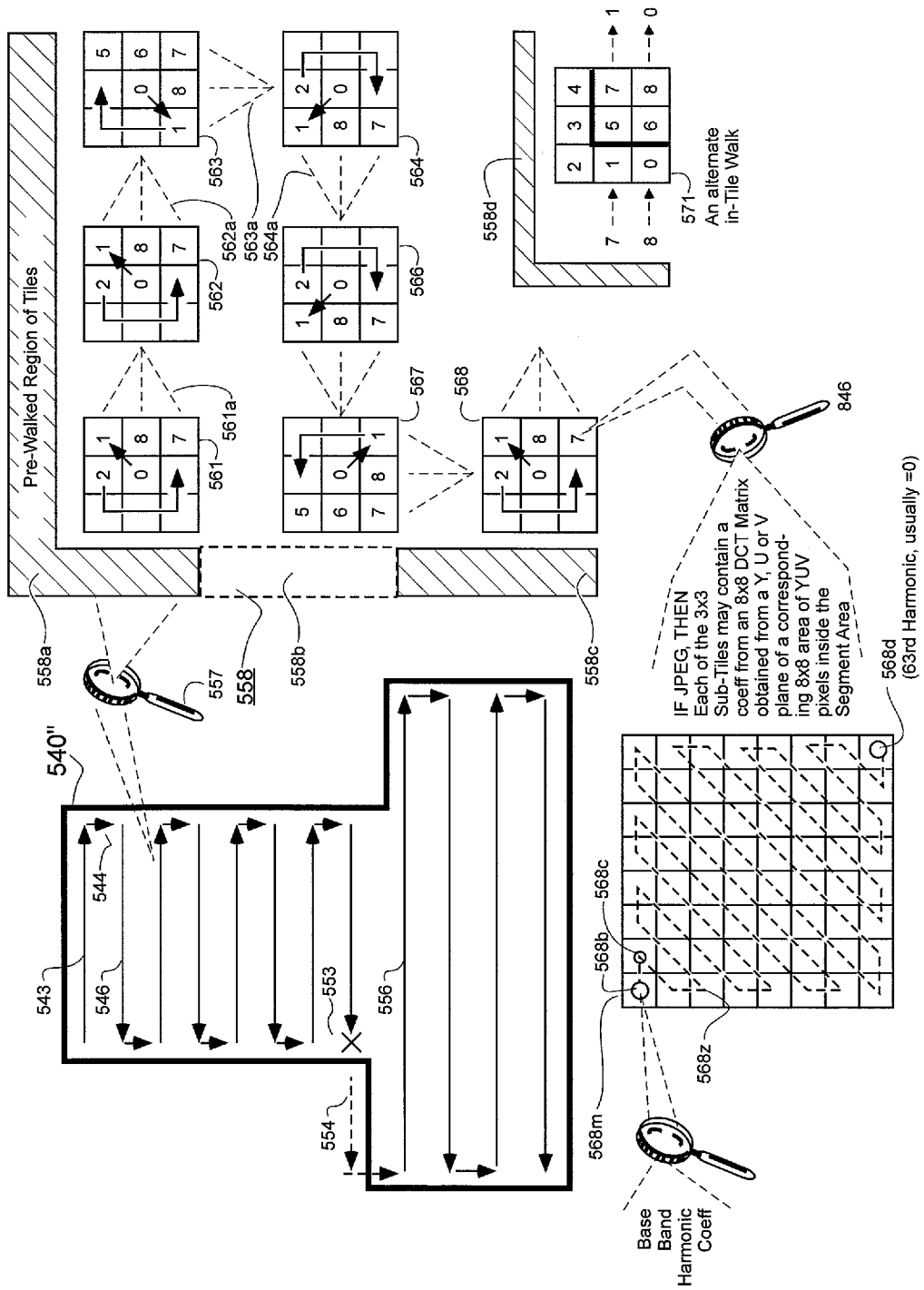
FIG. 5C shows an enlarged view of an in-segment major walk and of optional finer, in-tile looping walks that may be taken when moving left-to-right or moving down or moving right-to-left from one 3×3 tile to a next such tile.

FIG. 5C shows one embodiment wherein a back and forth, and mostly U-turning major walk is taken inside of each of the jumped-into, graphic segment areas (i.e., area 540"). The process of discontinuously jumping into successive list-linked segment areas and performing exhaustive U-turning walks (543-544-546) inside of each is continued until a linked list chain of compressibly alike segment areas (i.e., 540-545-549 of FIG. 5B) has been exhausted. Then the process may begin anew by threading through another linked chain of compressibly alike segment areas (i.e., 550-555-559 of FIG. 5B). This segment-to-segment jumping and segment-interior exhausting process is repeated until the input image matrix is exhausted by the performance of the substantially U-turning addressing walks through all tiles in all the segment areas that cover the input image matrix. (As detailed below, a "tile" can contain just one pixel or it can contain a plurality of pixels or it can contain other pixel-related data.) In the process of performing the major U-turning addressing walks and the optional, in-tile minor walks, an input data stream will be formed for presentation to a prediction-based compression engine (i.e., 260/271 of FIG. 2A). The formed input data stream will define a substantially smooth flow of compressibly alike symbol sequences. As a result, the compression engine will generally be able to compress the received data with a fairly high degree of compression efficiency. In contrast, if the same compression engine had been unintelligently fed with data that is walked across in a blind TV-raster like fashion (see 336' of FIG. 3), then more often than not, the compression engine will not receive predictively alike data sequences and the compression engine will not be able to compress the received data with such a fairly high degree of compression efficiency. The compression engine may instead perform very poorly depending on how disorderly the data is in the sampling stream that is produced by a blind TV-raster like walk through a given image frame. It is mostly a matter of luck rather than intentional pre-conditioning of the input data stream if a blind TV-raster like walk through a graphics frame happens to provide some amount of predictive alikeness from one scanned row to the next. Usually it does not as will be explained below with reference to walk 340 of FIG. 3.

It is to be noted that although the discussion thus far may appear to be focused to some extent on single threaded execution, in one embodiment, parallel processors may be used to simultaneously thread along plural linked lists that each strings together a plurality of usually spaced-apart but compressibly-alike segments. For example, in FIG. 5B a first of plural parallel processors (not all shown, but understood to be replications of the processor shown in FIG. 2A) may walk through the chain including segment areas 540, 545 and 549 while a second of the parallel processors simultaneously walks through the chain including segment areas 550, 555 and 559, and while a third of the parallel processors simultaneously walks through the chain including segment areas 560, 565 and 569, and so on. Such parallel processing allows the comp/decomp system to more quickly cover the whole area of one or more, packed-together input image matrices (or at least that part of each which is being compressed or decompressed under direction of a supervising program).

The example given in FIGS. 5A-5D is a simplistic one that assumes an ability to isolate all-red, or all-green or mostly-blue/violet segment areas in a supplied image frame. More generally however, the image matrix of a natural picture will have complex mixtures of pixels with each having some amount of blue, some amount of green and some amount of red mixed in. It may have roughly repeating sequences of RGB pixels that define certain textures although the repeats will often not be identical. Nonetheless the approximate repetitions of roughly similar data sequences can be clumped into segment areas of roughly similar texturing with the aid of automated statistical data analysis. Irrespective of whether the isolated segment areas are monochromatic ones of just all-red or all-green pixels; or more complexly textured areas, the data streams that are produced by sampling along the U-turning walks inside the list-linked segment areas should be roughly compressibly alike to one another at one level or another due to the intelligent modifications that were made to the original raster order and/or to the details of its content (i.e., content that has had disruptive noise bits stripped out of it).

In some sense, systems in accordance with the present disclosure cheat against the very notion of an adaptive "predictor" because the machine-implemented systems look ahead and analyze the data that the "predictor" will be receiving and the systems rearrange and/or otherwise modify the data that the "predictor" (i.e., 260/270 of FIG. 2A) will be receiving in such a way that the "predictor" will be consecutively spoon-fed with predictively alike sequences of data and thus the predictor will have an easier of time of accurately predicting what is supposedly, never-before-seen data that is coming its way. The cheat-wise enhanced predicting capabilities of the "predictor" (i.e., 260/270 of FIG. 2A) enable the compression encoder (i.e., 271 of FIG. 2A) inside the engine to more efficiently encode the supposedly, never-seen-before data that is coming its way. As a result, the encoder usually produces an encoded output stream (i.e., 273 of FIG. 2A) of a substantially more compressed size than would have been produced by accepting the original, untransformed data file as is according to a blind TV-raster scanning approach that does not take advantage of a sneak peek look-ahead and does not take advantage of a pre-prediction reshuffling and/or other transformation of the input data.

It is to be noted that the reference number combinations 260 and 260/270 are both used herein to reference a "predictor". The present disclosure contemplates two kinds of predictors, either or both of which may take advantage of the entropy lowering processes described herein: adaptive predictors and non-adaptive predictors. Adaptive predictors have a variable and adjustable prediction model section 270 whose prediction operations can change over time to adapt to changes in the statistics of the incoming symbol stream 265, hence the name, adaptive. By contrast, non-adaptive predictors use a fixed code prediction table whose statistics for the incoming symbol stream 265 do not change over time, hence the name, non-adaptive. The prediction model section 270 of an adaptive predictor may include both a fixed code prediction table and a variable section where the variable section may supply deltas for combining with the initially used statistics of the fixed code prediction table. Thus, the mere inclusion of one or more fixed code prediction tables in the prediction model section 270 of a predictor does not per se make the predictor non-adaptive. In general, it will be assumed here that the predictor 260 of FIG. 2A is an adaptive one and thus it cooperates with a variable prediction model section 270 that provides variable modeling coefficients to a variable model for use in combination with the incoming symbol stream history 265. The term predictor taken alone as used herein covers both adaptive and non-adaptive predictors.

While one of the discussed forms of bit-masking (or more broadly, data decomposition) involved the stripping out of disruptive noisy subsets of bits (disruptive sub-symbols) from the input data stream, another form of bit-masking separates (decomposes) a single 2D colored image matrix into a plurality of color filtered planes or otherwise filtered planes, for example into separate red (R), blue (B), and green (G) component planes or into other recombinable component planes (e.g., YUV). In one embodiment, the separated planes are then independently subdivided into segment areas in the corresponding RGB or YUV domains. Separate and independent compression walks are taken across each of the filter-wise separated data planes. Reproduction of the size reduced data may include replication, during decompression, of the separate and independent walks taken during compression phase of the process. After each of the separated component planes is decompressed and optionally inverse-transformed, the inflated and reconstituted component planes are re-joined (reassembled, recomposed) to thereby reconstitute the full content of the original image. This concept of decomposing an original data stream into recombinable components (where the whole is equal to the sum of its parts) is not limited to filtering of image data according to coloration. Other bases for filtering and separately compressing and decompressing the decomposed pieces may be used. For example, if a to-be-compressed data file contains audio waveform samples, the original audio waveform data may be passed through a set of digital bandpass filters to thereby decompose the original signal into is Fourier analysis components (or into wavelet components or into other independently treatable components). The bandpass filters are configured so that some filters will output highly ordered data (i.e., voice data in the 1 KHz to 2 KHz band for example) and others will output mostly disorderly and thus high entropy data. The high entropy data may be simply packed away into a no compression concatenation suitcase for later retrieval and back fill-in. The more orderly data is forwarded to one or more compression engines (i.e., a separate compression engine for each pass band). The more orderly data may be subjected to segmentation into compressibly alike segments and subjected to linked list re-ordering before being submitted to the compression engine in a manner similar to that applied to the segment areas of a graphics image. In one embodiment (see FIG. 8C), the different harmonic coefficients of a JPEG DCT matrix are strung together in accordance with their harmonic band number (base bands are consecutively joined with other base bands of a same segment area; second harmonic coefficients are consecutively joined with other second harmonic coefficients of a same segment area; etc.) and each of the consecutively joined strings of same-band coefficients is supplied as a sequentially efficiently compressible input stream to a compression engine.

Figure 6B:
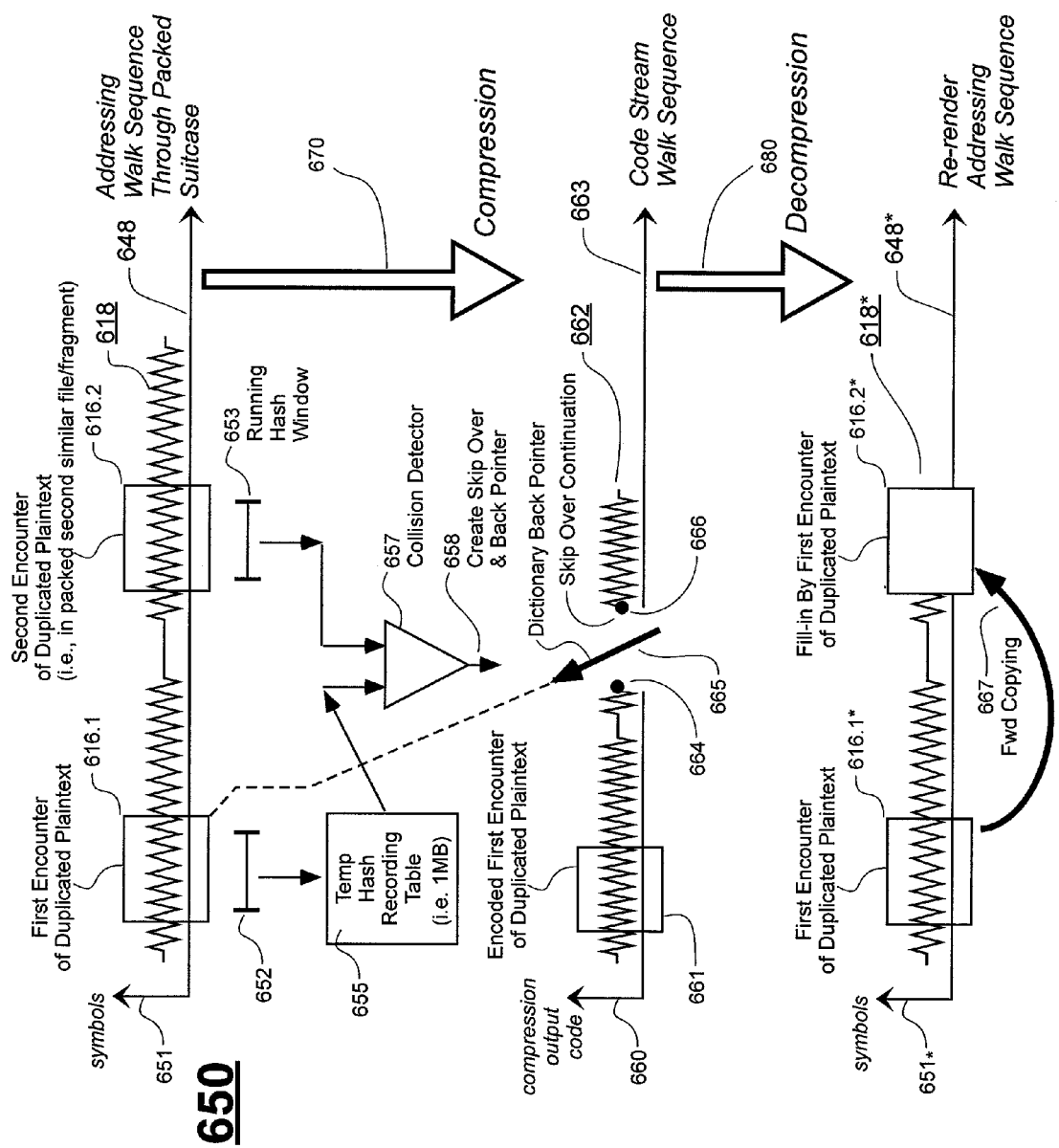
FIG. 6B illustrates how a running hash may be used to insert a dictionary lookback pointer into a compression output stream.

Decompression of separated component planes (i.e., color filtered graphic planes, frequency filtered audio planes, Fourier transformed YUV planes, etc.) may include the step of recombining the inflated outputs produced independently from each of the separated component planes as well as the step of optionally back filling in any stripped out, highly disorderly content (e.g., noisy graphic bits, noisy audio bits) and/or filling in duplicate plaintext data that is pointed to by a dictionary copy pointer (see FIG. 6B). The decompression walks follow in the footsteps of the compression walks by using the same in-segment walk patterns and the same sequence of jumps from one segment to the next. The decompression process thereby produces a replica of the input data stream supplied to the compression engine. If needed, this replica of the data stream that was input to the compression engine may be further inverse transformed to recreate the original data that existed prior to any pre-compression transformations being applied. As mentioned above, randomly fluctuating LSB bits (i.e., noise saturated bits) that were masked out and saved (if at all) during pre-transformation are back filled in so as to fully reproduce all nuances of the original data if such is desired. On the other hand, some or all of the noise may be intentionally left out. In one embodiment, parallel processors may be used to simultaneously decompress the data sequences generated by each of plural linked lists of alike segments and to inverse transform the decompressed results.

In one class of embodiments, one or more of the above described entropy-reducing pre-transformation processes is carried out in a data storage system that has variable usage loading for one or more classes of files. For example, some files may not be accessed as much (or at all) by users or application programs during night hours or during weekend hours whereas they may be heavily accessed by users during normal business hours. During the off peak hours, raw (uncompressed) data in the files is pre-transformed (e.g., parsed, decomposed and packed into corresponding concatenation suitcases along with alike patterned data from other files and/or subjected to symbol re-sequencing algorithms and/or bit-masking algorithms associated with the respective suitcases) so as to thereby cause the pre-transformed file data to present itself to a predefined compression engine as a sequentially efficiently compressible (SEC) stream that is more optimally compressible than the sequence of data that would have been presented by the raw and not pre-transformed data of the same input file(s). Then each concatenation suitcase that is packed to near its end with compressibly alike data is compressed with the use of a predefined and suitcase-specific prediction model during opportunistically available time slots, such as during off peak usage hours. Decompression is much faster because the decompression process does not need to identify disruptive data sequences or to find and define an appropriate, custom tailored pre-transformation algorithm (e.g., a data decomposition and/or re-sequencing algorithm) or a tweaked compression algorithm for optimally compressing the data. That work has already been done by the compression and pre-transformation processes in the off peak hours. The decompression process merely follows in footsteps that were trail-blazed by the compression and pre-transformation processes. It performs a reverse compression and a reverse transformation (e.g., a reverse data sequencing operation and/or a reverse decomposition). As a consequence of its faster speed, the decompression process can be used during peak user access hours in a manner which quickly supplies decompressed data to users and/or to their application-program executing computers.

Detailed Discussions of Drawings

FIG. 1A is a schematic diagram showing an exemplary environment 100 in which the here disclosed inventive concepts may be practiced. FIG. 1A is somewhat cluttered, and somewhat contrived and at times may seem to contain unrelated bits and pieces rather a cohesive tapestry of teachings. However, the reader's indulgence is requested. The various pieces of the tapestry will start coming together when FIG. 1B is described. It is noted here that a picture of a person's face is used as an example in FIGS. 1A and 1B. Facial features are familiar to most people and thus provide images with easily identified landmarks. Persons skilled in the art are to appreciate that the present disclosure contemplates substitution of the illustrated facial portraits 110-112 by medical data such as found in MRI slices, CAT slices and/or X-rays and/or substitution by other technically challenging imagery (e.g., 3D engineering CAD drawings). The disclosure is not limited to graphic images. Its teachings may be applied to digital data files containing one or more of text, audio clips, video clips and telemetry data as well as those containing graphic images. Decomposition of such composite files will be discussed in conjunction with FIG. 1F.

For purpose of illustrative example, it is assumed in FIG. 1A that a first sequence 118 of pre-selected portrait files (e.g., naturally photographed digital portraits) 110, 111, 112, . . . , 113 is being supplied by a user 145 to a computer system 140 for compression of the data contained in that pre-selected sequence 118 of portrait files. The compressed data is to be stored in a nonvolatile storage means (160, i.e., a bank of hard magnetic disks) for later retrieval, decompression and use by one or more access-demanding users (i.e., the same user 145 who supplied the raw data sequence 118) and/or by one or more application-serving machines (i.e., computer 144).

It is further assumed in FIG. 1A that storage means 160 experiences modulating data throughput demands over time (as measured for example in terms of average numbers of bits to be retrieved per average request over each unit of time, i.e., hour) where the throughput demands are made as a result of user-initiated access requests. An example of a modulating set of access throughput demands is graphed at 161 as if it were displayed on the screen of computer 144. This user-initiated usage graph 161 includes one or more identifiable peak load times and one or more times of minimal user-requested throughput at least for an identifiable class of data files (e.g., those storing profile portraits). Computer 144 does not necessarily have to display graph 161.

In accordance with one aspect of the disclosure, data compression and pre-compression operations preferentially take place during the throughput demand valleys 161a (and/or during other opportunistically found times of reduced throughput demand) and decompressions plus post-decompression operations usually take place during or near the peaks. The decompression and post-decompression operations tend to be asymmetrically faster than the compression and pre-compression operations (T2<<T1, where T1 is time spent for finding a good compaction solution/recipe for a given file and executing it while T2 is time spent for undoing the compaction by use of the earlier developed compaction recipe). It will be seen that various ones of the pre-compression techniques disclosed herein tend to be time consuming and thus it is desirable to have a situation where a given data storing device (e.g., a hard drive) experiences slack times in user-initiated demand for its finite data throughput capabilities. It is during such demand slack times that the somewhat slow pre-compression operations disclosed herein (those that consume the longer T1 time slots) can take place. Post-decompression operations (those that consume the shorter T2 time slots) on the other hand are usually relatively much faster and can take place during peak demand times.

In terms of a simple and concrete although somewhat contrived example, consider a high volume digital photography studio that snaps many high resolution pictures during normal business hours (e.g., 9 AM to 5 PM) for use in passports and/or other picture identification based security schemes. The exemplary studio employs a night staff (e.g., one that works 11 PM to 7 AM) to review the snapshots, crop them to desired dimensions, remove red-eye and/or to otherwise process the initially shot footage so as to have the finished product ready for pick up in the next day or so by studio customers. Each customer has many snapshots taken per sitting: say, a profile face shot, a frontal face shot, head and upper torso, full body, etc. These shots are stored in a data storage bank 160 as individually identified computer files in respective file folders (not shown) assigned to the respective customers or respective customer accounts. In other words, customer number 1 has her profile, frontal, upper torso, etc. shots all stored in a first folder that is uniquely named so as to uniquely correspond with customer account number 1. Customer number 2 similarly has his profile, etc., snapshots digitally all stored in a respective differently named computer folder so as to uniquely correspond with customer account number 2 and so forth. Assume that the studio generates enough of a volume of photographs during its daytime photo-taking sessions that it is economically worthwhile to compress the initially-shot data so as to thereby minimize storage costs and/or reduce file retrieval times. (Compression tends to reduce file retrieval time from spinning media such as magnetic hard disks because there are fewer bits to retrieve from the relatively slow spinning disk platters.) Assume that much of the normal day time business hours are dedicated to writing raw naturally-sourced imagery into the disk bank 160. Many of the quickly shot photographs will be discarded later because the subject blinked, or shifted position or something else happened that warrants discard. However, in the rush of the daytime mass data collection operations, nothing is discarded at that time. Assume that in the off peak hours (e.g., 5 PM to 11 PM for this example), one or more automatically activated computers (e.g., 140) will come to life and begin reading the day's collection of raw photo shoots, begin compressing the footage, and then storing the compressed data back into the disk bank (160), thereby reducing the amount of cumulative storage needed for storing, say a year's worth of photographs in the studio's disk bank 160. By the time the night staff (145) comes in to begin working on the studio's recent intake (from the same day or intake from an earlier day), a majority if not all of the digitized photographs will have been compressed. One advantage of such off-hour compression is that it can create additional free space in disk bank 160 for absorbing at least part of a next day's worth of raw imagery.

When a staff member (e.g., 145) arrives later and begins using his application-executing computer (i.e., 144) to reference a given one of the stored and subsequently compressed photographs in a given customer's folder, a second computer (e.g., 140) automatically intervenes to quickly decompress the data before serving it up to the user 145 on the user's workstation 144. This happens transparently. Alternatively, the user's workstation 144 may include software for decompressing data served up by server computer 140. The user 145 usually remains unaware that the compression and decompression processes occurred in the background.

A variety of different environments correspond to this kind of usage pattern involving high volume initial storage, in between slack in throughput demand and subsequent selective demand for part of the mass stored data. The present disclosure is therefore not limited to a high volume digital photography studio. The same basic burst and bust sequence of user-initiated demands for storage resources (160) may occur for example in the radiology department of a large hospital. Technicians may snap many high definition medical images (e.g., Magnetic Resonance Imagery or MRI; Cross Anatomical Tomography or CAT; sonogram, or other types) during patient visiting hours. Later in the day; doctors (i.e., radiologists) may come in to review the digitized results after they finish making rounds. Many yet other practical situations occur where raw footage of natural phenomenon is recorded during a mass recording session during one time period and the collected data is selectively retrieved for detailed analysis and/or rework at a substantially later time. Thus slack times in user demand for the data throughput abilities of nonvolatile storage devices occur routinely. In many instances this slack or demand down time is dedicated to the performance of storage backup operations (e.g., to copy data from disk to a backup tape—not shown). In accordance with the disclosure however, some of this slack time is rededicated to performance of pre-compression analysis and pre-compression transformation processes as well as to data compression itself. The pre-compression analysis and pre-compression transformation processes improve the compression efficiency of the data compression process so that the compression output is smaller than it otherwise would have been without the pre-compression analysis and pre-compression transformation processes. As a result, less time is then needed for backing up the better-compressed data. The more the pre-compression analysis and pre-compression transformation processes improve the compression efficiency of the data compression process, the smaller is the amount of time needed for backup and the smaller is the amount of storage space consumed for backup.

The present disclosure focuses on various pre-compression analysis processes and pre-compression transformation processes that enable a prediction based compression engine to compress supplied data more efficiently (thus outputting a lower number of bits per input character (BPC) or per input bit) than was possible with conventional techniques. Under conventional techniques each file is compressed on its own in TV-raster like style and/or random files are grouped together in random orders of concatenation prior to being zipped together. The present disclosure calls for an intentional fragmentation and/or segmentation and reorganization of the sequence in which data segments are presented to a prediction-based compression engine so that sequentially efficiently compressible (SEC) sequences of data will be spoon-fed to the prediction based compressor.

The present disclosure also shows how to compress data in a way that allows the most frequently used data to become more quickly available to users on demand. The present disclosure calls for an intentional reorganization of how data is packed into so-called concatenation suitcases (See 118" of FIG. 1B) so that the data which is demanded more frequently and/or the data whose information is needed sooner (on a higher priority basis) appears earlier in a front to back walk through its corresponding suitcase.

In FIG. 1A, the first one 110 of a plurality 118 of somewhat alike, but not same portraits (111, 112, ..., 113) is blown up for closer examination. This exemplary picture 110 shows a well-known optical illusion. It may be interpreted either as showing a beautiful young lady wearing a feathery plume over her head and looking away to the far left or as an elderly or haggard woman wearing a scarf over her head and looking to the bottom left corner of the picture. (Beauty's chin becomes the hag's nose or vise versa.) The ambiguity is intentional and is used here to help illustrate a number of interrelated concepts. Rather than only perceiving the somewhat alike portraits (111, 112, ..., 113) as being spread out linearly across a two dimensional viewing space, it may be useful during the reading of this disclosure to imagine them as alternatively being alignably stacked one on top of the other in a three dimensional access space and to imagine a drill down viewing process where a pixel in the second 111 of the alike portraits 118 is looked at immediately after a like located pixel in the immediately above portrait 111 is looked at, where a like located pixel in the third portrait 112 is looked at immediately thereafter and so on. Regions 116.1-116.3 of FIG. 1B roughly correspond to such a drill down viewing process as will become clearer below.

Referring still to FIG. 1A, early approaches to digital data compression assumed that data is data. In other words it made no difference what kind of data was being compressed because the compression engine (i.e., the one installed in computer 140 but not explicitly shown in FIG. 1A) would adaptively figure out on the fly how to optimally encode and compress whatever data was randomly thrown its way in raster scan fashion. It is shown here that this initial assumption is wrong headed. It is valuable to know the meaning of the data being submitted to the compressor and from that to deduce what parts of the data will have similar statistical characteristics in terms of the symbol sequences they represent. In other words, it is useful to analyze the semantic content of the to-be-compressed data, to know the definition of what constitutes symbols and predominant super-symbols within the to-be-compressed data and to determine the statistical distribution of such symbols and super-symbols as well as knowing the raw data sequence itself. Such semantic understanding can help in better formulating the pre-compression transformation processes and in better formulating the prediction model or models to be used within the compression algorithm after pre-compression transformation is performed. More specifically, it will be seen from the material presented herein, that semantic understanding of the presented data is useful for formulating one or more entropy-lowering pre-compression transformation processes (also referred to herein more simply as pre-transformations). In one example of such pre-transformation, a special walking path (see for example 116.1-116.3 of FIG. 1B.) is defined for walking sequentially through a memory address space while fetching data for compression, where the walked-in memory space stores pixel data representing a raster-scannable graphic image. In accordance with the present disclosure, one or more additional entropy-lowering pre-transformation operations are carried out prior to formulating a final walk through an image space and thereafter carrying out a final compression operation (e.g., step 177 of FIG. 1G) that walks the predefined walk. The additional entropy-lowering pre-transformation operations further lower the entropy of a data stream presented to a compression engine and thus increase the compression efficiency of the final compression operation. Compression efficiency may be measured by comparing the final bits-per-character (BPC) results of a first compression process against the final BPC results of a second compression process when both are given the same original input set of characters.

Before diving deeper into the technical details of various ones of the pre-transformation and compression techniques presented herein, consider first how a hypothetical human observer 120 might go about mentally storing the first portrait 110 in his head for the purpose of later recalling that picture 110 as best as he can from memory. First the observer 120 might try to determine the general nature of the data. Is it text? Is it a picture? Is it a combination of both? If it is a picture, is it one of a beautiful young lady looking away or is it a picture of an elderly hag wearing a scarf and looking to the bottom right of the frame? These initial decisions all go to semantic meaning rather than to just raw content and they can significantly affect how the human observer 120 next records a sketched tracing of the data (i.e., the picture 110) in his head and how he associates functionality to different parts of the outlined sketch. The associated functionalities will often help to improve his later recall of the image. Eyes, for example generally surround the top of the nose while the mouth goes below and the chin appears further below that. So once our hypothetical observer 120 determines what part of frame 110 constitutes the nose and where it is located, other functional features will fall more quickly into place for storage and later recall in the correct position.

Generally, the casual observer 120 will try to first formulate a coloring book style sketch that is not yet colored-in. The sketch will roughly indicate the locations of its major functional elements (i.e., eyes, nose, mouth chin, hair) within the frame 110. In doing this, the observer 120 will be assigning semantic meaning to each region according to its perceived function. For example, if region 116 may be perceived by one observer 120 to be part of a feathery plume extending behind the neck of the young beauty. Next, the user 120 may record that area 116 as calling for a later fill-in with a feathery plume type of texture when he later mentally recalls the memorized coloring book template of picture 110 and tries to fill in its details. The observer 120 may elect to formulate in his mind, a palette 123 containing a feathery plume like fill-in texture as well as other appropriate textures (i.e., skin tone for the chin/nose). Contrastingly, if the human observer 120 had instead recognized region 116 as belonging to the scarf of the elderly hag, then the observer 120 may have mentally recorded that area as being filled with a woven cloth or scarf like texture rather than the texture of a feathery plume. The observer 120 will then have formulated a slightly different palette 123 containing a cloth fill-in texture in his head for later fill-in into region 116. The outer boundary of the scarf/plume area may change during mental reconstruction by the observer 120 depending on whether it was seen as being a multifaceted collection of separate feathers or as a homogeneously woven together edge of a head cloth or a scarf. Importantly, some functional parts may be partially unbounded in terms of where their domain ends and where a next functional part begins. For example, in the case of the hag version of picture 110, it is not clear where the nose ends and the cheek or eye begins. Of course this all depends on whether the observer 120 initially categorized portrait 110 as belonging to a collection of portraits that profile young ladies looking away or elderly ladies looking forward and down.

So to recap, a human observer's mental process of remembering and later recollecting portrait 110 will often be a function the semantic meanings the observer assigned to each functional part of his coloring-book like segmentation of the picture 110. The human observer's mental recollection will often be based on partial segmentation boundaries (not closed ones) loosely defined around open ended areas according to the perceived function of each visual object and how they meld one into the other (i.e., how the hag's nose merges into the rest of her face). The human observer will mentally record each feature as being located where it was originally found in its picture frame 110 rather than as being placed elsewhere.

The hypothetical observer's viewing 121 and analysis of the first portrait 110 may be summarized by thought bubble 122. In a first step 122a, the user 120 recognizes and classifies various bounded or unbounded areas of the portrait as belonging to respective functional objects: nose, eyes, mouth, etc. and having interrelated locations (e.g., eyes above nose). More specifically, rectangular area 116 may be deemed as belonging either to the hag's scarf or to the beauty's feathery plume. In a second mental step 122b, the human observer 120 divides the semantically analyzed picture 110 into traced areas of a coloring book style (where some areas are partially or fully unbounded) based on the semantic analysis results of step 122a. The semantic analysis results will often dictate the definition of the area's traced outer periphery (i.e., feathery edges or smooth bordered scarf edge) during recall. In a third mental step 122c, the observer 120 will recall and mentally reconstruct the image by first recalling the coloring book style tracing of the element borders, each being placed in their original locations in frame 110, and by afterwards using the recorded models of each functional object and the associated fill-in textures in the texture palette 123 to reconstructively fill in the areas with pro forma textures. For example the unbounded rectangular region shown at 116 may be recalled as having resided within a feathery plume area and thus it will be filled in with a feathery plume texture that is painted in with a TV-like raster style rendition process (left-to-right only, full horizontal sweeps across the full functional object). Contrastingly, unbounded region 114 may have been recalled as belonging to a white curtain background and therefore might have been filled in with a texture of a white curtain and so forth. Of course, this mentally and manually carried out recollection technique will tend to be a lossy one given that the human observer 120 does not accurately record or recall the specific pigmentations and exact location of every tiny pixel in the presented portrait 110 or the exact shape of every border. One point that is worthy of note here though, is the realization that practice can make the human observer 120 better as he develops a personal history (personal memory) of how to go about analyzing each of a plurality of substantially alike portraits 118. The first one (110) in the portrait series 118 may have been difficult to process. But as the human observer continues from one to the next (111, 112, etc.) along a series of same-way classified portraits (i.e., assume they are all profiles of young beauties instead of frontal snapshots of elderly people), the human observer 120 will tend to "learn" from his experience, build on that experience and he will get better and better at it so long as the sequence of same-way classified portraits is not interrupted by pictures from other classes (i.e., from multi-class collection 119 which may contain medical X-rays or pictures of houses or road maps and/or areas of text filled along with the graphics, and so forth). If an out of sequence picture is thrown at observer 120 midway through the process, say one of a house instead of a face, that will tend to throw the observer off track. If a series of houses suddenly appear, the observer 120 will start forgetting how to process faces and will begin instead to become more proficient at processing houses, thus losing his ability to efficiently process faces.

The above discussion regarding the hypothetical human 120 was for purpose of introducing several concepts. The remaining discussion will focus not on human observers like 120 who recollect images imperfectly (in lossy fashion) but rather on machine systems that do a much better job of reconstructing a compressed image, preferably by reconstructing an image from a compressed version of that image without any loss of accuracy or precision.

FIG. 1A shows one automated data processing machine (e.g., computer) 140 that is configured in accordance with the present disclosure and is juxtaposed in the diagram for comparison against the hypothetical human recaller 120. Bubble 142 corresponds to a set of automated and machine-implemented operations which may be carried out in accordance with compression and decompression instruction signals loaded into instructable machine 140 where the instruction signals are structured in accordance with the present disclosure. The machine-implemented data processing steps of bubble 142 provide a tangible, useful and concrete result, namely; they allow for a quick and lossless recreation of a graphic image such as 110 after the latter digitized image has been subjected to a relatively efficient, albeit slow combination of a pre-compression transformation process and a compression process. The post-compression and thus deflated image is stored in a storage means such nonvolatile disk bank 160 and later retrieved at the behest of a user 145 and/or at the behest of an application executing computer 144 for decompression (inflation) and/or use (the use can include transmission of a compressed file over a network). The technical effects of the machine-implemented operations of bubble 142 may include reduced size of storage space, reduced energy drain, and faster retrieval of and/or quicker transmission of the compressed data due to its reduced number of bits.

During a first step 142a of the machine implemented process 142, the supplied picture frame 110 is intelligently divided into a plurality of tessellating and fully bounded segment areas, where at least one hard boundary part of each of these segment areas is defined. (A non-intelligent, brute force process of dividing up of image frame 110 into quadrants or other partitions is also possible in place of, or in addition to this intelligent dividing step. The non-intelligent subdivision will be discussed later in connection with quadrants Q1-Q4 of FIG. 1B.) In the intelligent subdividing process, each inserted hard boundary is intelligently defined by automated machine operations so as to create a condition of compressible-alikeness for the data contained inside the boundary's corresponding segment area or inside an immediately adjoining segment area. More specifically, if portrait 110 is a rectangular image that initially has a leftmost hard boundary 110a that constitutes a vertical line (parallel to the y axis of reference frame 109) and initially has a rightmost hard boundary 110b that also constitutes a vertical line, then in step 142a a series of interposed and other hard boundary lines are defined or, more generally, a series of interposed and other hard boundary curves are defined and inserted between the linear leftmost and rightmost boundary lines 110a and 110b so as to divide the image into a plurality of tessellated segment areas (tightly fitting together areas) where the content inside one or more of the intelligently-defined segment areas is by itself more efficiently compressible than is a mixed interspersing of the in-segment data with other surrounding data. (An example of tessellated segment areas will be detailed in conjunction with FIG. 5A. For example, one segment area is bounded by a left hard boundary line 501 and a right hard boundary 503. The second area bounded between lines 503 and 513 tessellates with the area between lines 502-503.) The machine-defined boundary curves (where the curves can be or can include straight lines) may include horizontally extending curves (i.e., 504, 505) between the topmost and bottommost edges of rectangular portrait 110 instead of, or in addition to, the interposed boundary curves disposed between the leftmost and rightmost peripheral boundary lines 110a and 110b. In one embodiment, the defined hard boundary curves are recreated from boundary-approximating curves (soft boundary curves) such as boundary-approximating Bezier curves (see 573 of FIG. 5D). In one embodiment, soft boundary curves are derived from initial hard boundary curves. The derivation includes a step of simplifying and/or smoothing out one or more of the initial hard boundary curves so as to reduce the number of anchor points minimally needed for defining the resulting hard and/or soft boundary curves. When so-called soft or boundary-approximating curves are used, a pixel, or a tile-full of pixels (e.g., a 3×3 tile) is deemed to be on one side of the boundary-approximating curve (i.e., inside) or the other side (i.e., outside of the correspondingly bounded segment area) depending on where a predefined reference point of the tile (or pixel) lies relative to the boundary-approximating curve (to one side of the curve, to the other side or on the curve, where the latter on-curve condition is associated by use of a system-defined convention to indicate lying on one side of the curve rather than the other). The predefined reference point of a given tile may be the center of the tile for example, or a topmost and left corner of the tile, or another such clearly identifiable reference point that can serve as an appropriate center of gravity for purposes associating the tile with being on one side or another of a boundary-approximating curve or plot.

A first important difference between machine-implemented step 142a and its counterpart human mental step 122a is that the machine 140 scans the portrait 110 in search of compressibly-alike data sequences and in search of corresponding segment areas whose intelligently-defined boundaries make their interior sequences of data more efficiently compressible by use of an in-segment walk process (to be described shortly). In contrast, the human observer 120 searches the portrait for functional objects (i.e. beauty's chin or the hag's nose). The human tends to segment the picture in a non-tessellated way based on functionality rather than compressibility of data sequences. Stated otherwise, the boundaries of the machine-defined segments are automatically defined by machine 140 in view of compression efficiency considerations rather than functional object considerations. (This does not mean that function is unimportant to the machine. Function may define an alphabet of to-be compressed symbols.) If it so happens that rectangular region 116 is seen by machine 140 as an optimally compressible segment area; this will be done not merely because region 116 functionally belongs to the feathery plume of the young beauty or to the clothy part of the hag's scarf but rather because machine 140 has defined the outer boundaries of region 116 to be ones containing relatively efficiently compressible sequences of data (in view of the machine's current context) and the boundaries just happened to be those of a rectangle. Usually the intelligently-found boundaries will more complex than just four straight lines. Thus the recognition of region 116 by machine 140 as constituting an efficiently compressible sequence of sample data points will generally be based on a different algorithm than the functional recognition used by the human observer 120 to deem region 116 as being part of a feathery plume or of a clothy scarf.

Figure 1E:
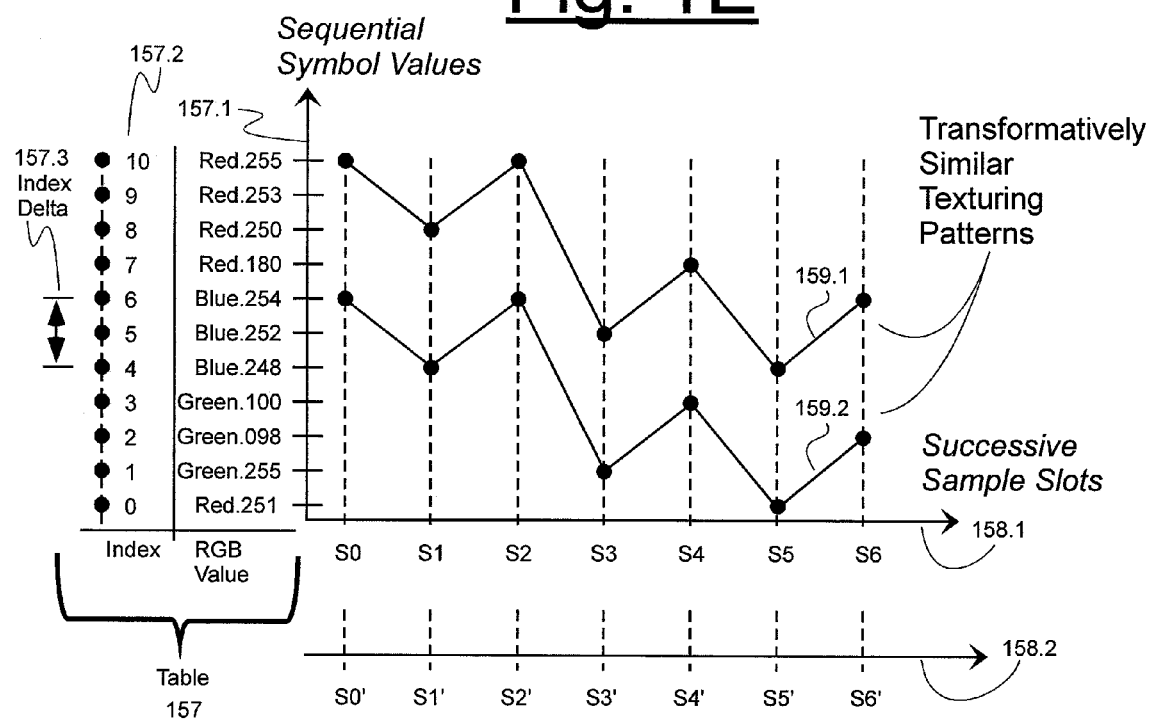
FIG. 1E shows how similar texturing patterns (taken across respective sample points) can be displaced across a common symbol space and remapped into an index space.

In one embodiment, machine 140 carries out a second step 142b after having initially recognized fully bounded segment areas (closed areas having a definite number of pixels in them) within frame 110 that are potentially compressible in an efficient way. The second step 142b modifies one or more of the initially inserted boundaries so as to provide simpler boundary definitions for each segment, where the simplification of boundary definitions may, and usually does, alter the definition of the segment area itself, perhaps reducing compression efficiency in exchange for achieving faster decompression and/or simplified a minimal description of the segment area. In one embodiment, the boundary simplification is executed so that less memory will be consumed by boundary definitions and/or so that an inverse transformation operation can be carried out more quickly as will be clearer when step 185 of FIG. 1G is discussed. At the same time that the segment boundaries are readjusted for easing the reverse transformation process (and for reducing the number of bits needed for defining segment boundaries), machine 140 further carries out one or more, trial and error compression runs to see what effect on compression efficiency an automatically proposed boundary simplification may have. The machine 140 uses the initial trial and error compression runs to better determine where the segment boundaries can or should be placed and also to determine what type of initial predictor model (e.g., a pre-seeded model) will work well given the experience acquired by the machine 140 in its dynamic re-defining of the boundaries of each segment area. In other words, machine 140 is searching for superior compaction solutions during its allotted search-and-compact time (T1), machine 140 is recording the recipe of the best compaction technique it has found thus far and machine 140 is recording knowledge it has acquired about the statistical nature of the input data stream it is processing. The recipe for the compaction technique that is finally settled upon will be shared with the data decompacting process that later takes place in machine 140 (or in another processor core that performs decompaction and restitution of compacted data). The acquired and recorded knowledge about the statistical nature of the input data stream that was processed in the trial and error period can be stored into a knowledge database (not shown) for use by later processes that later try to find compaction solutions for later submitted data files.

The performing of trial and error compression runs in step 142b and of refining the one or more boundaries of each segment area tend to be time consuming. Thus the over all process 140 is suited for asymmetrical compression and decompression situations such as the one described above for the exemplary photography studio or the medical imaging department. The time (T1) allotted for compression can be relatively long whereas the time (T2) allotted for decompression and presentation of the decompressed data in an intelligently useful manner to a user 145 and/or an application serving machine 144 typically has to be much shorter so as to meet quality of service requirements (QOS) and service license agreement requirements (SLA) if such exist. In the case where new uncompressed data is added en mass to a system (160) on the basis of seven days a week at a per day average rate of M characters per second (CPS), the average speed for the combined pre-compression transformations and final compression should be at least M*(T-V)N characters per second, where T/V is the ratio of total system operational time available during the day divided by time of valley demand operations (161a), where the time of valley operations is that which can be dedicated to the slow compression process. If compression speed consistently falls below this M*(T-V)N minimal value for CPS, the system will not be able to fully compress all of its incoming new data on a sustainable basis. In that case, additional resources (core processors) should be brought on line for meeting the inflow demands. A method that can be carried out in accordance with the disclosure comprises: (a) automatically determining if compacting resources available during demand slack times are sufficient to compact incoming data on a sustainable basis and (b) if, not automatically reporting the need for additional compacting resources to a system administrator.

In the third step 142c, the machine 140 performs a final in-segment walk (the settled upon compaction solution) inside each of the refined segment areas and the machine encodes the content sampled from inside those segments in accordance with the settled upon prediction-based compression algorithm such as one based on arithmetic encoding and adaptive prediction modeling and stores the encoded data as well as recording the recipe for undoing the data compaction. The encoding is a lossless one and the walk path is a deterministic one so that later, when the same walk is taken with a complementary decoding process (that uses the recorded recipe), the in-segment decoding walk can fully recreate the original data without loss of any bits if such losslessness is desired. (An example of an in-segment walk will be detailed in conjunction with FIG. 5C. An example of segment-to-segment jumps during a continuous compression or decompression walk will be detailed in conjunction with FIG. 5B.)

Speaking of lossless compression and decompression, it is sometimes desirable to store picture images both in full accurate detail and also as lower resolution thumbnail pictures where the thumbnail pictures are first sequenced through quickly to identify those that a user (145) may want and then desired ones of the thumbnails are used to fetch corresponding bigger and more detailed views. In one embodiment, machine 140 subdivides the original picture frame 110 differently into tessellated segment areas depending on the type of resolution desired during user retrieval. For example, machine 140 may use a first, broad brush, segments-defining process when compressing for thumbnail recreation; and machine 140 may use a second, finer brush, segments-defining process (i.e. smaller tiles and/or finer recognition of initial hard boundaries in FIG. 5A) when compressing for the purpose of recreating a full resolution picture. Or alternatively, machine 140 may not compress the thumbnail at, but rather just pack it into a non-deflatable concatenation suitcase with other thumbnails. Accordingly, it is within the contemplation of the present disclosure that segmentation and/or compression can be carried out differently based on the targeted recreation resolution (i.e. thumbnail or otherwise) desired after decompression occurs. Two or more compressions of same file may be carried out and stored with different pre-compression transforms and different compression algorithms being employed for each of the different ones of desired outputs. In other words, multiple compaction solutions can be found and recorded for a same input file and the system may elect to use one such solution (compaction and decompaction recipe) over another at a given time based on current system needs and constraints.

Segmentation may also be a function of a pre-defined bit masking operation. Referring to an 8-bits per pixel model shown at 115 in FIG. 1A, consider the case where each of the pixels in frame 110 is an 8-bit gray-scale data word whose least two significant bits 115b tend to represent high frequency detail in that these LSB bits 115b each flips from 1 to 0 or vise versa with substantially greater frequency than the MSB's 115a when both are observed over a long run of pixels in background region 114. It is understood that the upper, more significant 6-bits, 115a of each pixel tend to represent more stable and less often changing information. For example, if region 114 resides in a white background region of a picture, then a statistical model of the more significant 6-bits 115a may be predicted to be close to being all ones in a long length run across background region 114 (assuming 1's represent more brightness of a white kind) and thus a prediction model can attribute a high probability to each of those bits 115a being a logic one ("1") rather than a zero ("0"). In one embodiment, one or more of the less significant and high frequency or noise content bits (i.e., 115b) are stripped out for purposes of generating hard boundary markers during an initial segmentation of the high resolution picture as will be explained below in regard to FIG. 5A. In one embodiment, one or more of the less significant and high frequency content or noise bits (i.e., 115b), but not necessarily the same number as stripped for segmentation purposes, are stripped out for purposes of forming sequentially efficiently compressible data sequences that do not include the prediction-disrupting, high frequency content or noise bits (i.e., 115b). The stripped-out bits are not compressed. Instead they are stored in a non-deflatable suitcase with other highly disordered data fragments and later back-filled into their original positions (i.e., 115b) in the original data words when the compressed versions of the remaining bits (i.e., 115a) are decompressed.

In one embodiment, one or more of the most significant bits (e.g., the MSB of field 115a) that define constant content (i.e., never changing, such as always being a "1" 100% of the time in region 114) are stripped out for purposes of forming sequentially efficiently compressible data sequences that do not include such perfectly-ordered bits. The stripped-out bits are not compressed. Instead they are forwarded to a processor (e.g., 250 of FIG. 2A) and the processor generates and stores a simple data regenerator (i.e., a cyclically repetitive sequencer) that will reproduce the stripped-out, perfectly-ordered bits when the data regenerator is later called upon to fill the predefined number of MSBs in a given segment area (e.g., 114) with the perfectly-ordered bits while compressed versions of the remaining bits (i.e., lower bits of field 115a) are decompressed. The reason for doing so is to avoid wasting compression engine resources on input data streams that do not need prediction for compressing such perfectly-ordered data sequences.

Not all image regions exhibit a homogenous coloration (i.e., almost all white, almost all red, etc.) when sampled across a long length inspection run within their respective region boundaries. For example in region 116, the pixels may be part of a repeated black and white texturizing pattern which has a first statistical model such as indicated at 117 and which is understood to be different from the mostly monochromatic statistical model indicated at 115 for region 114. The most significant bit (MSB bit 7) of statistical model 117 may be a relatively persistent "1" bit when sampled over a long run in region 116 whereas the next two more significant bits (6 and 5) may be modeled in accordance with a second statistical distribution of sub-symbols, "EE" and where a yet lower 2 bits (3 and 2) may be modeled with a third different statistical distribution "DD" over the long inspection run and finally the highest resolution, noisy bits 117b may have yet a different distribution model "cc". A statistical distribution such as "EE" may be measured in terms of what the average run of unbroken 1's and/or 0's is over a relatively long length inspection run (e.g., over a horizontal run through 300 or more consecutive pixels) and what the average bit flip frequency is over the same relatively long length inspection run. This kind of statistical analysis may be useful in automatically providing an analyzing program (not shown) running in machine 140 with a predictive understanding of the nature of region 116 and the data sequences within it (is region 116 textured or filled in with a mostly solid color or intensity of gray scale?) and how to best go about pre-processing and thereafter compressing the data of region 116. For example, a region that is textured with longs runs of just 1's followed by short runs of 0's may need a longer history buffer (of depth K as shown in FIG. 2A) than a region such as 114 where the general repeat pattern tends to be much shorter and almost monochromatic. The converse is also true. By knowing that an arbitrary picture (i.e., 112) belongs to a class of profile portraits (e.g., class 118) where the left top corner in quadrant Q1 (see 110' of FIG. 1B) tends to be an often duplicated background scene and the right top corner (e.g., the neighborhood of 116) tends to be filled with feather-like texture, the process of isolating optimally compressible segment areas, pre-processing the data therein for example with an LSB strip-out, and then compressing the remaining data can be quickened based on a priori knowledge of the probabilistic semantic nature of the imagery to be found in that part of the picture frame. This is akin to the hypothetical human observer 120 learning from practice how to better analyze portraits, except that the computer 140 learns by categorizing the portrait files on a gross scale and then by using adaptive learning and/or a knowledge database to better guess from the broad and finer categorizations what kinds of different segmentation operations and/or other pre-compression transformations may be best suited for different large areas of the portrait 110 (e.g., in the neighborhood of region 114 versus in the neighborhood of region 116). More specifically, if the portrait series 118 is known ahead of time to be a database comprising of only frontal portraits, in other words of people facing slightly forward and to the left as does the hag in example 110 then region 116 may be determined to be one that often represents scarf material in each of the so classified portraits. The area segmentation process and/or other pre-transformation operations may then be custom tailored in accordance with such knowledge-based expectations. On the other hand if all the pictures of series 110-113 are known to be profile portraits having their photograph subjects looking far and away as does the young beauty, then region 116 may be generally categorized as probably belonging to a texture akin to feathery plumes. Thus by arranging a database or a directory or a data-storing suitcase to logically and/or physically group pictures (from different origin folders) according to their semantic content and to their alikeness to one another in terms of compressibility, an optimized segmentation process and associated prediction model can then be more quickly arrived at for each general area of the picture even if not necessarily for each tiny area of a picture. (The same concept can apply to non-graphic file fragments such as those that contain text, multimedia content or telemetry content as will be made clearer when file decomposition is discussed in conjunction with FIG. 1F.)

At least for one class of embodiments, segmentation and/or decomposition of input data respectively into different segment areas (see 502-503 of FIG. 5A) or different data fragments (see 104ab of FIG. 1F) is made responsive to file type (i.e., .txt versus .bmp) or folder type or picture type (i.e., outdoor landscape versus indoor portrait). Alternatively or additionally the prediction model to be initially used and its seed (266d of FIG. 2A) is made responsive to file type or picture type (and optionally to gross area within the picture, i.e. the quadrant of 114 versus that of 116). For one class of embodiments, a directory or database is built up so as to group files from different folders (i.e., from different customer folders or different other account folders) according to their compressible alikeness. More specifically, in the example given above for the photography studio, each customer had a customer-centric computer folder created into which his or her various photography files were placed. Thus during a conventional fetch operation, the operating system will generate a file fetching navigation signal (i.e., 146a of FIG. 1B) that points into the folder of the given customer and then to a specific file in that folder. However, in accordance with one aspect of the present disclosure, the image data will no longer be stored in that customer-centric or account-number-centric folder. Instead a navigation redirecting signal (i.e., 146*b* of FIG. 1B) may be stored in that folder for redirecting the fetch operation to an alternate area (a deflated concatenation suitcase such as 162 in FIG. 1B) that stores compressed and extractable data belonging not just to the subject customer/account, but also data belonging to many other customers and/or other accounts. The data of the different customers/accounts was so grouped together in one concatenation suitcase because the in-suitcase collection defines a more efficiently compressible concatenation of data than did the original collection of data files in the one customer's original folder (account folder not shown). The redirecting signal (146*b* or 146*b*' of FIG. 1B, depending on state) may define where in the alternate area (118' or 162), an extractable version of the desired customer's data may be found. More will be explained regarding this when FIGS. 1B and 1G are detailed below.

With regard to FIG. 1A, although the examples given by pictures 110-113 (face #1 through face #N) are for superficial photographs of people's faces, it is within the contemplation of the disclosure as already mentioned to have other types of data classes for example medical records showing ultrasounds, X-rays or MRI cross sectional results taken tomographically through different body areas of large populations of hospital patients. Accordingly with such different types of medical imaging technologies certain types of data are expected to occur in different gross level parts of the frame based on the classification of the stored data. More specifically, certain bones or soft tissue structures are predictably expected to show up in one quadrant or another or in a predefined inner frame of the image frame as opposed to a peripheral shell area. This kind of information about expected content in each gross area of a file is usable in initiating decomposition of files (see FIG. 1F), in initiating segmentation of image areas (see FIG. 5A), in selecting specialized compression engines to be used (see 106A, 106B of FIG. 1F) and in initiating seeding of the engine prediction models (see 266*d*, 270 of FIG. 2A) as will become clearer from the below discussion.

It was already described above how the present disclosure is primarily directed to asymmetrical situations where a substantial amount of time free from heavy user-demands may be available for carrying out relatively slow pre-compression processes and where a relatively shorter amount of time may be available for carrying out a corresponding post-decompression inverse transformation process. More specifically, many systems tend to have bursts of peak access demand and also lulls in application use. If density of user-initiated demand for storage throughput is mapped out across time it will often show up as peaks and troughs (valleys) in a graph 161 (FIG. 1A). There may be routine periods during the average business day (i.e. morning) when users 145 or their associated computers 144 are storing large amounts of data into a shared storage data bank 160 by way of say, a shared network 150 such as one that provides network appliance storage services (NAS services). There may be routine other periods during the average business day (i.e. afternoons) when users 145 and/or their associated computers 144 are selectively retrieving and analyzing small parts of the voluminous data that was earlier stored en mass into the shared storage data bank 160. There may be opportunistic other times (slack times) in between where parts or the whole of the shared storage data bank 160 are not being heavily tasked with storing voluminous amounts of data or retrieving such data for serving to application programs. Some of that slack time may be used for data backup operations. However it can be advantageous to instead use some of that slack time for data compression activities (providing the BPC efficiency of the compression is large enough) because the compressed data can then be backed up in less time than can non-compressed data and the compressed data can be retrieved from spinning media or the like for application use in less time than can non-compressed data. Thus some of the available slack time may be more beneficially used for performing compression or pre-compression analysis and pre-compression transformation rather than for backup storage of raw or uncompressed data.

In accordance with the present disclosure, an automated data processing machine like 140 is operatively coupled to a mass storage bank (160) by way of an appropriate connection (151) so that machine 140 can opportunistically spot the demand slack times (e.g., access density valleys 161*a*) of the storage bank (160) and use the found slack times for opportunistically grouping, ordering or otherwise pre-transforming stored files and compressing alike ones of the data files in storage bank 160 or opportunistically parsing and decomposing files into concatenated collections of alike file fragments and thereafter ordering and compressing alike ones of the file fragments into respective storage areas within storage bank 160 so as to thereby significantly reduce the amount of storage space consumed by such data files or their corresponding data fragments.

Although the introductory discussion treats the on-network, compression and decompression machine 140 as if it might be a single computer (i.e., one having a single microprocessor or a single CPU), it is to be understood that the descriptions provided herein of the novel systems and methods can be viewed as parts of alike and parallel wise executing threads and/or parts of alike and parallel wise executing parallel hardware cores. In other words, different cores and/or threads can be assigned simultaneous tasks of watching different parts of one or more mass storage systems for opportunistic and/or expected slack times. The various threads and/or cores can be alternatively or additionally assigned simultaneous tasks of categorizing different files stored in the mass storage system(s) 160 where the categorizing for example determines if the files contain profile portraits or frontal portraits; X-rays of fractured femurs or MRI scans of soft tissue injuries, etc. The various threads and/or cores can be alternatively or additionally assigned simultaneous tasks of parsing those categorized files intelligently or unintelligently into file fragments (into fixed quadrants or into flexibly contoured segment areas). The various threads and/or cores can be assigned simultaneous tasks of beginning to subdivide the file or fragments into list linked groups of quadrants or segment areas, into modifying segment boundaries if such is advantageous; and so forth as shall be discussed in conjunction with FIGS. 1B and 5D.

It is to be understood in the course of these discussions that machine-executable instruction signals for causing one or more data processing machines 140 (whether single CPU or multi-core) to carry out these various steps may be stored on a computer readable media 143 such as a magnetic hard disk or an optical disc or in another type of appropriate computer readable media; and/or that some or all of such machine instructing signals 143 may be physically downloaded into the data processing machine 140 as instructing signals transmitted over a digital network or by way of other means. Similar machine instructing signals may be loaded into an application executing machine such as the user's workstation 144 for allowing that machine 144 to decompress (and/or inverse transform) data served to it by server 140.

FIG. 1G provides a flow chart of an opportunistic data compaction and decompression algorithm 170 in accordance with the disclosure. Machine execution of the algorithm may start at step 171 and such entry may be in the form of a single thread entry into the illustrated execution flow or in the form of a plurality of entries made at same or different times by plural execution threads executing for example on different ones of parallel data processors (different ones of programmably configurable processing cores). A first thread may enter the flow via entry path 171a while a second enters via path 171b and so on. Although plural thread entries are shown only for starting step 171, it is to be understood that plural thread entry points may be provided elsewhere in the flow such as at one or more of steps 175, 177, 178, 181, and 185 as will become apparent from the below. Once a thread entry is invoked at starting step 171, the thread may begin executing a watching process 172 that observes the behavior of an assigned part or the whole of a given data storage means such a nonvolatile data storing bank (i.e. 160 of FIG. 1A). The watching process 172 analyzes the file access demand patterns of its assigned storage means or storage area and identifies from such analysis (e.g., statistical time versus demanded access density histories), definite or probable time slots that are expected to have throughput slack and therefore may be utilized on an opportunistic basis for deploying a relatively slow pre-compression transformation process followed by a corresponding compressing algorithm as shall described for subsequent steps 174-178. As indicated, the slow compression-related processing steps 174-178 or parts thereof may be delegated to different threads rather than being all executed by the same thread or by the same processor(s) that perform the access pattern watching process 172.

When a time slot with expected slack presents itself due to scheduling or opportunistically, where the analysis based expectation is that within that time slot, data throughput bandwidth will be available on the storage device for pre-processing and/or compressing one or more files or file fragments or subfragments without substantially interfering with user-initiated demand for remaining portions of the finite throughput bandwidth, entry is made into step 174. In step 174, an original file or an original file (sub)fragment is fetched if it is determined that the identified file or (sub)fragment is not currently in use and that it will probably not be requested for use by an external application program for a length of time sufficient to complete at least one independently severable part of the compression-related process steps 175-178. Reference here to a file fragment or subfragment is not intended to be limiting. A fetched file, fragment or a subfragment thereof can be constituted by any sized block of data (i.e., one whose size is other than at or just below (i.e., 1% below) the File System Block (FSB) size of the storage subsystem (e.g., 4 KB or 128 KB). In the case where a fetched object has a size at or just below one times the FSB size of the storage subsystem; mere packing into a suitcase will not provide much in the way of FSB slack reduction and due to diminishing returns, it may not make practical sense to employ the next described analysis steps and the subsequent responsive assignment of the analyzed object to one or more classes of pre-compression treatments such as: decomposition, fragmentation, routing of the original object or its fragments to different suitcases and selective applying of different pre-compression transformations prior to compression as well as the subsequent inverse, de-compression and de-transformation steps. In general, it will make sense to pack very small files or small file (sub)fragment (substantially less than one FSB in size) into suitcases because that alone reduces storage space consumption due to the FSB slack problem. In one class of embodiments, alike files and/or alike file (sub)fragments are identified by automated machine operations as being alike to one another and the so-identified as being alike objects are packed into respective concatenation suitcases that are dedicated to receiving that class of alike objects. In one embodiment, the suitcases are each sized to store at least 1 MegaByte (1,026 Kbytes) of uncompressed or raw data. Different values of suitcase size may be used depending on application and on storage specifics (for example based on what the value is of the standard FSB size of the storage bank). The 1 MB suitcase can store about 32 files or 32 (sub)fragments of average size of 32 KB apiece. Suitcase size can be selected according to acceptable decompression and reconstitution latency times (T2) as shall become clearer below.

Packing and accumulation of alike files or of alike file (sub)fragments into respective suitcases begins in step 175 of FIG. 1G. Various attributes (i.e., file name, file headers, symbol statistics, etc.) of the fetched and uncompressed file data (e.g., original file data) or (sub)fragment of uncompressed data are first analyzed by automated machine means so as to classify each fetched object as calling for one form of pre-compression treatment or another (see router 204 of FIG. 2C) and/or for one form or another of compression (see 106a, 106b of FIG. 1F). After analysis and optional decomposition (see 103 of FIG. 1F) the classified wholes or fragmented parts are responsively routed into different suitcases according to their classifications. Data packed into certain ones of the suitcases may be optionally pre-transformed so as to thereby create or define (or re-define) one or more data-filled suitcases (windows) whose defined and/or transformed data (i.e. packed and/or reordered and/or bit-stripped sequence of data) is caused to be more sequentially efficiently compressible than is the data of the original file or file (sub)fragment when in-taken by itself by a prediction-based compressor with nothing preceding the one lone file or file fragment. In cases where a fetched file or file (sub)fragment is found to be pre-compressed by means of a conventional compression algorithm (say JPEG or PDF), the fetched file or (sub)fragment is first decompressed (re inflated) with a corresponding conventional decompression algorithm (e.g., JPEG decompression or PDF rendition) in order to recreate the raw underlying data and thus expose the richer amount of information embedded therein for analysis and determination as which suitcase it may best be packed into. It has been found that analysis and compression of already-compressed data is usually a waste of time because vital pattern information is hidden by the entropy increasing function of the conventional compression process. Thus, when the discussion here mentions the information of the original file or (sub)fragment, what is intended here is the information represented by the file data at the time of data origination or at the time of reconstitution from a conventionally compressed form rather than data that has had its entropy increased (and/or the natural continuum of physical attribute information in the original data destroyed) by encoding with an external compression algorithm (e.g., JPEG, PDF, ZIP, etc.).

Pre-compression placement and/or optional transformation of original file data or fragment data may entail a number of different steps including one or more of: (1) identification of compressibly alike files or file (sub)fragments and initial targeting towards respective classes of suitcases, (2) possible brute force or intelligent subdividing of files or file fragments respectively into smaller fragments or smaller sub-fragments for migration into different subclasses of suitcases; (3) physical grouping or logical linking of such alike files or file (sub)fragments into grouped-together subsets inside the suitcases; (4) re-sequencing or queuing of files or file (sub)fragments within each grouped-together subset (within each destination suitcase); and (5) intercept management. Reference is now made to FIG. 1B where these concepts will be explored in greater detail. Bracket symbol 101 is to be understood as representing one or more of the machine-implemented steps of: scanning through a storage space and identifying files that are likely to be alike files by means of for example, file name classification or registry association; scanning through a storage space and identifying files that are likely to be alike files by statistically analyzing frequency of symbol occurrences in the scanned files and identifying symbol occurrence histograms that are most alike to one another; scanning through a storage space and identifying file fragments (file subsections) that are likely to be alike fragments by statistically analyzing frequency of symbol occurrences in the scanned fragments and identifying symbol occurrence histograms of fragments that are most alike to one another; identifying the boundaries of the compressibly alike file (sub)fragments; subdividing files or file fragments and decomposing them respectively into smaller fragments or subfragments by means of intelligently variable partitioning and/or fixed partitioning patterns and targeting them for placement in different suitcases by means of physical grouping or logical linking of such alike files or alike file (sub)fragments into corresponding subsets; and re-sequencing or changing the queuing order of the grouped together files or file (sub)fragments within each subset. Intercept management is represented by vectors 146a-146d as shall be detailed shortly. In brief, the operating system (OS) will provide an original navigation or directing vector 146a pointing to the original file (i.e., FileName_2.bmp). The whole or a fragment of the original file will be copied into a spot inside a regrouping and deslacking area (i.e., inside suitcase 118'). At that point, the original directing vector 146a will be replaced by one or more first re-directing vectors 146b pointing to the new location in the regrouping area (i.e., in the not-yet-deflated suitcase 118'). In the case where the original file (i.e., FileName_2.bmp) is broken up into fragments and/or the fragments are further broken up into subfragments, the first re-directing vectors 146b may take the form of a re-assembly tree structure that indicates how the fragments are to be re-united so as to reconstitute the original whole of the file in its original form by use of the split apart fragments. In one embodiment, the first re-directing vector(s) 146b each includes a flag indicating it is pointing to inflated (uncompressed) data. After compression takes place in accordance with the disclosure, the first re-directing vector(s) 146b is/are replaced by second re-directing vector(s) 146b' pointing to storage area holding compressed data (e.g., deflated suitcase 162). In one embodiment, the second re-directing vector(s) 146b' each includes a flag indicating it is pointing to deflated (compressed) data.

The top row of pictures in FIG. 1B represent three digitized original portraits 110', 111' and 112' which a human observer can see to be fairly alike to one another although they do have minor differences. Portrait 111' does not include the flaring forehead feather seen in quadrant Q1 of 110'. The same forehead feather is much smaller in portrait 112' and the shoulder covering coat is spotted. The showing here of files 110', 111' and 112' as being grouped together in the drawing does not mean that they are originally so grouped together either physically or by direct logical linkage in the storage bank 160 due to mere application processing. On occasion, luck may have it that a small number of compressibly alike files are grouped together (i.e., in a same lowest level folder) by mere application processing. However, as a more general rule the files are originally dispersed among a large number of differently named, lowest level folders (e.g., customer_1, customer_2, patient_3, etc.) Thus in the more general case, the compressibly alike files are scattered across a large plurality of unrelated folders and their compressible alikeness is not expressly indicated or implicitly apparent. In accordance with the disclosure, files in different folders are automatically analyzed and categorized in terms of their symbol sequencing statistics and/or the files are automatically and explicitly identified as being compressibly alike to one another. This categorization and/or identifying process creates a situation where compressibly alike files can be more easily grouped with one another rather than being logically dispersed among many different folders akin to needles spread in a haystack.

As used herein, when the term, "predictively-alike" or "compressibly alike" is applied to plural files, plural fragments or plural subfragments it means that an adaptive or nonadaptive prediction model within a compression engine can be pre-trained or can learn (can become adaptively trained) to efficiently predict symbol sequences within the predictively-alike files, fragments or subfragments. For example, while compressing a first of an unbroken sequence of compressibly alike files (or alike fragments or subfragments), an adaptive compression engine can use accumulated history to train its internal prediction model (i.e., 270 of FIG. 2A) to better predict symbol sequences found when progressing upstream along the data stream formed by an unbroken sequence of compressibly alike data entities (files, fragments or subfragments). A prediction model developed (built) from trying to compress a first of the compressibly alike data entities in the unbroken sequence can be used to more efficiently compress a consecutively following second entity in the unbroken sequence, where a same amount of improved compression efficiency would not have been attained during compression of the second file (or second file (sub)fragment) if the compression engine had restarted afresh (with no predictively-alike history) when trying to compress the second file (or second file fragment) alone.

While an average human can see that two portraits e.g., 111'-112' look alike (if the portraits are designed for simple looking at by an untrained observer), a conventional computer does not have the same powers of observation and recognition. Moreover, an average human does not have innate powers for seeing that two similarly looking files might not be compressibly alike to one another even though they are perceived as being alike. Similar gross appearance may not necessarily correlate with being compressibly alike. Moreover, an average human does not have innate powers for quickly comparing technically challenging graphics such as biological sectional slices produced by an MRI scanner for example.

According to the present disclosure, a variety of machine-implemented techniques may be used for automatically or semi-automatically determining which images among a large plurality of images, where that large plurality of may contain images 110', 111' and 112'; should be identified (classified) as being compressibly alike and then grouped together (101) as such either physically and/or by way of logical linkage. Firstly, it is observed that similar files tend to have similar directory attributes such as being of similar file size (or fragment size) and having similar registry extensions (e.g., .doc, xls, .bmp, .jpg) at the ends of their filenames. Secondly, it is observed that similar files tend to be stored under a common, top level folder such as "All_Studio_Portrait_Shots" or "All_CAT_scans_of lungs". Large professional institutions (e.g., hospitals) often impose certain rules on the naming of top level folders so that everyone in the institution can locate at least the class of interrelated files, if not the specific ones shot on a given day for a given client or patient. (One may have to know the name of a specific customer/patient or a private ID code assigned to that customer/patient in order to locate a lower level folder holding images belonging to that customer/patient.) Thirdly, similar files tend to have similar meta data stored in their file headers that indicate further aspects relating to the substantive file data, such as what the H×V resolution of a contained image is (i.e., 1024 pixels across by 840 down). Fourthly, a human operator (145 of FIG. 1A) may be used to manually indicate to machine 140 that portraits 110', 111' and 112' are to be deemed as examples of files that are compressibly alike to one another for the class of files that 110'-1112' belong to. This manually-indicated state of compressible alikeness may have been determined ahead of time on the basis of detailed analysis of the statistical alikeness of pixel sequences (or other symbol sequences) found inside the three exemplary or template files. Once the example is established, the machine 140 may then learn from such an exemplary showing of alike files, and the machine may then automatically derive a search strategy for searching through a much larger collection of files looking for those that satisfy a predefined match condition involving use of filenames and/or of folder names appearing in the hierarchy of top level file folders and/or of file attributes appearing in an operating system directory and/or of meta data held in corresponding file headers and/or statistical alikeness of symbol statistics (and/or supersymbol statistics) found to exists between the files, fragments or subfragments. The predefined match condition may look for certain signature values that indicate a high probability that portraits 110', 111' and 112' or others are compressibly alike to one another and thus should be identified (step 101) as being compressibly alike to one another. In terms of an example, machine 140 may automatically generate a condition based rule for inclusion in a knowledge data base such as:

IF filename contains *"profile"* AND pathname contains *"studio_portraits"* AND file.header includes "gender=female" AND file.size≧25 KB AND file.size≦35 KB THEN assign pathname/filename to compression class named "profiles in feather courage".

In this pseudo code, the embracing asterisks indicate the embraced character string can be part of a longer string. If the machine 140 does not use artificial intelligence techniques to learn this classification, the rule may be alternatively coded manually into the knowledge base by a skilled computer programmer. As a consequence, large numbers of compressibly alike files or files that have high likelihood of being predictively-alike may be automatically identified as being such based on a few process-seeding examples.

Suppose however that a new file enters the system with a filename and/or pathname that does not match any pre-existing conditional rule in the machine's knowledge base. In such a case, a set of reference or sampler suitcases may be pre-established, each containing a small plurality of model files or model fragments exemplifying a particular one of plural and distinct compressibility classes. One suitcase (see briefly pictorial representation 118") may for example contain three examples of female faces looking to the left and wearing feathered hats. A second sampler suitcase may contain three examples of male faces looking to the right and wearing cowboy hats. A third sampler suitcase may contain three examples of one story ranch houses. In one embodiment, a machine-implemented method for classifying a file of unknown compression type includes the steps of: (1) measuring or noting initial sizes of deflated ones of two or more pre-created sampler suitcases; (2) if not yet available in inflated form, inflating the sampler suitcases and concatenating a copy of the file of unknown compression type to the back (far end) of each of the two or more inflated sampler suitcases; (3) deflating the appended-to sampler suitcases; (4) measuring or noting the post-append sizes of the deflated two or more sampler suitcases; (5) identifying a one of the post-append deflated sampler suitcases whose size increased least; and (6) assigning the file of unknown type to the class of the identified sampler suitcase. A new conditional matching rule may then be devised after the new file has been identified as most closely belonging to a pre-established class of compressibly alike other files. Alternatively, after a few files similar to the one classified with this append-deflate-and-measure method have been similarly classified, a human programmer may devise a new classification rule based on cross correlations between the filenames and/or pathnames and/or header details and/or directory attributes of the newly added files. In one embodiment, where normal suitcases are 1 MB in size apiece, the sampler suitcases are substantially smaller, for example, about 128 KB each in size (so as to accommodate 3 model files of about 32 KB size each and a new, to-be-typed file of about the same size).

Referring to the second row (118') of concatenated portraits in FIG. 1B, here is one reason why it is desirable to concatenate or otherwise group together compressibly alike files but not intermix dissimilar files (or dissimilar file fragments) into the group. In accordance with one aspect of the disclosure, an adaptive compression engine begins a compression run at a front line 118.0 of a filled concatenation suitcase 118'. The engine compresses data encountered along the engine's sequential walk (i.e., 147-147.3) through the suitcase as the walk progresses towards the back end (right end) 118.3 of the suitcase. As the compression engine progresses towards the back 118.3 of the filled suitcase, the engine learns from or becomes trained by the input data it encountered earlier in its walk through the suitcase. If the last file (i.e., 112') in the suitcase is very similar to earlier ones (i.e., 110', 111'), then compression of the last file will tend to be substantially more efficient than if that last file had been compressed afresh and alone. This is so because the compression engine will have been appropriately trained by the earlier encountered files to efficiently predict the symbol sequences found in the last and predictively alike file. On the other hand, if the last file in the suitcase is substantially dissimilar to earlier ones (say it's a picture of a house rather than a portrait of a young lady wearing a feathered cap), then compression of the last file will tend to be substantially inefficient because the compression engine will have been inappropriately trained by the earlier encountered files to wrongly predict the symbol sequences to be expected in the last file. Post-compression suitcase size will then increase as a result of the last added-on file being a compressibly dissimilar file. That is why the append-deflate-and-measure method generally works well for classifying a new file of unknown category as being compressibly alike or unalike to files already found within the system.

There is another reason why packing compressibly alike files or (sub)fragments into a concatenation suitcase can help to improve compression efficiency (as measured in BPC). As mentioned above, many operating systems (OS's) group their storage data into standard sized file storage blocks when storing the data on a magnetic hard disk or tape for example. If the nominal storage block size in a given system is 4 KiloBytes (4 KB), then all files will have sizes that are integer multiples of 4 KB. Each 1 KB file will be stored as a 4 KB storage block that is 75% empty. Each 8.1 KB file will be stored as a 12 KB storage block that is 32.5% empty and so on. Even if a compression algorithm succeeds in deflating a 12 KB file down to 8.1 KB (a 32.5% size reduction), the result will be stored as a 12 KB file that is 32.5% empty. Conventional compression algorithms are generally designed to perform their job independently of operating system considerations. Once a compression algorithm succeeds in shrinking a 12 KB file down to say, 8.1 KB, the algorithm simply hands its result off to the OS for storage and washes its hands of further responsibility until time comes for decompressing the file. The OS (or file server) then increases the consumed storage size due to the file storage blocking process. Use of the concatenation suitcase approach reduces storage efficiency losses due to storage blocking. In one embodiment, storage size is reduced for a storage bank driven by an operating system (OS) having a predefined FSB size (i.e., 4 KB, 128 KB) by a method comprising: (a) automatically searching through the storage bank for files having a size of about 10 times the system FSB size or less; (b) automatically moving files found by said searching into one or more concatenation suitcases each of a size equal to or greater than about 100 times the file storage block size (FSB size); and (c) automatically redirecting fetch requests for the moved files to their respective new locations in the one or more concatenation suitcases. This method takes advantage of the navigation redirecting subsystem (e.g., 146a-146d of FIG. 1B) already present in the suitcase packing system. This method works because storage blocking slack for files of size 10 times the FSB size or less can be 10% or more. By concatenating many such small files into concatenation suitcases, a storage reduction of about 10% or better is automatically obtained. Then, if the suitcase can be efficiently compressed because sequentially efficiently compressible files were packed in sequentially efficiently compressible order into the suitcase, a yet greater reduction in storage requirements can be obtained for the underlying information. Note that in the case where a concatenation suitcase is 1 MegaByte or larger in size and the file storage block size is 4 KB, the suitcase size is over 200 times the FSB size.

Given the notion that an adaptive compression engine in accordance with the disclosure begins a compression run at a front line 118.0 of a filled-in but not yet deflated suitcase 118' and it compresses data encountered therein while sequentially advancing (walking) through the suitcase towards the back end (far end) 118.3; a counterpart to that is this: An adaptive Decompression engine in accordance with the disclosure begins a Decompression run at the front line 118.0 of an empty or only partially filled concatenation suitcase 118'\* and converts encoded data received from a corresponding compressed frame 162 into Decompressed data for fill-in into empty spots in the inflated but not yet fully rendered suitcase 118'\* while walking the same sequential walk (i.e., **147\*-147.3\*) taken by its counterpart compressing engine. As a result, the contents of a last-in-a-suitcase file (i.e., 112') are filled in (rendered) last and the contents of a first-in-a-suitcase file (i.e., 110') are filled in first. Thus, a larger latency for decompressing will be seen for a file or file fragment that appears later in a concatenation suitcase than the decompress latency seen for a file or file fragment that appears earlier (more to the front 118.0) in a concatenation suitcase. In accordance with another aspect of the disclosure, a compression supervising computer (i.e., 140) automatically re-sequences or queues uncompressed files or file (sub)fragments so that those that are expected to be accessed more frequently by users (145) in the near future (e.g., in the next 48 hours) appear closer to the front 118.0 of the uncompressed suitcase in which they are stored and so that those of the packed-in files or file (sub)fragments that are expected to be accessed less frequently by users appear further away from the front 118.0** (appear deeper into the suitcase). Automated methods for determining which files are expected to be accessed more frequently by users in the near future may include ones that look at the time of initial file creation and the history of prior fetches by users or application programs. For example, in the cases of the photography studio or medical imaging lab described above, images that are created recently (i.e., in the last 24 hours) are expected to be more frequently accessed in the near future than images created many years ago. In the case of medical imaging for certain kinds chronic diseases (i.e., lumps, tumors, etc.), there may be a typical waiting period between when X-rays, sonograms or other imagery is taken for comparison against earlier ones. Accordingly the automated shuffling of related files forward or backwards in their relative positions within a concatenation suitcase may be functions of patient appointment times, disease type, and dates when the earlier images were originally snapped as well as when more recent ones were snapped. At the time of a patient appointment, a doctor may want to quickly compare the most recently taken MRI or CAT scan against one taken 3 months ago to see if a suspect tumor has grown. A system in accordance with the disclosure may be custom tailored for example to shuffle the files or file fragments of patients having appointments in the next 48 hours for example or of patients whose X-rays or other medical imagery were taken in the last 48 hours to the fronts of their respective suitcases even for suitcases containing imagery that was created a few years ago. In this way the related imagery of the subset of patients now being seen by the doctor will be moved toward the fronts of their concatenation suitcases (during demand slack times) and will have shorter fetch and decompress latencies when finally demanded than the compressed files of patients who are not now being seen by the doctor or are not expected to be now seen by the doctor.

Aside from re-sequencing the positions of files (or file (sub)fragments) in a suitcase so as to provide for shorter decompression and fetch times for soon-to-be demanded files, the compression supervising computer (i.e., 140) may elect to re-sequence archived files (those that are not expected to be fetched soon) into a better order when time permits so as to improve compression efficiency. Although a group of files (or file fragments) may be deemed to be compressibly alike, nonetheless there may be one sequence of ordering for the grouped files that provides greater compression efficiency than a currently established sequence. For example, it is desirable in accordance with the disclosure for the training of an adaptive compression engine to be one that progresses smoothly (without disruption) so that training from a last run-through data area does not reduce compression efficiency for a next to be compressed data area, but rather either enhances or at least keeps as substantially undiminished, the average compression efficiency (as measured in BPC) observed in the very next run-through data area. In accordance with the disclosure, during slack times, a compression supervising computer (i.e., 140) inflates contents of a given suitcase that contains archive files (those not expected to be demanded in the near term), re-sequences the order of the files (or file fragments) contained in the inflated copy on a trial and error basis, deflates that copy and compares its size to the size of the original deflated suitcase. If the change in size is an improvement that exceeds a predefined threshold (i.e., 3% better, 6% better, 9% better, etc.), the supervising computer substitutes the newer sequence in place of the older one.

When files or file fragments are shuffled into or within concatenation suitcases, the compression supervising computer (i.e., 140) often needs to additionally create or modify intercept redirecting vectors associated with those moved-into or within-suitcase files or fragments. FIG. 1B shows the third portrait 112' as having an original access vector 146a which the operating system (and/or user 145) routinely uses for referencing the nonvolatile storage space of original portrait 112' (e.g., . . . /customer.no.6851/sitting_profile/FileName_2.bmp). However, at the start of a compression operation, the data of the third portrait 112' will be moved out of its original folder and into an inflated suitcase 118' and concatenated behind earlier ones of packed-in files (110', 111'). Since file 112' is no longer in its original place of residence, a first redirecting vector 146b is automatically generated to point to the start 118.2 in the inflated suitcase 118' where the still not-yet-compressed data of original file 112' now resides. A logical link 146c is automatically recorded for associating the original access vector 146a with the first redirecting vector 146b. The logical link may take the form of a shortcut recorded into the directory entry of the original file 112' and pointing to the new redirecting vector 146b. In one embodiment, formation of the logical link 146c includes the generating of a hash 146d of the original access vector 146a (i.e., a hash of the original operating system path definition or OSPD). The hash is substantially shorter in length than the original access vector 146a and the hash 146d is recorded into a lookup table (not shown) that stores the new redirecting vector 146b and indicates it to be logical linked to the hash 146d. Then as routine (normal) access vectors like 146a are intercepted, hashes of these are automatically generated and compared to hashes stored in the redirection lookup table. If a match is detected, it is then determined whether the first redirecting vector 146b should be used in place of the intercepted normal vector 146a. If yes, access is redirected to the in-suitcase start 118.2 of the not-yet-compressed data of original file 112'. Each time the compression supervising computer (i.e., 140) decides to change the location within the suitcase 118' of the not-yet-compressed data of an original file like 112' to a different place (for example so as to reduce the decompressing fetch latency of the data by moving it closer to the front line 118.0 or to improve compression efficiency), the supervising computer (i.e., 140) also automatically modifies the first redirecting vector 146b to indicate the new start (and end and/or length) of the moved in-suitcase version 118.2-118.3 of original file 112'.

It was noted that concatenation of alike full files in a suitcase (i.e., 118') or concatenation of alike fragments in a suitcase helps to improve compression efficiency due to the sameness or closeness of data patternings (symbol sequences, supersymbol sequences, etc.) found in the compressibly alike files or fragments. By the same token, various files that are compressibly alike may nonetheless be subdivided into finer and even more compressibly alike file fragments or subfragments and those more alike file (sub)fragments can be repacked (concatenated) into respective suitcases having finer data-alikeness requirements so as to provide even greater compression efficiency. By way of example, it may be noted that the second quadrants (Q2) of each of portraits 110', 111' and 112' are more alike to each other than are the third quadrants (Q3) of each of the portraits to each other because in this example all of the ladies wore the same feathery plume whereas specific facial features of the ladies in Q3 may differ somewhat. Accordingly, if only the second quadrants (Q2) of each of portraits 110', 111', 112' were packed one immediately after the other (concatenated) into a given suitcase, and if yet even more such Q2 quadrants of alike profile portraits were further packed into the same suitcase so as to essentially fill up the suitcase, then an even greater level of compaction and compression efficiency might be achieved than would have been by packing the full image files one after the next into a concatenation suitcase. This is so because the smaller fragments can more fully fill up the last File System Block (FSB) in the suitcase and because the smaller fragments are even more compressibly alike to one another than were the larger data chunks from which they were broken off of. Upon decompression, the file fragments (e.g., Q1-Q4) often need to be reassembled (see step 188 of FIG. 1G) so as to reconstitute the full original file. Sometimes a user needs only a small part of a file, for example if it is a map and the user has already elected to zoom in on a specific region. In the latter case, the full file need not be reconstituted. Only those (sub)fragments that formed the zoomed-in part are needed. Thus partitioning into quadrants or other types of subframes within the original image frames can provide numerous benefits, among them being the benefits of enhanced compressible-alikeness and the ability to zoom into specific areas of an image without having to re-inflate the entirety of the image. Although FIG. 1B shows brute force subdivision of image frame 110' into side-by-side quadrants Q1-Q4, it is within the contemplation of the disclosure to subdivide image frames in many other ways, for example, into top and bottom halves (i.e., the sky above and the ground below), into a central polygon where a person's face goes and a surrounding polygon where duplicate scenery (i.e., photography backdrop) appears, into areas that are dedicated to certain flows of text and other areas that are dedicated to certain types of graphics, etc.

In cases where files are fragmented or where first level fragments are subdivided into even smaller subfragments, the first redirecting vector 146b may take the form of a tree structure of ever increasing numbers of subdivisions and thus having plural redirecting vectors pointing to the various (sub) fragments and also indicating how to put them back together again for reassembling the whole or a zoomed-in part of the original file or file fragment.

In one class of embodiments, the pre-transformation (of step 175 in FIG. 1G) includes rearranging the sequence in which the in-suitcase objects (e.g., undeflated and classified files or their undeflated and classified fragments) or segments thereof will be presented to a compression engine so that the rearranged sequence will represent something other than a conventional left-to-right TV-raster scan (see 336' of FIG. 3) through the address space of the original file or fragment. Details regarding one such process of segmenting an object (i.e., an image frame) and rearranging the order in which segments are presented to a compressor will be provided in association with FIGS. 5A-5D. Suffice it for now to say that the pre-transformation operation is selected such that a quick and deterministic inverse transformation will be possible when a subsequent reconstitution step 185 is later carried out for recreating the original data object (i.e., image frame). In one embodiment, one or more trial and error compression runs are executed during step 175 (FIG. 1G) and the results of these trial compression runs are used to modify the boundaries of segments and/or the order in which segments will be presented so that the pre-transformed data is more efficiently compressible than is the original data object. (In the embodiments shown in FIGS. 5A-5D, modification of the data order re-sequencing operations includes feedback-driven modifications of boundaries of so-called segment areas where the feedback urges the results towards improved compression efficiency and/or towards simplified boundary definitions—see approximating curve 573 of FIG. 5D.) The one or more trial and error compression runs that are executed during step 175 can provide additional information that is learned-by-experience about the compressibility characteristics of the data found in the pre-transformed data object(s) and what types of compression approaches (i.e., 106a versus 106b of FIG. 1F) may be best suited for compressing that pre-transformed object more efficiently. This learned-by-experience information is saved in step 175 for use in next step 177, where a final compression run will be performed after a sufficient number of trial and error runs have been attempted and good compression solution has been found.

After the pre-transformation process(es) to be used on the original data object is/are selected or refined on the basis of the one or more trial and error attempts in step 175 and comparisons are made of the compression efficiencies obtained by trial and error attempts using different compression solutions (which attempts can be time consuming), the selected pre-transformation algorithm(s) and compress compression algorithm (i.e., 106a, 106b) is/are applied, the resulting deflated data is saved in a definite location within the deflated version of its suitcase and a new redirecting vector (146b') is saved pointing into the deflated version. Additionally, recipe information is saved defining what one or more inverse transformations are to be applied in step 185. The corresponding data compaction algorithm that will execute in step 177 is selected so as to provide a good compromise between compression efficiency and inverse transformation speed (which controls how short T2 can be guaranteed to be). In one embodiment, a predefined time limit for trial and error experimentation in step 175 is set so as to prevent trial and error attempts in step 175 from continuing forever and thus elongating T1 to unacceptable lengths. In one embodiment, a predefined maximum number of trials is set for limiting how many trial and error attempts may be carried out in step 175. The time and number limits may overlap such that step 175 is halted when either limit is hit. In one embodiment, a predefined acceptable minimum efficiency goal (measured in BPC) is set for limiting how many trial and error attempts may be carried out in step 175 so that once an acceptable and predefined, minimum efficiency goal is reached or surpassed within a first time period and/or after the number of runs reaches the runs constraint, the number of further trial and error attempts for improving over that minimum compression efficiency goal is limited by a second time and/or number of runs constraint and/or by a predefined maximum compression efficiency goal. With regard to the last point, it is assumed that above that predefined maximum compression efficiency goal, a law of significantly diminishing returns is encountered for the given application. Thus, after the solutions-seeking, trial and error runs halt in step 175 for any of a number of possible reasons, control is passed to step 177. In step 177 the finally pre-transformed file or (sub)fragment of data is compressed with use of the compression algorithm picked in step 175 so as to thereby generate one or more compressed suitcases of data during one or more opportunistic time slots as they present themselves in a variable storage-access system such as system 100 of FIG. 1A. In one embodiment, after compression of a filled concatenation suitcase (i.e., 162 of FIG. 1B) is finished, the first re-direction vectors (i.e., 146b) for objects in the suitcase are replaced by a second re-direction vectors (i.e., 146b') pointing to the revised locations in the deflated and thus shortened suitcase (162).

At step 178 (FIG. 1G), the deflated suitcase(s) are stored into a non-volatile storage means (i.e. 160) ultimately for taking the place of the original file or original file fragment. In one embodiment, the substitute compressed version is marked as constituting a substitute compressed version for the original and a hash-based intercept means is established so that the compressed version rather than the suitcased original will be fetched when a reference to the original is made for purpose of fetching the original data. In one embodiment when a fully or partially uncompressed file is to be replaced by a more compressed and thus more compact file; or when one or more uncompressed data objects are to be replaced in storage by compressed and thus more compact data objects, a file directory or subdirectory is modified to reference the one or more compressed objects and the data of the original, less compressed object is removed from the non-volatile storage means so as to thereby reduce the amount of storage consumed for representing the underlying information.

Steps 171 through 178 continue to be executed on various files or (sub)fragments as long as opportunistic time slots present themselves and as long as the uncompressed data of a compressible file or fragment is not subject to demanded use by a system user 145 and/or the user's machine (i.e. 144 of FIG. 1A) in the near term. It is understood that some files (e.g., OS kernel files) may be flagged as off-limits to the compression attempts 171-178 and as such, the compression attempting machine means 171-178 will leave such off-limits files alone. Loop-back path 179 is intended to represent the freeing up of processing bandwidth for use by any one or more of machine-means (140) that implement steps 171-178 after a given file or suitcase has been compressed. For example, a first data processing core that is already configured for performing step 175 and has finished its trial and error, solution-seeking runs for a first frame of original data and has handed off responsibility for finally compressing that data (step 177) to another data processing core, may pick up a next frame of original data for analysis and pre-transformation. Similarly, a second data processing core that is already configured for performing step 177 and has finished its final compressing of a first frame of pre-transformed data and has handed off responsibility for storing the final compression results (step 178) to another data processing core, may pick up a next frame of pre-transformed data (or a next undeflated suitcase) for final compressing thereof.

Referring to transition line 180 of FIG. 1G, at the time of; or even slightly before the time that a user (145) or user's machine (144) requests access to specific data in a given file or frame of storage bank 160, if the requested file and/or requested frame is tagged as having its information contained as compressed data (data compressed by step 177), control is transferred to step 181. Otherwise control is passed to step 189. In step 181 the pre-transformed and compressed data is fetched at or before the time the original data is requested by the corresponding user (145) or machine (144). In one embodiment, if the request for the data is predictable, fetching step 181 may be proactively performed slightly before the expected time of user request for that data.

In subsequent step 183 the fetched frame of data is quickly decompressed using a decompression process that complements the compression process used in step 177.

In step 185 the decompressed data is subjected to one or more inverse transform processes that complement the finalized pre-compression transform process(es) used in step 175. The inverse transform process recreates the original data of the frame. Of importance, the inverse transform process is generally much faster than the forward transformation of step 175 because no trial and error runs are needed. The specific steps of the inverse transform process are known and prerecorded as part of the step (178) of recording the compressed data into storage. One of the trial and error balancing acts performed in step 175 is that of trying to minimize the time that will be later taken by the inverse transform process (185) and/or trying to minimize the amount of memory space needed for recording (in step 178) the parameters of the inverse transform process while trying to maximize the efficiency of the final compression algorithm chosen for and used in step 177.

In step 187 the recreated original data of the frame is supplied shortly after the time of request for that data. In step 188, if data fragmentation had occurred in step 175, then step 188 undoes the fragmentation by reassembling fragments to the extent needed in such a form that the user (145) or user's machine (144) is substantially unaware when it receives the reassembled data in step 189 of the execution of the decompression step 183 and of the inverse transformation step 185 and of the (sub)fragments re-assembly step 188. Thus, the user (145) and/or the user's machine (144) may proceed as if they were working with the original file data instead of fragmentized and/or compressed data. In other words the decompression and inverse transformation processes (183 and 185) are made transparent to end users. At step 189 the user's process proceeds as if original file data had instead been stored at the location of the compressed and pre-transformed file frame(s). One difference though, is that the fetching of the compressed data in step 181 from spinning or other storage media whose read speed is a function of file size may be much faster because the compressed data is more compact in size.

At step 190 it is determined whether new data has been written into or added into the recreated data frame by the user's machine (144). If no then nothing is done and an exit 199 is taken out of the comp/decomp oversight process (181-191). Contrastingly if the answer is yes to step 190, then control passes to oversight step 191. In step 191 the corresponding second redirection vector 146b' that pointed to the compressed frame (162) in the main storage area (e.g., 160) is undone and in its place a new first redirection vector (146b) is created pointing to the place storing the modified frame of original data. This modified frame is tagged as not being compressed and the compressed version in the old suitcase is marked as invalid. Exit is made through step 193. Subsequently at entry point 194 the overwritten and not yet compressed frame of data that had been created at step 191 can be fetched for processing by step 174. The so fetched frame of data that had been created at step 191 will then be processed in accordance with steps 175 through 178 and ultimately placed in a different suitcase for deflation or even back in its original suitcase although perhaps at a different location. Thus the altered data frame is eventually compressed within a suitcase of predictively alike other data when opportunistic time slots present themselves.

Referring to FIG. 1B, a closer look at yet more details is now in order. Step 101 corresponds to categorization and identification of compressibly alike files and/or to parsing of files into compressibly alike file fragments or subfragments. Step 101 also corresponds to the packing of compressibly alike files or (sub)fragments into a respective one or more inflated suitcases (118') that hold that class of compressibly alike data. This packing entails a change of address space. For example, whereas pixels of portrait 111' originally occupied a two-dimensional application data space 111xy (having respective x and y coordinates for display of the pixels), pixels of the in-suitcase but still inflated version of portrait 111' occupy a part of suitcase address frame 118xy (having respective x' and y' coordinates for storage of the pixels) where the occupied part begins at vertical line 118.1 and ends just to the left of line 118.2.

Step 102 corresponds to optional reordering of how the portraits are packed in the suitcase and to compression of the suitcase contents. After compression takes place, the first redirecting vector 146b is replaced by the second redirecting vector 146b' where the latter vector 146b' points to deflated suitcase 162 and tags it as deflated. Encoded pixel data corresponding to the now deflated version of portrait 111' occupy a part of deflated suitcase address frame 162xy (having respective x" and y" coordinates for storage of encoded data) where the occupied part begins at generally non-vertical boundary 162.1 and ends just before generally non-vertical boundary 162.2. The reason 162.1 and 162.2 are often non-vertical and not straight lines is because compression encoding often changes the alignment in storage address space of where the encodings for the various pixels reside.

In accordance with one embodiment, when a compressed data frame (i.e. suitcase) 162 is generated, the second redirection pointer 146b' not only points to the whole suitcase 162 but more so to a linked list of left-side start pointers 163. Each start pointer 163 points to a corresponding starting position along or near left border 188.0. Each start pointer 163 also points to a set of decompression ending pointers (or other indicators) further recorded and associated with the start pointer 163. The decompression ending pointers or other indicators indicate optional stoppage points in the decompressions walks. For the case of middle portrait 111', its end of decompression pointers/indicators identify positions along the immediate left side of boundary 162.2. If a decompressed version of all of the middle portrait 111' is desired, decompression "walks" are taken starting at the code pointed to by the left-side start pointers 163 and ending with the encoded data residing at the respective end point positions along the immediate left side of boundary 162.2. There is no need to continue decompressing deeper into the encoded regions of suitcase 162 by continuing to the right of boundary 162.2. Therefore such wasteful usage of machine bandwidth is not undertaken. In one embodiment the linked list of left-side start pointers 163 are organized so that predefined horizontal slices of any one of portraits 110'-112' may be decompressed and reconstituted without having to fully decompress all horizontal slices of the portraits. Each horizontal slice covers at least a few rows of pixels. When a specified one or more horizontal slices of the middle portrait 111' are desired, decompression "walks" are taken starting at corresponding ones of the left-side start pointers 163 for those slices and ending at the respective end point positions along the immediate left side of boundary 162.2. There is no need to continue decompressing into the region to the right of boundary 162.2, there is no need to take decompression walks through undesired horizontal slice areas and therefore such wasteful usage of machine bandwidth is not undertaken. In this way a comp/decomp system in accordance with the present disclosure avoids wasting time, energy and system resources.

Referring to the inflated suitcase 118' of FIG. 1B and more specifically to the compression walk that starts at point 147 and also to the decompression walk that starts at coincidental point 147*, this starting point 147(*) corresponds to one of the left-side start pointers 163 of compressed suitcase 162. Walk end point 147.1* corresponds to one of the decompress end points to the left of boundary 162.1. Walk end point 147.2* corresponds to one of the decompress end points to the left of boundary 162.2. Walk end point 147.3* corresponds to one of the decompress end points to the left of boundary 162.3 and so on. A compression walk starting at point 147 does not need to be a linear walk. It can be a meandering walk that performs U-turns in segment area 114.1 and that performs U-turns in segment area 114.2 while jumping from segment area 114.1 immediately into segment area 114.2. (See also FIG. 5B.) By now it should be apparent that segment areas 114.1 and 114.2 correspond to background region 114 of FIG. 1A. Thus if most regions 114 of compressibly alike portraits 110'-112' contain mostly white pixel areas per the statistical model 115 shown in FIG. 1A, it may now be understood why taking a compression walk along the in-region meandering and discontinuously jumping walk that starts at point 147 will produce a stream of data whose symbol sequences are more predictably alike than taking a left-to-right only TV raster scan separately across each of portraits 110'-112'. The preplanned compression walk 147-147.3\* substantially limits itself to predictively alike symbol sequences. Similarly, it should be apparent that segment areas 116.1, 116.2 and 116.3 of FIG. 1B correspond to feather or scarf region 116 of FIG. 1A. Thus if most regions 116 of compressibly alike portraits 110'-112' contain mostly feather or scarf textured areas per statistical model 117 shown in FIG. 1A, it may now be understood why taking a compression walk along the meandering and jumping walk that starts at point **148(\*) will produce a stream of data whose symbol sequences are more predictable than taking a left-to-right only TV raster scan separately across each of portraits 110'-112'. In terms of a rough analogy, the formulation of compression walk 147-147.3\* corresponds to packing only substantially white shirts into suitcase 118" and using a compressor 102" that specializes in pressing white shirts to generate the corresponding compressed suitcase 162". The formulation of compression walk 148-148.3\* corresponds to packing only substantially feather textured shirts into a suitcase (not shown) and using a like compressor 102" that specializes in pressing feather textured shirts to generate the corresponding compressed suitcase. The formulation of the combination of the compression walks starting at points 147(\*) and 148(\*) corresponds to combining these concepts about white only and feather patterned shirts. The more predictively alike that symbols are along the two compression walks starting at points 147(\*) and 148(\*), the easier it is to overlap the prediction models for the respective compression walks starting at points 147(\*) and 148(\*). In one embodiment, the linked list of decompression starting points 163 is ordered so that symbol sequences of successive compression runs or corresponding decompressions have statistically alike or statistically overlapping and smoothly evolving symbol distributions. (See FIGS. 1C and 1D**.)

Still referring to FIG. 1B, it is to be noted that when decompression runs (i.e. 147\*, 148\*) are initiated, the corresponding areas in suitcase copy 118'\* are blank. Each decompression run start as at a respective left-side starting point 163 in deflated suitcase 162 and converts the encoded data along its linear stream into decoded data that gets rendered successively into memory region 118' along the meandering or other walk (i.e. 147\*, 148\*) taken through the re-inflated copy 118'\* of the compressed suitcase 162. In one embodiment, the compressed suitcase 162 is not erased even if the data of one or a few portraits is changed. This is so because the compressed suitcase 162 represents the work of formulating walks through and compressing many portraits. Instead the first or second redirection vectors 146b/146b' for the one or few changed portrait is/are altered to point to a new suitcase that is correspondingly first maintained in an inflated state and then in a deflated state. The term "walk" has been mentioned a number of times without providing a hardware description of the concept. This is now done with reference to FIG. 2A.

Referring to FIG. 2A, shown is a compressing system 200 in accordance with the disclosure that has trial and error efficiency improving capabilities. The use of arithmetic encoding and adaptive predictive modeling per se are known in the art. In one embodiment, unit 271 defines part or all of an arithmetic encoder. Unit 272 defines part or all of a counterpart arithmetic decoder. Unit 260 is part of an adaptive predictor. Because certain detailed features of history-based prediction and compressive encoding are modified by the present disclosure, some normally omitted nuts and bolts details regarding prediction-based compressive encoding will be described here. The encoder/decoder pair 27/272 need not be limited to arithmetic encoding and decoding. The encoder/decoder pair 27/272 may alternatively or additionally function as or include a Huffman encoder/decoder pair, a Burrows-Wheeler Transform encoder/decoder pair, a Move To Front encoding/decoding pair, a Run Length (RLE) encoding/decoding pair, and/or an LZ compression/decompression pair and so forth.

A fundamental aspect of performing adaptive predictive modeling is that of maintaining a running history of recently received input symbols (S) in a history buffer 210. The symbols (S) are supplied from a symbol sourcing buffer 220, passed through a current symbol storage register 215 and then stepped into the history buffer 210. Specific and separate buffers 210, 220 or registers 215 do not need to be provided. The process can be mimicked by pointers pointing to different parts of a common memory. Because the history buffer 210 is of finite depth, eventually some older history has to be discarded as indicated by drop off icon 209 to make room for newer incoming symbol history arriving from register 215.

For reasons that will become apparent shortly, the symbol supplying buffer area 220 is also referred to herein as one containing the "walked" and "masked" data stream. A simulated time line 216a-216b is shown above the history buffer and continued above the walked data stream buffer 210-220. This time line is generally fictitious because all of the data in the input window (230) from which the data originates is already known. However, for purpose of predictive analysis it is pretended that the data in the symbol supplying buffer 220 is unknown and that it will arrive in a future time frame between time points $+t_1$ and $+t_N$. The pretend game also assumes that the symbol currently stored in the current register 215 has a current time value of $t_0$ and that the already received and processed symbols in the history buffer have associated time points $-t_1$ through $-t_K$. Contents of the current history depth (having a length of K symbols stored therein) are fed to an adjustable predictor module 260 by way of path 265. The job of the predictor 260 is to pretend that it does not know the contents of registers 215 and buffer 220 but rather that it only knows the contents of history buffer 210 to a limited predefined depth K. The job of the predictor 260 is to assign probabilities of next appearing to each member of a predefined alphabet set (e.g., A-Z). The assigned probabilities of next appearing in register 215 should indicate to a fair degree of accuracy what the probabilities are of each alphabet member being the one appearing as the current symbol in the register 215. For example, the probability of the current symbol S being an "E" if the English language were being used might be 13% at a given time point. The probability of symbol S being a "U" if a nearest symbol beforehand in history buffer 210 was a "Q" may be assigned a probability value of 95%. These are just examples.

Conventional entropy encoding is generally reactive rather than pro-active in nature because it accepts whatever data stream is thrown at it in whole and in the sequence that the data stream is conventionally presented to an application program. More to the point and referring to FIG. 3, if the input data stream were English prose presented in left to right fashion across a page 336', then the adaptive predictor 260 would be expected in the conventional sense to receive the English prose in exactly the same way it was written, namely, in only left to right scans and then discontinuously and instantly jumping from a right extreme end of a first line of English prose to the left extreme of the very next line of English prose. This is referred to herein as being TV-style raster fashion input of data. It is to be noted that compressing system 200 has a randomly accessible data window 230 and an ultimate walk defining means 240 that defines what sequence of address values will be applied to an address input line 231 of the data window 230 during a reading out of data from window 230 into walk buffer 220. The address sequence does not have to correspond to a TV-style raster fashion input of data. It is to be noted that compressing system 200 also has a variable bit sampling mask 233 that defines which bits (i.e., subset Bi-Bj and Bp-Bq) of the data words stored window 230 will be output over line 232 and into the optionally-masked walk buffer 220 during a reading out of data from window 230 into walk buffer 220. While the latter concept may not make sense in the context of compressing text (i.e., A-Z), it will make sense in the context of compressing image data (i.e., pixels like 117 of FIG. 1A) or other reasonably partitionable data words (i.e., words that have distinct and separable fields whose statistics may differ when analyzed over along a long input data stream obtained form a user file).

Practitioners in the field of data compression often absent mindedly accept the notion that graphic data should be inputted into an adaptive predictor in whole and in a TV-like raster fashion namely scanning from left to right entirely across a first horizontal line of a graphic frame, and then upon hitting the right border of the full image frame, jumping immediately to the left most spot from the next horizontal line and continuing with the scanning therefrom in only a left to right fashion. This may not be the smartest approach however, because as indicated in box 336' of FIG. 3, it might be possible that a given data input, even if it is text, is written in a Middle Eastern language such as Hebrew or Arabic and therefore naturally unfurls in a right to left fashion rather than in the normal English left to right direction. Moreover if the text were that from an Asian country it might normally unfurl in a top to bottom fashion rather than left to right.

Accordingly, when compressing and decompressing data, it is important to understand the dynamics of the origination of the raw original data and its symbol content and how that symbol content may represent a unidirectional one dimensional continuum of information or a 2D bidirectional continuum of information in its application space and so forth. (The compaction system should be application aware.) It is important to understand the functional interplay among the input data's symbols rather than reading it all the same as being undifferentiated input in a purely left to right fashion. In the case of naturally-originated graphics, it is often the case that a given pixel (a graphics symbol) has interrelated optical interplay and/or continuity with the pixels immediately to its left (to its West), immediately to its right (to its East), immediately above it (to its North), immediately below it (to its South), immediately to its northwest (NW), to its northeast (NE), to its southwest (SW), and to its southeast (SE). It may also have optical interplay with the pixels next immediately surrounding it in compass fashion. Optical interplay among neighboring pixels may break down when transitioning from a first textured surface area to a differently textures, second surface area. (More generally, immediately adjacent sample points in a physically homogenous object are often part of a physical continuum and thus do not change drastically in nature as one walks from one such sample point to a next adjacent and touching one while remaining within the boundaries of the homogenous object.)

Figure 3:
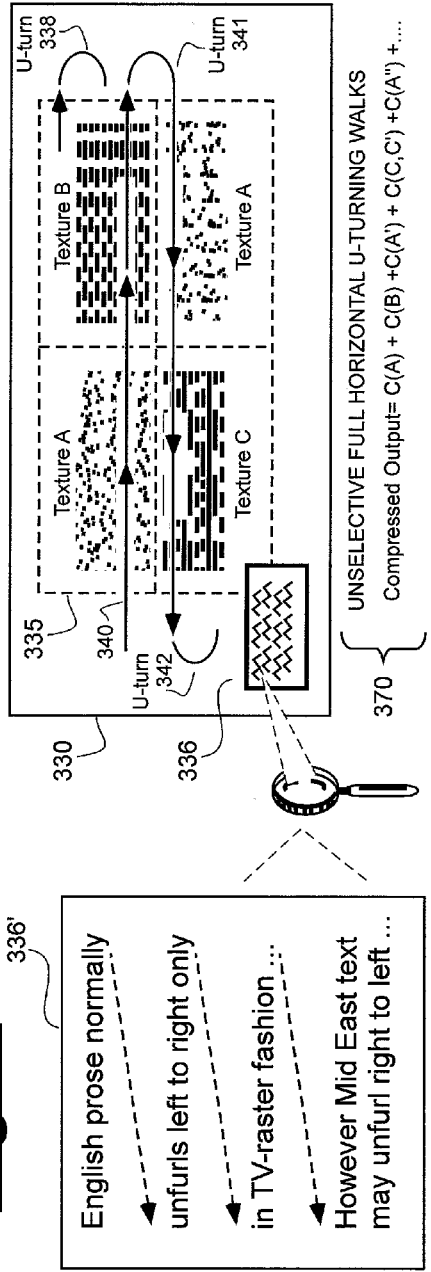
FIG. 3 is a schematic diagram for explaining drawbacks of a fully rasterized compression walk across a graphic image and for introducing the concept of U-turning major walks.
Figure 4:
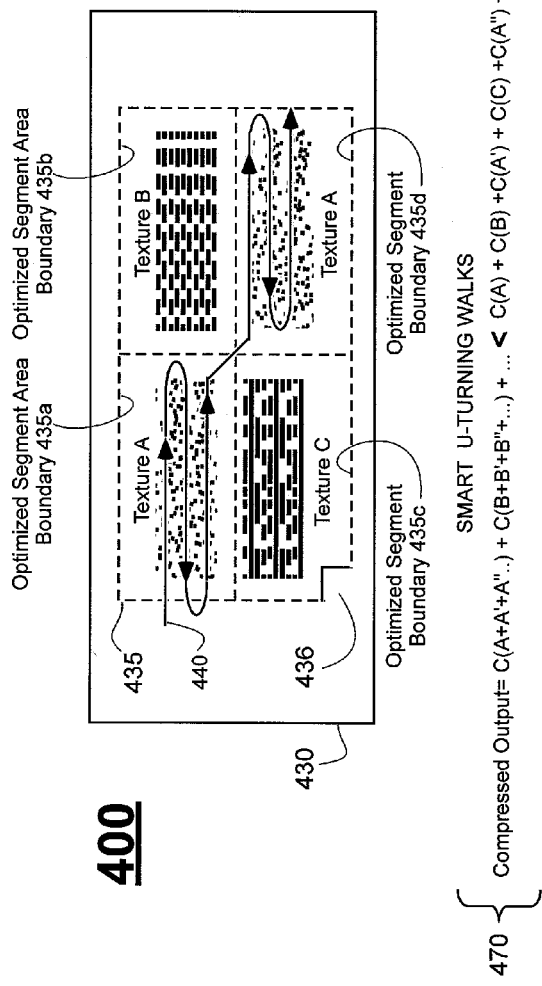
FIG. 4 is a schematic diagram for explaining advantages of segment-bounded compression walks.

FIG. 4 shows four textured image areas having respective textures denoted as A, B, C and A again. The second A-textured area in the SE corner has symbol sequences (pixel sequences) that are substantially alike to and predictively alike to those of the first A-textured area in the NW compass corner. In accordance with the disclosure, a smart or "application-aware" compression walk 440 follows a multi-directional U-turning pattern that constrains itself to remaining substantially in the NW and SE A-textured areas as opposed to persistently switching from being in an A-textured area to being in a B-textured area or a C-textured area as is done by walk 340 of FIG. 3. The history of the data seen along walk 440 (FIG. 4) will therefore persistently be of the A-textured kind. Contrastingly, the history of the data seen by sampling along walk 340 (FIG. 3) will routinely switch from being of the A-textured kind to being of the B-textured kind or C-textured kind. A history-based adaptive predictor such as 260/270 of FIG. 2A will have a much easier time of predicting with fair accuracy the next symbol expected along sampling walk 440 (FIG. 4) than along sampling walk 340 (FIG. 3). The compressing system 200 shown in FIG. 2A is structured for formulating and taking meandering and U-turning walks such as walk 440 of FIG. 4.

Returning briefly to FIG. 2A, the adaptive predictor 260 can "learn" from repeated practice and can become better at forecasting the probabilities of the next input symbol (215) being one member of a given and finite alphabet set (A-Z) or another if the data stream (220) fed to the predictor 260 is pre-tailored to persistently have a particular symbol distribution. Referring to FIG. 1C, a first of the diagrammed curves, 155.0 represents frequency of symbol occurrence in the "locality" of a first memory area, L0. The term "locality" can refer to a linear one dimensional address space, or to a planar or curved two dimensional address space, or to an otherwise dimensioned address spaces. The size of a given locality, L0, L1, L2, etc. can vary. FIG. 1C is not intended to imply that the successively adjacent localities, L0, L1, . . . , L4, etc. depicted along axis 155 are of equal size. However they are successively and uninterruptedly adjacent one to the next per the order shown on a walk-along axis 155. Moreover, FIG. 1C is not intended to imply that the predominant symbol sequence 153 shown for locality L0 is also exactly the same as the predominant symbol sequence seen in next adjacent locality L1. However, FIG. 1C is intended to imply that the predominant symbol sequence seen in next adjacent locality L1 is a laterally shifted close cousin (a predictively "overlapping" cousin) of the predominant symbol sequence 153 shown for locality L0. For example, while the symbol "E" may be the most frequently repeated one in the first locality L0, curve 155.1 indicates that the symbol "N" is the most frequently repeated one in the second locality L1. Curve 155.2 indicates that the symbols "I" and "C" might share the status of being the most frequently repeated ones in the third locality L2, and so on. The relative distribution and frequency of occurrence of respective symbols such as "T", "E", "A", "N", "I", "R", "C" in immediately adjacent and successive localities such as L0, L1 and L2 do not change drastically from one to the next. If a data-feeding walk meanders within the first locality L0 for a while and feeds its discovered symbol stream to an adaptive predictor such as 260 of FIG. 2A, the predictor 260 will eventually decipher for itself (through trial and error) what the contours are for prediction curve 155.0. Then, if the data-feeding walk continues uninterruptedly into the second locality L1 and exhaustively meanders within the second locality L1 for a significant length of time while feeding its discovered symbol stream to the same adaptive predictor (260), the predictor 260 will not have a difficult time in unlearning the first prediction curve 155.0 to the extent needed and learning the new, second prediction curve 155.1 because the differences between the two curves are fairly small.

Then, if the data-feeding walk continues uninterruptedly into the third locality L2 and exhaustively meanders within the third locality L2 for a significant length of time while feeding its discovered symbol stream to the same adaptive predictor (260), the predictor 260 will not have a difficult time in unlearning the second prediction curve 155.1 and learning the new, third prediction curve 155.2 because the differences between the two curves are fairly small. On the other hand, if the data-feeding walk had abruptly and discontinuously jumped from the first locality L0 to the fifth locality L4, the adaptive predictor 260 will have a more difficult time in unlearning the first prediction curve 155.0 and learning the new, fifth prediction curve 155.4 because the differences between the two curves, 155.0 and 155.4 are much larger. The trick, in accordance with the present disclosure is to persistently spoon feed an adaptive predictor (i.e., 260) with predictively alike data streams for as long as is possible or practical and to organize the walks inside each locality and as between successive localities so as to progressively and smoothly shift the prediction model learned by the adaptive predictor (260), thereby providing a smooth rather than disruptive transition from a first prediction curve like 155.0 to a substantially similar second prediction curve like 155.1.

Figure 1H:
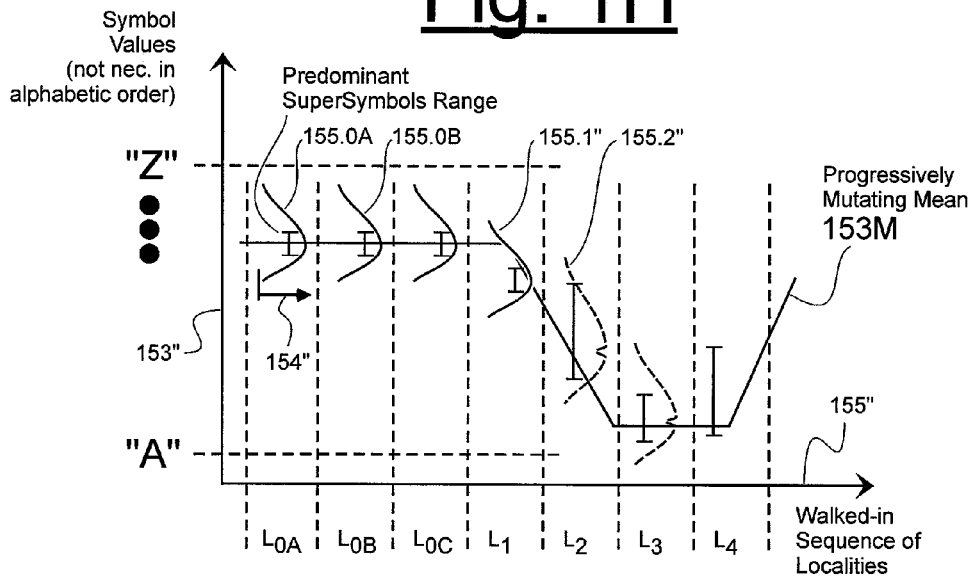
FIG. 1H shows a plurality of symbol distributions (similar to those of FIG. 1C) that may be concatenated together to define a substantially predictably consistent (SPC) stream of symbols for feeding into an adaptive predictor in accordance with the disclosure.
Figure 1G:
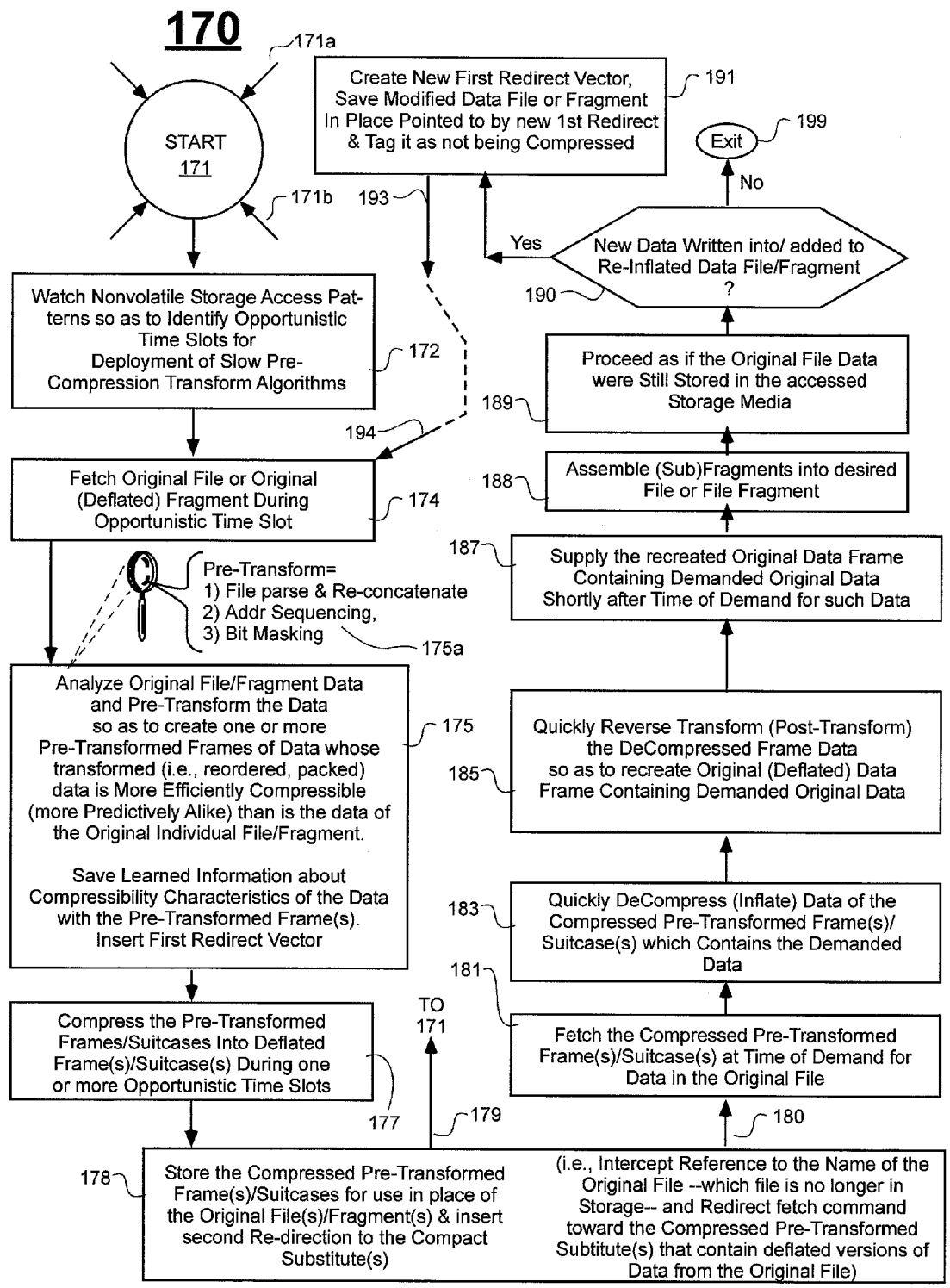
FIG. 1G is a flow chart of a method which applies one or more entropy-lowering pre-transformations to original file data or file (sub)fragments prior to compression (deflation) and which applies corresponding inverse transformations after decompression.

FIG. 1H shows another view of the same basic concept. A data-feeding walk progresses consecutively through localities $L_{0A}$, $L_{0B}$, $L_{0C}$, and then L1-L4. Localities $L_{0A}$, $L_{0B}$ and $L_{0C}$ a merge to define larger locality $L_0$ of FIG. 1C. Each of sublocalities $L_{0A}$, $L_{0B}$ and $L_{0C}$ has a same mean symbol value and identical symbol and supersymbol distribution curves 155.0A, 155.0B, etc. In the transition from the right edge of $L_{0C}$ into the middle of L1, the symbol mean monotonically and slowly transitions as indicated by the linear down slope of the mean symbol value plot 153M. Thus the data sequences found in sublocality $L_{0A}$ are predictively alike to those found in $L_{0B}$ and $L_{0C}$. The data sequences found in locality L1 are progressively-alike to those found when moving out of the right edge of $L_{0C}$ and into the left edge (start of data-feeding walk) of locality L1. Note that L4 can subdivided into a flat-line portion of plot 153M and into a portion where plot 153M has a positive slope. These could be the L4A and L4B sublocalities of FIG. 1D which is now discussed.

FIG. 1D shows a situation that it is preferable to avoid, namely, doing a compression walk that traverses through a disruptive and substantially different prediction curve like 156.1 that is interposed between otherwise closely alike curves 156.0 and 156.2 simply because the data stream of locality L1' was interposed on walk-along axis 155' between the data streams of localities L0 and L2. In accordance with the disclosure however, when a disruptive and substantially different prediction curve like 156.1 is found to be interposed at a locality L1' between otherwise predictively overlapping or alike curves 156.0 and 156.2 for respective localities L0 and L2 positioned immediately before and after the interposed locality L1', a compression walk is taken that meanders inside locality L0, skips over (step 156.6) the disruptive locality L1' and then continues by meandering inside locality L2. In this way the adaptive predictor (i.e., 260 of FIG. 2A) is uninterruptedly spoon fed with predictively alike or overlapping-wise compressibly alike streams of to-be-compressed symbols while avoiding being fed with interposed and predictively-disruptive streams such as those found in locality L1'.

FIG. 1D also schematically shows a possible pre-compression transformation 156.5 that may be carried out on the data of double humped curve 156.5. Locality L4 is subdivided by the pre-compression transformation process 156.5 into segment regions L4A, L4B and L4C. In the illustrated example, symbol occurrence distribution is more singularly peaked and more narrow in respective regions L4A and L4B as compared to source locality L4 while symbol occurrence distribution in region L4C is substantially flatter and far more spread out horizontally. This indicates that the data of L4A taken alone is more orderly (lower entropy) than the data of L4 taken in whole. It indicates that the data of L4B taken alone is more orderly than L4 and is differently distributed than that of segment region L4A. It indicates that the data of segment region L4C taken alone is disorderly. In accordance with one embodiment, the data of L4A taken alone would assigned to a first compression walk that limits itself to other localities having distributions like that of L4A, the data of L4B taken alone would assigned to a different second compression walk that limits itself to other localities having distributions like that of L4B and the disorderly (and thus disruptive) data of L4C taken alone would assigned to a strip-out and non-compressing packing of alike disruptive data where the stripped-out data is later back filled at the time that data of larger locality L4 is reconstituted. Aside from subdividing large localities (i.e., L4) into smaller and more differentially distributed sub-localities such as L4A, L4B and L4C, it is within the contemplation of the present disclosure to remap the data into a new symbol domain 153" if such remapping provides narrower and differentiated distributions. An example is shown in FIG. 1E where RGB data is remapped to index values in an indexing table and texture patterns are transformed from absolute RGB values into deltas in an index space.

The frequency of symbol occurrence graphs shown in FIGS. 1C and 1D are not intended to be limiting of the kind of statistics that may be analyzed by a machine-means that conforms to this disclosure when determining whether and to what extent a first stream of symbols is predictively alike to a second stream of symbols or transformable to be so. As mentioned above, the statistics for frequency of occurrence of predominant super-symbols (specific sequences of symbols) may be alternatively or additionally analyzed. By way of example, the character string, "the" may be a predominant super-symbol found in locality L0 of FIG. 1C and the same character string, "the" may also be a predominant super-symbol found in locality L1, thereby increasing the predictive alikeness of symbol sequences found in both localities. Also as mentioned above, the statistics for frequency of occurrence of predominant sub-symbols (specific bits within each symbols) may be alternatively or additionally analyzed to determine whether data in two or more localities are to be considered as possibly being predictively alike after a strip-off pre-transformation and/or another pre-transformation is applied to them.

Referring to FIG. 1E, aside from applying a strip-off pre-transformation so as to cause data in two or more localities are to become more predictively alike to one another and to strip out or bypass disruptive data (i.e. that of localities L1' and L4C in FIG. 1D), it is within the contemplation of the present disclosure to perform indexed remappings that transform first and second symbol sequences from appearing different in a first symbol space to appearing as having same or predictively alike delta sequence patterns when expressed in a re-mapped symbol space. Plot 159.1 represents a first textured sequence of colored pixels expressed as RGB vector values. Plot 159.2 represents a second textured sequence of colored pixels. If examined on a pixel-by-pixel basis, the two textured sequences may appear substantially different from one another in the RGB value space. For example, in first sampling slot S0, plot 159.1 contains a pixel having a coloration denoted as Red.255 (deep red) while in a corresponding first sampling slot S0', second plot 159.2 contains a pixel having a coloration denoted as Blue.254 (deep blue). Then in respective second sampling slots S1 and S1', the plots transition down to respective pixel values Red.250 and Blue.248. Then both transition back up to their original Red.255 and Blue.254 in third slots S2 and S2'. In other words, the plots follow a common or fairly close delta pattern when mapped according to the index of the index table 357.

In accordance with the disclosure, one pre-compression transformation that may be attempted in trial and error style comprises the steps of: (a) defining an index table (157) that associates successive index values (157.2) with a first sequence (157.1) of symbols (i.e., a predominant symbol sequence in RGB space); (b) mapping two or more data streams (e.g., 159.1, 159.2) to the index space of the index table; (c) determining index delta values defined by each of the mapped data streams; (d) determining if two or more of the index delta value sequence patterns are predictively alike; (e) if yes, grouping the predictively alike index delta sequence patterns together for continuous compression of the grouped together sequences while saving inverse transform indicators for reconstituting the two or more data streams (e.g., 159.1, 159.2) from nondeflated versions of the predictively alike index delta sequences (this includes saving a base offset for each delta sequence); and (f) compressing the grouped together and predictively alike index delta sequence patterns. A trial and error extension of this method comprises: (g) recording the size of the compressed output; (h) trying a different, second sequence of symbols for said index table (157) and repeating steps (b) through (f); (i) comparing the size of the compressed output obtained with the second indexing of symbols against the size recorded for the first and if the second size is smaller, substituting the second indexing of symbols in place of the first; and (j) repeating steps (g) through (i). Eventually a permutation of symbol sequencing is often found that provides substantially better compression than that of the first few attempts.

Referring back to FIG. 2A, irrespective of whether pre-transformation is applied or not, the illustrated adaptive predictor 260 is structured to generate a predictive internal model of the input stream that well forecasts the actual symbol occurrence frequency of the symbol stream (220) fed to it if stream 220 is repeatedly fed to that adaptive predictor 260. Generation of the predictive internal model (270) is based on successes and failures of the predictor 260 in correctly predicting (forecasting) past symbol sequences over a limited history 210. Output signal 261 of the predictor defines a current prediction P (or forecast) as a function of the current history 265 (of depth K) and as a function of the internal prediction model kept within a processing unit 270 that couples to the predictor 260. The current prediction, P (forecast signal 261) is compared against the actually received current symbol S (262) in a comparison unit 263. A feedback signal 264 is returned to the adaptive predictor 260 for indicating how poorly or how well the predictor 260 did statistically in forecasting the most likely value for the newest incoming symbol S in register 215. The variable prediction model of unit 270 self adjusts itself in view of recent successes or failures so as to reduce the probability of large prediction errors. Different types of prediction models and error reducing control systems are possible. One common type of prediction model is that of a neural network which uses an array of variable weighting coefficients to determine the probability of each symbol appearing as the next symbol in register 215 given input history 265. The neural net weights are constantly readjusted in view of success and failure history so as to drive the neural net towards learning how to better predict the probability of the next arriving symbol 215 being one member of the alphabet or another. Various additional or alternative methods are known to those skilled in the art for defining adaptive predictors and thus further details are not needed here. The disclosure is not dependent on any particular design of an adaptive predictor 260 or its associated prediction model 270 or the specific way in which the encoder 271 (i.e., an arithmetic encoder) behaves in reliance upon the forecast 261 output by the predictor 260. The example of a neural net is provided because skilled artisans well understand how such a neural net can be "trained" by repeated trial and error runs of a given symbol sequence to learn the prediction characteristics of the given symbol sequence.

FIG. 2B provides a graphed example of how a neural net may "learn" by practice to provide its associated adaptive predictor 260 with an increasingly improved model as long as the input data remains predictively consistent. Assume for this example that the predefined alphabet has only two symbols, black and white and the predictor has to determine the probability that the next symbol will be of one or the other color. At first the predictor usually has a poor performance record and may be predicting correctly 50% of the time or less, in other words, no better than a random coin flip. However, as time goes on and more of the predictively consistent input pattern is walked through, the history buffer of the predictor builds in depth and the learning by the adaptive predictor also increases. This is known as the training or building period for the adaptive predictor. At some point the predictor will be sustaining a correct guessing rate of 65% or better and then later perhaps 75-85% or better. This depends on the orderliness of the input pattern. In the examples of FIG. 1D, the data of sub-locality L4A taken alone is more orderly than the data of the whole of locality L4. One reason is because L4 contains highly disorderly content in its sub-region L4C. If L4C had been stepped-around, the remaining data in L4 would be seen to be more orderly. Improved prediction accuracy in FIG. 2B correlates with a reduced bits per input character (BPC) performance by the encoder and the latter reduced BPC values correlate with high compression efficiencies. For example, a sustained probability of predicting correctly of 65% or better may correspond to an ability to compress a file by approximately 30% or better. (The compressed file in such a case would be 30% smaller in size than the uncompressed original.) The longer that a high rate of correct prediction can be sustained (i.e. better than 65% correct prediction as opposed 50% random chance hits), the more compressed the output file can be made.

At some point, the incoming data stream (220) begins to provide patterns that are substantially inconsistent with the learned prediction model (270) that has been most recently "learned" by the adaptive predictor 260/270. In such a case, the already learned model turns out to be detrimental (more hampering) rather than helpful for predicting future symbol sequences in the new patch of data and the probability of predicting correctly falls off rapidly as is seen at the decaying end of the distance walked by the predictor through the input data stream 220. The bad predicting by the model continues until the model 270 can be de-trained of its earlier behavior and until it can learn new behavior by training over the new patch of differently patterned data. It is thus understood that the decay phase shown in FIG. 2B will often be followed by a subsequent training and building phase and then a new sustaining of high prediction rates if the new patch of encountered data is relatively orderly and remains that way for awhile. If the new patch is highly disorderly (i.e. it has flat symbol distribution statistics such as that of L4C in FIG. 1D)

then no non-cheating predictor will be able to theoretically do measurably better than a 50-50 random coin flip.

The symbols (S) supplied to and through symbol sourcing buffer 220 are dependent on at least three factors: (1) the data stored in memory unit 230 (also referenced as the randomly accessible data window 230); (2) the sequence of address signals 231 supplied to data window 230 from a final path walking module 240; and (3) an optional bit-masking operation performed by variable bit sampling unit 233 whereby the bits $B_i$-$B_j$ and $B_p$-$B_q$ read out on line 232 and fed into symbol sourcing buffer 220 may be less than all the bits in an addressed word of data window 230. The variable bit sampling unit 233 can be used to perform the above-mentioned bit-strip out operation wherein disorderly noise bits such as, say 115b of FIG. 1A are stripped and thus not presented to the adaptive predictor 260. Bit-strip out may be alternatively or additionally carried out by a data processor unit (i.e., 250) that feeds data into window 230. Sampling unit 233 need not therefore be positioned where shown at the read data outputting end of memory 230. In one embodiment, the bits, if any, that are stripped out by sampling unit 233 are determined on the basis of control signals supplied on line 237. The bits, if any, to be stripped out may be determined as a function of any one or more of the type of file(s) being processed by window 230, by file header specifics associated with the file being processed and by the identity of a region of window 230 that is currently being addressed by final addressing module 240.

In one embodiment, the randomly accessible data window 230 is a 1 MegaByte memory area that represents a current suitcase being processed by the adaptive predictor 260/270. Memory 235 represents a next suitcase to be processed by the adaptive predictor 260/270. Although not explicitly shown, in one embodiment a base address signal is used to point to the start address of a window (suitcase) such as 230 or 235 or a next to be processed window (not shown). The signal on line 231 serves as an offset or relative address which is added to the base address signal so as to define the absolute address pointing to a desired position in window 230 or in 235 or another window. After processing of window 230 completes, the base address is switched to point to the next window 235 and so forth. Icon 236 represents this switching of the base address. The file types (or (sub)fragment types) that are stored in the next-to-be processed suitcase 235 can be different than or similar to those of suitcase 230. One or more general purpose processors (e.g., CPU 250) are understood to be operatively coupled to memory windows such as 230, 235, etc. for carrying out analysis (e.g., statistical analysis) on data stored in the memory windows and/or for performing various pre-transformation or inverse-transformation operations on the data contained in the windows, such as subtracting out common DC biases or subtracting out common perfectly-ordered sequences prior to compression and adding the stripped-out DC biases/perfect sequences back in after decompression. The one or more general purpose processors (e.g., CPU 250) are understood to be further operatively coupled to other units of FIG. 2A for coordinating activities between the various parts and/or controlling the activities of the various parts. At the start of deflation of a given suitcase, 230 or 235, pre-trained prediction models may be loaded into the current prediction model unit 270 from a model template selector unit 266 via line 266d. The pre-trained prediction model(s) that is/are selected for initial loading into current model unit 270 may be selected on the basis of any one or more of the types of file or file (sub)fragments stored in the current suitcase 230 as indicated by selection control 266a, the type(s) of in-tile and tile-to-tile walks that will be performed by the final path walking module 240 as indicated by selection control 266b, and the type of bit-masking to be performed by the bit sampler 233 or by another bit sampler, as indicated by selection control 266c.

After the file data and/or file fragments data in window 230 has been fully processed so as to create a one or more corresponding encoded streams 273, the original data in window 230 may be erased and replaced with its corresponding encoded streams 273. Since the encoded streams 273 are generally substantially smaller in length than the original data in window 230, there will usually be a significant amount of slack space at the end of window 230 at this time. The compaction recipes used to form the encoded streams 273 may be recorded into this slack space or elsewhere as appropriate. The recorded compaction recipes may afterwards be used by the de-compaction process so as to reconstitute the utilized walk patterns and/or segment area boundaries and the utilized prediction models (270). In one embodiment, the recorded compaction recipes include jump tables such as the one shown in FIG. 6A. The so altered data window 230 now represents a deflated suitcase. Appropriate secondary intercept vectors (146b' of FIG. 1B) are recorded for pointing to corresponding ones of the encoded streams 273 now stored in window 230. There should be yet further slack space remaining at the end of the code-holding window 230 because that is the whole point of data compaction, to reduce the amount of storage space for representing the underlying information. The remaining slack space at the end of the code-holding window 230 is lopped off and the resultant (shortened) window 230 is stored into nonvolatile storage for later retrieval. Upon retrieval, the code in shortened (not shown) window 230 will be unloaded into code-holding memory area 273. The recorded walk and boundary recipes inside shortened window 230 will be unloaded into memory area 274. Pre-recorded prediction model data (if any) inside shortened window 230 will be unloaded into model storing area 270. Pre-recorded history seed data (if any) inside shortened window 230 will be unloaded into buffer 210. This will prime the decompression engine (272/260/270) for quickly reconstituting the data that originally resided in full length window 230.

With the above in mind, focus is again returned to FIG. 3 to consider a pre-compression data window 330 that contains a first address space (largest dashed box) 335 containing graphic material and a second abutting address space (solid box) 336 containing textual material where a magnification of the textual material in box 336 is shown at 336'. Address space 335 is shown to contain four rectangular sub-areas each containing its own respective texture of graphic fill-in. The left upper rectangle contains a first texture pattern denoted as texture "A". The right top rectangular area immediately adjacent to the first contains a different texture "B" while the lower left box contains yet a different third texture "C". The rectangular area on the bottom right contains a texture "A" similar to that of the box in the upper left. It may be understood from the illustrated example 335 that a blind left-to-right only, TV-raster scan (not shown in area 335, see instead area 336') would not take full advantage of a learning that may be obtained an adaptive predictor (e.g., 260/270). Just when the predictor finishes learning as much as it can about texture "A" during a first left-to-right scan through the upper left sub-area and the scan enters the domain of the upper right sub-area, the input data pattern switches rapidly to the substantially different texture "B". The predictor experiences a rapid decay in prediction accuracy of the kind shown in FIG. 2B. In response, the predictor begins to unlearn the texture "A" model and to learn the newer texture "B" model all while suffering in the interim the relatively poor performance represented by decay and build phases similar to those shown in FIG. 2B. Then, upon hitting the right edge of the data window 330 whereupon the predictor has finished learning as much as it could about texture "B" during completion of its first left-to-right scan through the top of graphics region 335, the input data pattern switches rapidly back from the "B" texture to the substantially different texture "A" of the upper left sub-area. Prediction decay and rebuild occur once again. This pattern of learn and disrupt repeats over and over again as the left-to-right only, TV-raster scans (which scans are not shown in area 335) repeatedly switch between the "A" and "B" textures while walking left-to-right only through the graphic sub-areas in the upper half of window 330.

Consider next a first U-turning walk 338 taken through the upper half of window 330. This time, when the predictor (e.g., 260/270) finishes learning as much as it can about texture "B" from a first left-to-right scan through the upper right sub-area, the predictor does not lose the value of what it just learned because the input data pattern defined by U-turning walk 338 (multi-directional walk 338) does not rapidly switch away from "B" and back to the substantially different texture "A" at the end of the left-to-right part of walk 338. It instead remains in the texture "B" domain after the right side U-turn of walk 338 is taken and the predictor (260/270) thereby benefits in two ways. First it continues to retain the heightened prediction ability built up during the left-to-right run through area "B". Second, the predictor (260/270) is not yet disrupted by the predictively unalike data of area "A". As mentioned above, compression efficiency is enhanced by spoon feeding a prediction-based compression engine (e.g., 260/270/271) with predictively alike data for as long as possible. The simple U-turn taken by walk 338 doubles the amount of distance over which the predictor persistently remains in the "B" textured area and cuts in half the number of times pattern disruption occurs.

A similar second U-turn (not shown, see 342 instead) is understood to occur in U-turning walk 338 at the end of the first right-to-left returning traverse by the predictor (260/270) through the upper "B" and "A" sub-areas after the first U-turn on the right edge. Once again the predictor thereby acquires two benefits. It continues to retain the heightened prediction ability built up during the first right-to-left run through area "A" and the predictor is not yet disrupted by the predictively unalike input data of area "B". As a result of such simple U-turning walks, compression efficiency is enhanced. Thus and in accordance with one aspect of the present disclosure, rather than doing a data-discontinuing horizontal retrace through the frame 335 when hitting a right edge of the frame 335, a data supplying means (e.g., 220, 231 of FIG. 2A) in accordance with the disclosure performs U-turning walks like 338 where upon encountering the right boundary of texture region "B" the data supplying means (e.g., 220, 231) continues providing a data-filled retrace stream while sequencing through the address space of the memory (e.g., 230 of FIG. 2A) in the other direction through the same texture area "B". Learning obtained by the predictor (260) when stepping left to right through texture area "B" is retained and used in an advantageous way to continue correctly predicting the pattern expected in texture region "B" during the right-to-left part of the U-turning walk; albeit with the training being used in a flipped orientation perhaps if the texturing has a directionality associated with it. More specifically, if the left-to-right direction symbol sequence in the "B" textured area is learned by the predictor to predominantly be of a unidirectional form such as: b1-b2-b3-b4-(repeat b1-b4), then upon performing a U-turn and switching to the reverse directed stepping through the address space of area "B", the predictor will responsively and automatically flip its model expectation to expect a pre-dominant super-symbol of the unidirectional form: b4-b3-b2-b1- (repeat b4-b1) where b1 through b4 might be different shades of blue for example. In the embodiment of FIG. 2A, prediction model 270 can be made responsive to a flag signal 243 fed to it from unit 240 and indicating a direction of the address walk 231 that produced the current symbol S in sampling slot 215. The prediction model 270 can adaptively determine for itself whether direction of walk makes a difference and if such direction of walk (243) does, the prediction model 270 can adaptively configure itself to generate one prediction if the walk is left-to-right, a different second prediction if the walk is right-to-left; and perhaps a different third prediction if the walk is in another direction (i.e., diagonal).

An Nth U-turning walk 340 is illustrated in FIG. 3 to show a situation where simple U-turning at the extreme ends of window 330 loses its luster. This is where the "B" textured sub-area abuts against the lower right "A" textured sub-area. As the data-supplying walk 340 continues to supply fresh data to the adaptive predictor (260/270) after U-turn 341, the predictor which has just spent time and energy learning to better predict in texture region "B" will suddenly hit a new patch of differently patterned input data after U-turn 341 takes it into the texture "A" region. As a consequence, the predictor suffer a compress decay of prediction capability followed by a slow build up and learning period as it adapts to the "A" texture only to soon thereafter run into the differently patterned "C" area.

FIG. 4 illustrates an improved walking pattern 440. Image frame 430 corresponds to 330 of FIG. 3 except that for avoidance of illustrative clutter the abutting graphic box 436 is not shown. The L-shaped cut into graphic sub-area 435c as caused by abutting box 436 is shown though. In accordance with the disclosure, graphic area 435 is intelligently subdivided into a plurality of segment areas having respective boundaries 435a (surrounding the upper texture "A" region), 435b (surrounding the texture "B" area), 435c (surrounding the texture "C" area while avoiding the upper right corner of text box 436), and 435d which fully bounds the lower texture "A" area in the bottom right corner. The segmentation causes each of subareas 435a-435d to be substantially predictably consistent (SPC) internally. The smart walk 440 first performs U-turns when encountering the edges of the upper left texture "A" segment area 435a. When finished with the upper left texture "A" segment area, the smart walk 440 immediately jumps into the bounded area 435d of the bottom right texture "A" sub-area and continues performing U-turn walks inside that second texture "A" sub-area 435d. In this case, the pattern learning that was obtained at the beginning of walk 440 through the top part of the upper left texture "A" area is retained and advantageously used through all the U-turned walks in bounded sub-areas 435a and 435d. The result is improved data compression. This concept is algebraically expressed at 470 in FIG. 4. In the algebraic expression, C( ) represents a run of a prediction based compression algorithm and the parameters in the parenthesis represent the input data stream supplied to the compression algorithm during its run. The data size of a compressed output obtained from a compression operation like C (A+A'+A" . . . ) tends to be substantially smaller than the compression results of a randomly-disrupted sequence of compression runs represented by C(A)+C(B)+C(A')+C(C)+C(A")+ . . . where C (A+A'+ A" . . . ) denotes a compression run that is intentionally spoon-fed persistently with predictively alike input data streams denoted by, A, A', etc.,. It is to be noted that although U-turning walks are repeatedly described herein, it is within the contemplation of the disclosure to perform a variety of other multidirectional data feeding-walks through substantially predictably consistent (SPC) segment areas where the multidirectional data feeding-walks are designed to substantially trace along an attribute continuum of a physical object represented by the sampled data. For example, in FIG. 5C, the combination of the U-turning major walks 543-546-etc. and in-tile rotating minor walks (e.g., steps 0:8 in tile 561) can be viewed as defining substantially cycloid-like walks. It is also within the contemplation of the disclosure to perform data sampling walks that cause the sampled data to be substantially sorted according to data magnitude as shall be seen for an embodiment of FIG. 8D.

Returning to FIG. 2A, a means for providing smart U-turning walks (like 440 of FIG. 4 or other multidirectional walks) through differently textured and/or differently colored areas of a graphic image will now be described in more detail. The data that appears sequentially in the walked data stream buffer 220 is supplied from randomly accessible data window 230 whose address input 231 (i.e., relative address input) is driven by the ultimate in-segment path-walker unit 240. The address signals supplied by path-walker unit 240 over bus 231 can cause the data seen in the walked buffer 220 to correspond to a smartly-U-turning walk such as 440 of FIG. 4. In one embodiment the in-segment path-walker 240 receives a final segment boundary(ies) defining signal 241 from a walks definitions storing memory 274. The in-segment path-walker 240 also optionally receives a final in-tile walk definition signal 242 from the walk definitions storing memory 274. As mentioned above, when producing a corresponding sequence of address signals 231, in one embodiment the path-walker 240 also generates a direction indicating flag signal 243 that is supplied to prediction model 270 as an input parameter together with history 265 and success/failure indications 264 (via bidirectional path 267). The walk definitions stored in memory 274 may be formulated by a trial and error walks formulator 280. The walks formulator 280 couples to a compression efficiency evaluator 290. A feedback loop between formulator 280 and evaluator 290 is formed with lines 291 and 292. Line 291 collects compressed interval values that are output by arithmetic encoder 271 and are stored as encoded data in code storing memory 273. Line 292 indicates to the walks formulator 280 what the compression efficiency is of the encoded data held in memory 273 (for example in terms of encoded bits per input symbol or BPC). The trial and error walks formulator 280 feeds each of its formulated walk definitions to memory 274 so that walker 240 can try out the defined walk on a trial basis and so that encoder 271 can produce a corresponding stream of encoded output values for storage in memory 273. The trial and error walks formulator 280 can then determine from feedback 292 supplied to it from evaluator 290 whether a first fresh walk through data window 230 provides better compression efficiency than a different second fresh walk through the same data of data window 230. In one embodiment, the trial and error walks operation may be selectively bypassed by use of bypass path 283. In such a case, whatever initially generated boundary definition is provided on line 281 and/or whatever initially generated in-tile walk definition is provided on line 282 becomes the final boundary definition and final in-tile walk definition forwarded to walker 240 rather than one or more initial definitions that are subject to modification by actions of the trial and error walks formulator 280 (which actions can include modifying the final boundary definition(s) 241 and/or final in-tile walk definition(s) 242 for the to-be-walked segment area).

Before continuing with descriptions of the final in-segment path-walker 240 and how its input signals 241, 242 may be formulated, a short detour is taken here to complete description of the arithmetic encoding and decoding sections 271 and 272. Encoder/decoder sections 271-272 both receive a same prediction signal 261 from the adaptive predictor 260/270. Encoder/decoder sections 271-272 use the prediction signal 261 to perform their respective encoding and decoding operations. The adaptively corrected prediction signal 261 is a function of at least the prediction history 265, of the prediction error feedback signal 264 and of the current version of the adaptive predictor model held in unit 270. This can be algebraically expressed as: (P=Pred(History(K,t), Model(K,t)), where K=depth and t=time). In one embodiment, the adaptively corrected prediction signal 261 is also a function of the walk direction flag 243.

When performing its encoding operation, the encoder unit 271 uses the current prediction signal 261 and also the current sampled symbol signal 262' (S, same as 262) to generate an encoded interval value that is stored into memory 273. Conventional arithmetic encoding practice divides an arbitrary number line such as between the values zero and one (the 0 to 1 line) into an almost infinite set of tiny intervals. Each of the almost infinite number of intervals along the 0-1 main interval represents a corresponding one of an almost infinite number of possible symbol sequences for a given alphabet. For example, one of the sequences within the possibilities might simply be the two symbol sequence, "aa". A second such sequence might be the four symbol sequence "aacb" and so on. For any sequence having a finite number of symbols (i.e. "aacb"), there is a corresponding sub-interval on the 0-1 main interval line that may be associated with that finite length symbol sequence. One form of compression encoding works by picking a number point in the sequence-representing sub-interval that can be represented with a relatively few number of bits. The higher the precision (not accuracy) is of the selected encoding interval value (i.e., 0.1358), the longer tends to be the sequence of symbols that can be represented by the encoded value and the greater the compression efficiency tends to be. Thus the example shown in box 273 shows a first encoded sub-interval value of 0.5 which normally represents a rather poor compression efficiency due to its low precision (e.g., just one significant bit represented as 0.1 in binary). The next decimal value, 0.255 often indicates that some amount of adaptive learning has taken place and a more efficient compression has taken place for the next set of input symbols (262) given the increased precision of the encoded interval value. The third value 0.6137 indicates yet further learning and yet better precision and greater compression efficiency, and so on.

Line 291, as mentioned, couples to module 290 and provides a signal indicative of the achieved compression efficiency (i.e. in terms of BPC or in terms of other metrics) for a given stream of incoming symbols 262" and the correspondingly stored interval values in memory 273. During decompression, the encoded interval values stored in memory 273 are supplied by way of line 275 to the arithmetic decoder 272. Decoder 272 further receives the prediction signal 261 from adaptive predictor 260. Decoder 272 performs an operation inverse to that of encoder 271 by converting the encoded sub-interval values supplied on line 275 into corresponding symbol sequence streams S", where the latter may be written into an empty area of data window 230. The recreated symbol streams correspond to those that appeared over time in register 215. In a lossless compression and decompression cycle, the output symbol stream S" (238) produced by decoder 272 exactly matches the incoming stream S (262) earlier seen by the encoder 271. During the decompression cycle, part or all of data window (i.e., suitcase memory) 230 is blank. The decoder output stream S" is written via line 238 into memory 230. At the same time, ultimate walk defining means 240 supplies the same sequence of address signals to address input 231 as was supplied during the counterpart compressing operation. The decompression operation therefore walks the same walk through the address space of memory 230 as the walk taken by the counterpart compressing operation and in this way it refills the data window 230 with the same data in the same spots where they appeared during compression.

A variety of different walks are possible through the address space of memory 230. Depending on how they are formulated, some walks (i.e., 440 of FIG. 4) can make the prediction model 270 appear to be a very clever and accurate model in that its predictions 261 turn out to be very close to the actual statistics seen in the incoming symbol stream 262 while other walks (i.e., a blind left-to-right TV raster walk across 335 of FIG. 3) can make the prediction model 270 appear to be a relatively inept and inaccurate modeler. The trick is to formulate a performance enhancing walk (231) for a given adaptive predictor (260/270) and vise versa to formulate a performance prediction model (270) for a given walk (231) and for the non-deflated data (230) that is walked through by the sequence of address signals supplied to address input 231. A tightly interdependent coupling of cause and effect exists between the design of the prediction model 270, the design of the walk 231 and the symbol sequences encountered in walked through (and optionally bit-masked) data of memory 230. This tight coupling is represented by interdependency symbol 269 (a dashed tri-directional coupling). Stated otherwise, compression efficiency can be significantly enhanced if the right data is picked and packed into window 230, if the right walk 231/240 is taken through the address space of window 230 and if a matching prediction model is programmed or loaded into model section 270 to correspond with the data picked and packed into window 230 and with the walk 231/240 formulated and taken through the address space of window 230 during compression. Selection of an appropriate encoder 271 may also help because some types of data (i.e., graphics versus text) are better compressed with one kind of encoder (i.e., arithmetic versus BWT) than another. See briefly the specialized compressors 271A" and 271B" of FIG. 2C.

In one embodiment, formulation of the compression walk 231/240 starts with formulation of one or more initial segment area boundaries (represented by signal 281 in FIG. 2A) and/or formulation of one or more initial compression walks. The initial segment area boundaries and/or initial in-segment compression walks may then be refined by a series of trial and error processes (carried out by optimizer 280) so as to formulate the final segment area boundaries and the final in-segment walk definitions. In one embodiment, the final in-segment walks comprise a combination of U-turning large or major walk steps taken from one so-called tile area to the next (see 561, 562 of FIG. 5C) and finer in-tile sampling walks taken within each tile area (see ordered sampling steps 0-7 in tile 561 of FIG. 5C).

Signal 242 supplies a finalized formulation of the finer in-tile walk definitions to in-segment walker 240. Signal 241 supplies the finalized segment area boundary definitions to in-segment walker 240 and walk start pointers pointing to a top or bottom corner of each segment area where a corresponding U-turning walk is to commence. Signals 241 and 242 come from a jump table memory 274 which further instructs the in-segment walker 240 when to jump from a first segment area to a next area that, if all goes according to plans, is predictively alike or predictively overlapping with the former segment area that was just walked. An example of a jump table is shown in FIG. 6A.

Referring to FIG. 5A, the walk and jump formulating process may be more clearly understood by way of a detailed example. An area initializing subsystem 500 is shown in FIG. 5A for generating initial segment area boundaries (hard boundaries) in response to a supplied 16×16 frame 501 of RGB pixel data. Some but not all of the 16×16 pixels in image frame 501 are shown filled in with indicators of their respective RGB color values. This is done to avoid illustrative clutter. It is to be understood that generally each of the 256 pixels has an RGB data value filled in. The pixel at row A, column 1 for example (hereafter "pixel A1") has a relatively reddish color identified as R1. The next adjacent pixel to its right at column 2 (pixel A2) has a slightly more reddish color R2 and so on. The G1 value of pixel A5 represents a first of a series of greenish pixels. The v1 notation in pixel A10 represents a first of a series of violet colors found along the ROYGBIV color spectrum. Row H column 1 contains a first bluish pixel having a value of b1 among a following series of bluish pixels. The o1 value found in pixel D5 represents a type of orange while the y2 in pixel D7 is a type of yellow. The specific colorations are not relevant. It is understood that different notations like, R1, R2, R3 represent different colors but not ones that are significantly far away from each other on the ROYGBIV color spectrum whereas R0 and v9 are very far away from each other.

Initially image frame 501 has no boundaries defined in it except for the four outer extreme edges of its 16×16 square structure. The x and y coordinates (509) of these extreme left, right, top, bottom, edges of frame 501 are fed to a processing unit 530 as a region defining signal 532 that defines the picture region to be processed. A second signal 531 identifies the picture type of frame 501 to unit 530 as being a 24 bits per pixel RGB type for example. (See data structure 115' shown to the right of unit 530.) Other picture types may be supplied to and processed by unit 530 including those that encode their image in YUV format rather than RGB format.

Unit 530 begins sampling through the data in picture frame 501 using a left-to-right only TV raster type of scan beginning at row A and column 1. Unit 530 begins to collect statistical data about the symbol sequences and super-symbol sequences found therein during the left-to-right TV raster scans. At the start of one of the scans, a first initial segment area is defined as having vertical hard boundary 502a on its left and short horizontal hard boundary 504a on its top. Eventually these initial and short vertical and horizontal hard boundaries, 502a and 504a, will be stretched out to define longer hard boundaries, 502 and 504. Further hard boundaries, 503 and 505 will also eventually be defined so as to fully encircle a segment area identified herein as 502-503. However, that is moving too far forward in the unfolding story. At the start of the segment isolating scan, scanner 530 moves a scanning read pointer 535 belonging to it in the indicated left to right direction while pre-stripping out (as one example) the least significant 2 bits of each of the R, B and G components of each scanned pixel before intaking the pixel data for purpose of statistical analysis. The stripped out format is illustrated in region 115'. The pixels of frame 501 retain their full 24 bit precision however. When the read pointer 535 encounters the stripped R2 value of pixel A2, the initial raster scanner 530 notes that this stripped-of-its-2LSB's R2 value does not vary from the stripped-R1 value found to its left by more than a predefined or adaptively-defined horizontal delta amount. The scanner 530 determines from this that the row statistics have not yet changed drastically and therefore it is not yet time to lay down a first vertical boundary marker (503v1) between the current sample point A2 and the previously sampled symbol sequence, A1. Accordingly the scan pointer 535 keeps moving to the right and next encounters the A3 pixel having the R3 value and thereafter the A4 pixel with its R2 value contained, where the encountered values thus far all fall within a horizontal color variance tolerance permitted by the predefined or adaptively-defined horizontal delta amount.

Upon encountering the fifth pixel in row A, the scanner 530 discovers that its value, G1 exceeds the predefined or adaptively-defined horizontal delta amount. In response, the scanner 530 lays down a first vertical boundary marker 503v1 (identified in copy 503' of 503 as shown to the right in FIG. 5A) between pixel positions A4 and A5. In one embodiment, once a next vertical boundary marker element (503v1) is established in a top row (A1-A4) of a developing segment area (502-503), a top horizontal border (i.e., 504) is automatically established to extend leftward as a straight horizontal line that meets with and joins the previous vertical hard boundary element (i.e., 502a). In an alternate embodiment, the top segment area boundary may be established as a staircase like structure similar to 503 but rotated 90°. The latter approach of allowing for nonlinear top borders may lead to unnecessary complication though and is not detailed herein.

The read scanner 535 continues to read LSB-stripped color values while sampling towards the right edge of row A and discovers that pixel positions A6-A9 are all within a second predefined or adaptively-defined horizontal delta amount. When the v1 violet color in pixel A10 is encountered, the scanner determines that the delta in color value exceeds the second predefined or adaptively-defined horizontal delta amount and the scanner lays down a second vertical boundary marker 513v1 (not shown to the right in FIG. 5A but understood to correspond to 503v1 of the illustrated boundary copy 503') between pixel positions A9 and A10, thereby establishing the beginning of a new right-hand hard boundary 513 (shown as a thickened staircase-like stepping line). In other words, scanner 535 is progressively stepping along a contiguous line A1-A16 of symbols to be displayed and scanner 535 is segmenting that display line into a plurality of line segments, A1-A4, A5-A9, A10- . . . , etc. that are predictively unalike, one with respect to the next immediate segment along the contiguous display line A1-A16.

The read pointer 535 of scanner 530 continues on to the extreme right edge of display frame 501 laying down additional vertical boundary elements (not shown) as deemed appropriate and then does a quick and discontinuous retrace to begin processing at column 1 of row B of the frame 501. At this point, the scanner may begin processing vertical color change statistics as well as horizontal ones. The scanner 530 notes that the LSB-stripped R2 color stored in pixel B2 does not vary from the stripped-R1 value found above in position A1 by more than a predefined or adaptively-defined vertical delta amount. The scanner 530 determines from this that the column statistics have not yet changed drastically and therefore it is not yet time to lay down a first horizontal boundary marker (a left portion of horizontal boundary 505). The scanner starts its pointer 535 moving in the left-to-right direction again testing for change of color value exceeding a predefined or adaptively-defined horizontal change limit starting at pixel position B1. It is to be understood from FIG. 5A that a next vertical hard boundary element 503v2 is then established between pixel positions B5 and B6 and yet a further hard boundary segment belonging to border 513 is afterwards laid down between pixel positions B11 and B12 and so on. In other words, scanner 535 is progressively stepping along a contiguous string A1-A16, B1-B16, . . . , P1-P16 of symbols to be displayed as a frame 501 and scanner 535 is segmenting that contiguous string A1-A16, . . . , P1-P16 not only into a plurality of horizontal line segments, A1-A4, A5-A9, A10- . . . , etc. that are predictively unalike, one with respect to the next immediate segment along their contiguous horizontal display lines (e.g., A1-A16) but also segmenting the vertical column strings (e.g., A1-B1- . . . -P1) into a plurality of vertical line segments, A1-G1, H1-J1, K1-P1 that are predictively unalike, one with respect to the next immediate segment along their contiguous vertical display lines (e.g., A1-P1). This process of segmenting in the horizontal direction and segmenting in the vertical direction repeats horizontally and vertically throughout the frame 501. For example, after processing row G wherein vertical boundary element 503v10 is established between pixel G4 and pixel G5, the process continuous into row H. Upon beginning a new left-to-right direction scan at position H1, the automated scanner 530 discovers that the color value of pixel H5 differs from the R0 value in position G1 by more than a predefined or adaptively-defined vertical change of color limit. As a result, the raster scanner 530 automatically establishes the left end of horizontal border 505. In one embodiment, once the left end of a horizontal bottom border (i.e., 505) is established, the horizontal bottom boundary 505 is later automatically extended rightward as a straight horizontal line to meet with and join the next vertical hard boundary element (i.e., 503v10). This completes the full border around initial segment area 502-503 as formed by the four joined boundary curves or lines: 502, 504, 503 and 505. Another way of viewing this operation is that scanner 530 has located a plurality of vertical-wise immediately abutting line segments: A1-A4, B1-B5, . . . , G1-G3 that are predictively alike to one another and that share at least one vertical display column (i.e., A1-G1) and scanner 530 has directly or indirectly thereby identified a segment area as consisting of a plurality of immediately abutting horizontal line segments: A1-A4, B1-B5, . . . , G1-G3 that are predictively alike to one another, that share at least one vertical display column and are surrounded by predictively unalike, other horizontal line segments (i.e., A5-A9, G5-G7, H1-H8). Note that vertical-wise immediately abutting line segments: A1-A4, B1-B5, . . . , G1-G3 are spaced apart from one another storage address-wise in the storage space (e.g., RAM memory) that stores frame 501 because a forward moving sequential address count through the storage space of frame 501 sequences through segment A5-A9 immediately after stepping through A1-A4. However, segments: A1-A4, B1-B5, . . . , G1-G3 are not completely spaced apart from one another in terms of application-space because in the display and in the physical object they represent they vertically touch one another. In an alternate embodiment, the bottom segment area boundary curve may be established as a stair-case like structure similar to 503 but rotated 90°. The latter nonlinear bottom approach may lead to unnecessary complication though.

With identification of the first segment area 502-503 now complete, the scanner 530 gathers the unstripped color values (the full 24 bit values) in the identified isolated segment area 502-503 and calculates a mean or center of gravity set of statistics for that segment area. Calculation of the segment area's center of gravity statistics may vary from application to application. In one embodiment, the center of gravity statistics include an unweighted average of all the pixel values in the segment area and/or a designation of frequency of change of luminance and/or of color components (in the YUV plane) of all the pixel values in the segment area. These center of gravity statistics are recorded as gravity coefficients in a statistics collecting table such as in column 606 of jump table 600 (FIG. 6A). Assume for sake of example that the mean color for initial segment area 502-503 is recorded as R2.3 and its texture is identified as Texture number 02.

Referring to copy 503' of boundary 503 as shown to the right in FIG. 5A, it is to be understood that upon formation of bottom boundary 505, the left and right side boundary curves, 502 and 503 are automatically completed as follows. The initial left short vertical boundary 502a is extended into the form of longer left vertical boundary 502 between top horizontal border 504 and bottom horizontal border 505. Horizontal connectors are provided at locations 503H3, 503H5, 503H7, 503H9 and 503H11 as shown at replica 503' of the right-side hard boundary 503. By connecting the ends of hard border curves 502, 505, 503 and 504, a fully-bounded segment area containing reddish values in the range R0 through R4 with a mean value of say, R2.3 is established as shown.

After scanning through the bluish pixels of frame rows H through J, the scanner 530 encounters a new reddish segment area beginning at frame position K1 and terminating with the right side border 523. Line 525 defines the bottom horizontal border of this new reddish segment area. The of center of gravity set of statistics for segment area 522-523 are calculated and stored in a jump table like 600 of FIG. 6A. Suppose for sake of example, the mean color of segment area 522-523 is calculated as R2.1; fairly close to the R2.3 mean of segment area 502-503 and the mean texture is designated as number 02, just like the texture of segment area 502-503.

After the initial scanner 530 has finished scanning left-to-right through all the pixels of the 16×16 frame 501, the scanner 530 will have subdivided frame 501 into a plurality of tessellated and fully bounded segment areas like the illustrated 502-503, 503-513 and 522-523. (Note that the definition of boundary curve 503 is shared because it defines the right border of segment area 502-503 and it also defines the left border of segment area 503-513. Thus one boundary definition serves at least two segment areas in this case.) In accordance with one principle of the present disclosure, it is desirable to now define a U-turning compression walk (see 440 of FIG. 4) through the similarly colored (reddish) and similarly textured segment areas defined by left-right boundary pairs 502-503 and 522-523 with a data skipping discontinuous jump occurring between the end of 502-503 and the start of 522-523. The latter comports with a second principle of the disclosure wherein it is desirable to establish a jump around disruptive data such as the bluish area in rows H-J and to continue a U-turning compression walk in the second reddish segment area 522-523.

Although the example of FIG. 5A partitions a graphic frame 501 into a plurality of line segments (i.e., A1-A4, A5-A9, . . . , P1-P6, etc.) where each line segment has some form of statistical symbol distribution internally that sets it apart from the next immediate line segment found along the display string that forms frame 501, it is also within the contemplation of the disclosure to treat other arrays of symbols (e.g., text symbols, phonic symbols, telemetry symbols, etc.) in similar fashion by partitioning an originally continuous stream of such symbols (e.g., the stream of pixels to be sent to a displayed frame driver, the stream of text characters to be sent to a displayed page driver, etc.) as they appear in their application memory space (i.e., display frame 501) into a plurality of segments that exhibit substantially different symbol distribution statistics internally from the symbol distribution statistics exhibited by the next immediately following segment along the relevant string of symbols. Then, as is in the U-turning walk case of the graphics example of FIG. 5A, a segments concatenating operation is performed so as to physically or at least logically cause one segment to be considered by the machine as being immediately adjacent to a next segment of its own kind although in the application memory space it is not. More specifically, the U-turning walk mentioned above for segment area 502-503 causes the right end of line segment A1-A4 to be considered by the U-turning walk mechanism as being immediately followed by the right end of line segment B5-B1, the left end of B5-B1 to be considered as being immediately followed by the left end of line segment C1-C6, and so forth. Additionally, the jump mechanism mentioned above and detailed in FIG. 5B causes the right end of line segment G1-G3 to be considered by the jump and U-turning walk mechanism as being immediately followed by the left end of line segment K1-K4. It is within the contemplation of the disclosure that so-concatenated segments of predictively alike and/or predictively overlapping data sequences may be constituted by sequences of sub-symbols such as by sequences of symbols that have had noisy bit fields and/or perfectly ordered bit fields stripped out from them.

Referring to FIG. 5B, the walk and jump concept for graphic segment areas is shown in a simpler schematic fashion. A first closed segment area 540 is illustrated as having a mean coloration weight designated of R00. The rudiments of a U-turning walk in segment area 540 are shown at 540' and one set of embodiments is further detailed in FIG. 5C (to be discussed shortly). The reddish segment area 540 (R00) of FIG. 5B tessellates tightly in application memory space with a greenish segment area 550. They are shown as spaced apart in the schematic for sake of illustrative clarity. It is to be noted that segment areas 502-503 and 503-513 of FIG. 5A also join with each other as tessellated subdivisions of the their image frame 500. Segment area 550 of FIG. 5B has a greenish mean coloration value designated as G30. A first jump pointer 541 is associated with the end of the R00 segment area (540) providing an immediate jump 542 to the start of a substantially similar reddish segment area 545 that has a mean coloration weight denoted here as R10. Segment area 545 has a further pointer 547 associated therewith and providing an immediate jump 548 into the start of an orange like segment area 549 having a mean coloration weighting of O20. For sake of this example it is assumed that in a given application, the colors red and orange are deemed to be sufficiently close to one another on the ROYGBIV spectrum so that segment areas 545 (R10) and 549 (O20) can be deemed to be predictively overlapping and so that jump 548 is therefore not a disruptive one. (More specifically, it may be that the tail end (bottom) of area 545 tends toward having a red orange color and the head end (top) of area 549 tends toward also having a red orange color. In that case, jump 548 may define an unbroken transition from a first sequence of red orange pixels to a second, predictively alike sequence of red orange pixels.) In accordance with the disclosure, a first U-turning compression walk is taken through the first reddish segment area 540 (R00) and then immediately at the end (541) of that first U-turning walk, an address jump 542 is made into the start of the second reddish area 545 (R10) where the U-turning walk continues uninterrupted and thereby streams a continuous sequence of reddish pixel values to the adaptive predictor (260/270) of a prediction-based compression engine (e.g., 260/270/271 of FIG. 2A). Since the mean coloration weighting R10 of segment area 545 is only slightly different from the mean coloration weight R00 of the first segment area 540, the predictive adapter (260/270 of FIG. 2A) will have little trouble in unlearning the statistical distribution of the first segment area 540 (if such unlearning is at all needed) and adjusting to the new statistical symbol distribution values of the second segment area 545. Similarly when jump 548 is taken to the reddish orange start area of segment area of 549, the adaptive predictor (260/270) will have little trouble in further adjusting itself slightly to accommodate to the new symbol distribution found in the third and slightly different segment area, 549. Although U-turning snake walks are the ones used in one embodiment for exhausting the interior of a segment area while moving along a mostly continuous path from one pixel to a touching next pixel, it is within the contemplation of the disclosure to use other snake walks that exhaust the interiors of the segment areas and generally progress from one pixel (or tile) to a touching next pixel (or tile; tiles will be explained in conjunction with FIG. 5C).

It is to be noted that the U-turning walk and jump process carried out for segment areas 540 (R00), 545 (R10) and 549 (O20) supplies a relatively smooth progression of predictively alike pixel coloration values to the adaptive predictor (260/270) of the compression engine without including many rapid switches to substantially different coloration values such as might be caused by instead jumping immediately from the reddish R00 mean value of area 540 (near the left end of the ROYGBIV color spectrum) to the violet V60 mean value of area 560 (near the right end of the ROYGBIV color spectrum). Instead a gentle and gradual transition is provided from one type of symbol distribution statistics to the next. This corresponds with an interrupted transitioning from the symbol distribution statistics of curve 155.0 of FIG. 1C to the closely overlapping symbol distribution statistics of curve 155.1 and then to the closely overlapping symbol distribution statistics of curve 155.2. It also corresponds to the jumping around or skipping over of prediction disrupting symbol sequences found in spatially interposed localities such as the disruption skip over 156.6 illustrated in FIG. 1D (skipping over dissimilar locality L1').

Still referring to FIG. 5B, after a first linked list thread of U-turning walks is taken through the reddish, red-orange-ish or orange like segment areas 540, 545, 549, and more of the same if present (not shown), the adaptive predictor may begin anew with a different symbol distribution starting with segment area 550 (G30) and progressing through alike areas 555 (G40), 559 (G50) and beyond (not shown) in similar manner. Thereafter the adaptive predictor may begin anew with violet segment area 560 (V60), exhaust that area 560, jump discontinuously into violet area 565 (V70) and continue uninterruptedly to process the predictively alike symbol sequence provided from walking in violet area 565 (V70). After exhausting the predictively alike symbol sequences present in area 565 (V70) the predictor jumps discontinuously into indigo segment area 569 (I80) and continues accordingly. In an alternate embodiment, a parallel set of plural adaptive predictors take respective walks simultaneously through the respective threads that have their starting points respectively at the top left corners of segment areas 540 (R00), 550 (G30) and 560 (V60).

Referring to FIG. 5C, in one embodiment, the U-turning walks taken through a given segment area 540" include a left-to-right horizontally directed major walk 543 along a topmost, first row of "tiles" inside the given segment area 540" where the first major walk extends to the last tile at the right end of the first in-segment row of tiles, then takes a down step 544 to the next row of in-segment tiles. More specifically, the down step 544 proceeds to the rightmost tile of that next row of in-segment tiles. After processing the rightmost tile, the major walk continues on a right-to-left horizontally directed trajectory 546 as it processes that next row of tiles up to and including the leftmost in-segment tile of that next row. This is followed by a down step (like 544) to the next row of in-segment tiles and more specifically to the leftmost in-segment area tile of that third row. The major U-turning walk pattern repeats with each of the horizontal scans like 543 and 546 extending from the extreme left border of the segment area 540" to the extreme right border of that processed row of tiles (where each "tile" may contain only one pixel or each tile may contain a structured array of plural pixels or of pixel related data as shall be seen shortly). In some instances such as shown at area termination point 553, a vertical down step is not possible from the left end of the illustrated rightward major walk to the leftmost end of the next row of in-segment tiles. In such a case, a data-less skip over 554 is taken so as to thereby switch the data read pointer to the leftmost end of the next row 556 of tiles and to thereafter begin the rightward directed major walk 556. Data from the skip over part 554 of the U-turn is not fed to the adaptive predictor of the compression engine. The data skip over step 554 means that there will not be a touching continuity of tile areas for that part of major walk 556 that is over-shadowed by the skipped-over extension 554 of out-of-segment tiles. However, in most cases, the length of the skip over extension 554 is fairly short (i.e., one or a handful of tiles) and generally the short discontinuity in the desired touching between one walked tile and the next immediate one along the snake walk does not present a big problem for the adaptive predictor.

It is to be understood that the segment area-exhausting snake walk shown in FIG. 5B is merely illustrative. Many variations can be pursued. The left-to-right directed topmost major walk 543 can be replaced with a right-to-left directed walk that starts in the topmost right corner of area 540". Plural U-turning snake walks may be interlaced within a segment area for thereby exhausting the data of the area that is to be compressed. Scanning through a given segment area (i.e., 540") may begin at either corner (left or right) of its bottom-most row of in-segment tiles rather than at either corner of its topmost row 543 of tiles. U-turns may be taken at the top and bottom borders of a segment area (i.e., 540") between vertical up and down journeys through the address space of the segment area if desired. The main point is to have deterministically reproducible walks that exhaust the image data of a given image frame (e.g., 501 of FIG. 5A) and that substantially spoon feed sequentially-efficiently-compressible sequences of input data to a prediction based compression engine (e.g., 260/270/271 of FIG. 2A).

In one embodiment of the tile-to-tile walk shown inside area 540" (FIG. 5C) each of the major horizontal walk trajectories 543, 546, . . . , 556, etc. exhausts a horizontal row of image data that is just one pixel tall. In an alternate embodiment, each of horizontal major walks, 543, 546, etc., exhausts a horizontal row of tiles where each tile is at least three pixels tall and at least two pixels wide. FIG. 5C shows the case where each tile (i.e., 561) consists of 3-by-3 array of sub-tile areas as is indicated by magnifier symbol 557. Each sub-tile area may store a full RGB pixel value (e.g., a 24 bit word), or a full YUV pixel value or just one color component (i.e., R or Y) of the three-component RGB and YUV data structures or another coefficient that relates to a given one pixel or relates to a predefined matrix of pixels (i.e., a harmonic coefficient from the 8×8 DCT matrix shown at 568m and discussed later below). The magnified (557) fine resolution walks may includes snake-like coiled progressions through all the sub-tile areas of tiles 561, 562, 563, 564, etc. By snake-like, it is meant here that the finer resolution walk (the in-tile fine walk) steps unbrokenly from one sub-tile area to a next touching sub-tile area within each tile and samples the whole or a bit-stripped version of the data contained in each visited sub-tile area. Two sub-tiles touch if they have a common corner point or a common side. It is often desirable to have an unbroken progression of sampling points in consecutive ones of touching tiles and/or in consecutive ones of touching sub-tile areas when dealing with naturally generated image data (or other physical attribute data that represents natural phenomenon) because physical attribute measurements in a roughly homogenous object tend to be defined as a continuum when moving through the object's space in a snake-like manner. In natural objects, optically derived patterns, or radiation derived patterns (e.g., X-rays, MTI, sonogram, etc.) tend to be continuous rather than sharply discontinuous in terms of their represented luminosities, colorations and/or a texturizing patterns rather than sharply discontinuous when moving generally along a continuous string of pixels from one pixel to an immediately adjacent and thus touching, next pixel. Despite that being said, the illustrated in-tile walk shown for tiles 561 and 562 allows for a small discontinuity in the sub-tile-to-sub-tile path when stepping from a last ("8") sampling point inside tile 561 to the next start-of-sampling ("0") point inside adjacent tile 562. An alternate in-tile walk shown at 571 provides for an unbroken continuity of touching between one sub-tile area and the next even when crossing a tile-to-tile dividing boundary.

The specific in-tile walk that is taken in a given application situation may vary from application to application depending on how symbol occurrence and super-symbol occurrence (i.e., coloration and/or texturing patterns) statistically tend to flow in the given application. Flow in a bone X-ray image may be different than flow in an MRI image slice of soft tissue. The in-tile walk shown in the example of tiles 561-563 (first row) and tiles 564, 566, 567 (next row) is merely illustrative and not meant to be limiting. Assume for purpose of initial explanation that each tile (i.e., 561) is a 3×3 square consisting of nine sub-tile areas as shown and that each sub-tile contains the full RGB data of a corresponding single pixel. In a later described, alternate embodiment each sub-tile area will contain a Fourier or DCT coefficient extracted from an 8×8 JPEG matrix 568*m* as shall be detailed later.

Sticking with the simpler example however, where each tile (561) consists of just nine RGB pixels, assume further that area 558*a* represents other tiles of segment area 540" that have already been exhaustively walked through by the compression engine (or by an adaptive predictor) before the engine continues its walk by stepping into tiles 561-563. Assume a left-to-right directed major walk is proceeding along the row of illustrated tiles 561-563. Since portion 558*a* of the top and left hugging area 558 has already been walked through by the adaptive predictor (i.e., 260/270), the predictor will have adapted to the history of portion 558*a* to one extent or another. The compression walk (be it a final walk or a preceding trial and error walk) is now jumping from the left border part of region 558*a* into tile 561 and more specifically into the sampling start sub-tile ("0") at the center of the 3×3 tile 561. Immediately thereafter the in-tile fine walk steps into the upper right corner of the tile to the next snake-wise successive sampling point denoted as "1". The in-tile fine walk continues counter-clockwise around the outer sub-tiles of tile 561 with successive sampling steps "2", "3", "4", "5","6", and "7" as shown so as to have the ninth step (denoted) as sampling step "8" ending just below the initial "1" sample point and at the middle of the right side of tile 561. This counter-clockwise in-tile fine walk ("0"-"8" of 561) has the following attributes. The first step, "0" is equally distanced from the pre-walked region 558*a* immediately above and immediately to the left of tile 561. Thus the current history (see 265 of FIG. 2A) of the adaptive predictor is likely to contain recent data from the pre-walked region 558*a* and/or the prediction model (270) is likely to have recently adapted itself to the symbol sequence found in the recently pre-walked region 558*a*. As a result, the adaptive predictor (260) has a better than random chance of correctly predicting occurrence probability for the symbol next found in the central and first sampled "0" sub-tile area of tile 561. The next five successive sampling steps, "1"-"5" immediately hug adjacent to the pre-walked region 558*a* of tile 561, and steps "1"-"5" also immediately hug adjacent to the just-walked "0" sub-tile. Also sampling steps "0"-"5" constitute an unbroken sequence of sampling steps from one sub-tile to a next immediately adjacent and touching sub-tile. Given that successive sampling steps, "0"-"5" touch one to the next, the adaptive predictor (260) has a better than random chance of correctly predicting the symbol sequence to be found in the strung together succession of touching sub-tile areas "0"-"5". The last three sub-tile areas corresponding to in-tile sampling steps, "6", "7", and "8" hug the bottom right corner of the tile 561 as an unbroken continuation of the sequence of sampling steps started at central sample point "0" and then rotated counterclockwise from "1" to "8". The history contributions from the first three in-tile walk steps "0"-"2" and the last three in-tile walk steps "6"-"8" are physically closer to the next tile 562 than are middle sampling steps "3"-"5" in tile 561. The last sampling step denoted as "8" in tile 561 is physically closest to the next "0" starting sample to be taken upon entry into the second tile 562. This positioning of steps "0"-"2" and "6"-"8" in tile 561 provides a 9 sample sub-history whose front 3 and back 3 sample points are weightable as being closest physically to next tile 562. On the other hand, the middle three sample points, "3"-"5" are physically closest to the recently pre-walked left part of region 558*a*. If the neural network and/or other adaptive modeling means of prediction model 270 is to assign different weights to the sample points "0"-"8" of tile 561 when in the process of predicting the symbol to be found in the "0" starting sample of next tile 562, then this positioning of "3"-"5" as being physically closest to the recently pre-walked tile and of "1", "7", "8" being physically closest to the next to be walked tile can be used for establishing the neural net and/or other weighting factors. Note that the same physical orientation will be true in the next to be walked row having tiles 564, 566 and 567.

After tile 561 has been walked through, the in-tile walk for next tile 562 will follows the same "0"-"8" pattern as that taken in tile 561. The physical closeness of sub-tile areas "1", "7", "8" to the next tile is represented by icon 561*a* for tile 561 and by icon 562*a* for tile 562. It can be seen from icon 563*a* that sub-tile areas "1", "7", "8" of tile 563 will be physically closest to next tile 564. It can be seen from icon 564*a* that sub-tile areas "1", "7", "8" of tile 564 will be physically closest to next tile 566, and so on. The physical closeness pattern is maintained as the fine walk snakes from one tile to the next even during a U-turning part (563*a*) of the major walk.

The in-tile walks shown for tiles 561 and 562 are denoted herein as walks directed to the right because the major horizontal walk is one in the direction of left-to-right as indicated by icons 561*a* and 562*a*. Closeness contribution icon 563*a* indicates however, that the "1", "7", "8" sub-tiles of tile 563 will contribute downwardly to the next row of tiles rather than to a tile to the right of 563. The downwardly-directed fine walk taken in the tile 563 is thus different from the rightwardly-directed fine walks of tiles 561 and 562. After an initial, touch-breaking jump is made from the ending "8" point of tile 562 to the starting "0" point of tile 563, the downwardly-directed in-tile walk of tile 563 steps down and to the left to thereby position its "1" sample point at a bottom corner of tile 563. Because a clockwise fine path is next followed, this will cause the ending "8" sample point of tile 563 to be positioned in the middle of the bottom sub-tiles row of tile 563. As before, the results of the clockwise in-tile fine walk in tile 563 results in sampling steps "1" through "5" hugging the left border and top border of tile 563 while the last three sample points "6", "7" and "8" hug the bottom right corner of tile 563 with the last sample point "8" being positioned most adjacent to the next-to-be sampled tile, 564.

The in-tile fine walks illustrated in tiles 564 and 566 are denoted as in-tile walks directed to the left per the indication by closeness contribution icon 564*a*. Referring to tile 566 (one step to the left of tile 564), the attributes of the left-directed in-tile walk are as follows. Sampling steps "1"-"5" hug the top and right borders of tile 566. The last three sampling steps "6", "7", and "8" hug the left bottom corner of tile 566 with the "8" sample point ending in the middle of the left column of tile 566. Thus, the closeness contributions of the left-directed in-tile fine walks are similar to those of the right-directed in-tiled walks 561-562 except that they contribute towards the left direction rather than to the right.

Referring to the downward start of the U-turning path taken by tile 567 (assume that 567 is at the left extreme end of pre-walked region 558*b*), the next major tile walk will begin again in rightwardly-aimed direction starting with tile 568. Accordingly, the in-tile fine walk in 567 is downwardly directed with the first "1" sampling point being placed in the bottom right corner of tile 567 immediately after the "0" sampling point is placed at the center of tile 567. Then the sampling walk proceeds counter-clockwise as shown so that the final "8" sample point will be in the middle of the bottom row of tile 567. Within tile 568 the right-directed in-tile fine walk of tiles 561 and 562 is repeated and understood to continue into the next tile to the right (not shown).

The in-tile fine walks illustrated in tiles 561-564 and 566-568 are merely examples. Many other variations of in-tile walks may be undertaken as deemed prudent for a given type of symbol sequence (i.e., RGB pixels or YUV pixels or other graphic coefficients). One alternate in-tile walk that is right-directed is shown at 571. The initial "0" sample point is placed in the bottom left corner of the 3×3 tile 571 and then the walk begins with a clock-wise hugging of the left and top edges of the tile 571. After sample point "4" is processed, the in-tile fine walk makes a diagonal cut to the center where the "5" sample is taken and then down to the illustrated "6" sample point, followed by a second diagonal move up to the "7" sample point so as to thereby terminate with the "8" sample point being positioned in the bottom right corner of tile 571, ready for a next tile like 571. In other words, the following "0" and "1" sample points in the next following tile (not shown) to the right of 571 will be immediately adjacent to the last "7" and "8" sample points in the previous tile (i.e., 571) and so on. For a downward turn, after the central "5" sample is taken in a tile (not shown) like 571, the positionings of "6"-"7" are swapped so that "7"-"8" end up on the bottom row, A left directed version (not shown) of 571 rotates the "0"-"4" sample points counter-clockwise with the "0" starting in the top right corner.

Aside from the illustrated 3×3 square tiles of FIG. 5C it is within the contemplation of this disclosure to use other types of rectangularly structured tiles including, 3×5, 5×3, 5×5 and 7×7 for example where each side dimension defines an odd number of sub-tile areas and thereby provides for a central row of sub-tiles and a central column of sub-tiles in the rectangular tile area. Various, snake-like fine walks may be taken through these alternate tile structures as deemed appropriate for their respective applications.

As hinted above, each sub-tile area need not constitute a particular RGB pixel value. In one alternate embodiment, where the original image is a JPEG one, each sub-tile area contains a DCT (discrete cosine transform) coefficient taken from an 8×8 DCT matrix that is obtainable by a applying a Fourier type discrete cosine transform to a corresponding array of 64 YUV encoded pixels organized as three planes of 8×8 square matrices (one plane for the Y values, one for U and one for the V). As those skilled in the art of JPEG compression will understand, the 8×8 matrix 568*m* of DCT coefficients (after Huffman decompression) is organized as a zig-zag distribution of 64 transform coefficients with a "base" or zero frequency harmonic coefficient 568*b* being positioned in the upper and left most corner of the 8×8 matrix 568*m* followed by a second harmonic coefficient 560*c* being positioned the next along the zig-zag 568*z* and with higher frequency harmonics filling progressively further along the zig-zag 568*z* so that the end of the zig-zag is filled with the highest frequency harmonics of the discrete cosine transform. The last one is the 63rd harmonic. It has been observed that the tail end of the zig-zag 568*z* tends to be filled with zeros in most images because the higher frequency components are often absent due to quantization effects. On the other hand the left upper start of the zig-zag, such as at positions 568*b* and 568*c* tend to be filled with rather large coefficient numbers. However, the base band harmonic coefficient 568*b* is generally unrelated to the second harmonic coefficient 568*c* and no apparent pattern is generally seen between the two. Thus compressing along the zig-zag with an arithmetic encoder often does not produce good compression results. In conventional JPEG, the start of the zig-zag is compressed with Huffman encoding while the higher frequencies of the tail are compressed with run length limited encoding (RLE).

Figure 5D:
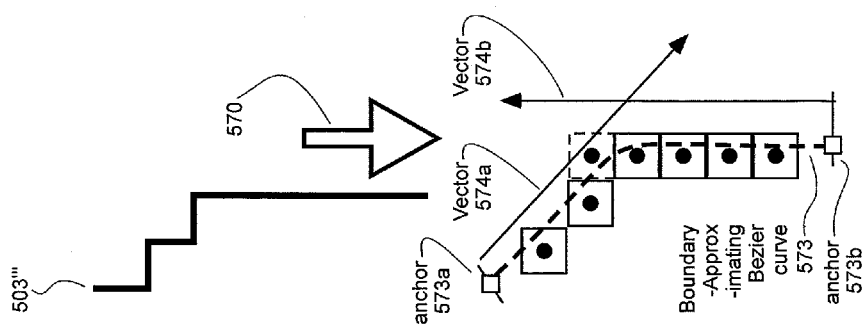
FIG. 5D provides details regarding a first time, trial-and-error compression walk and an associated process of redefining, smoothing and approximating the segment borders so as to provide for a quicker inverse transformation process and reduced storage needs for segment boundary definitions.
Figure 5D:
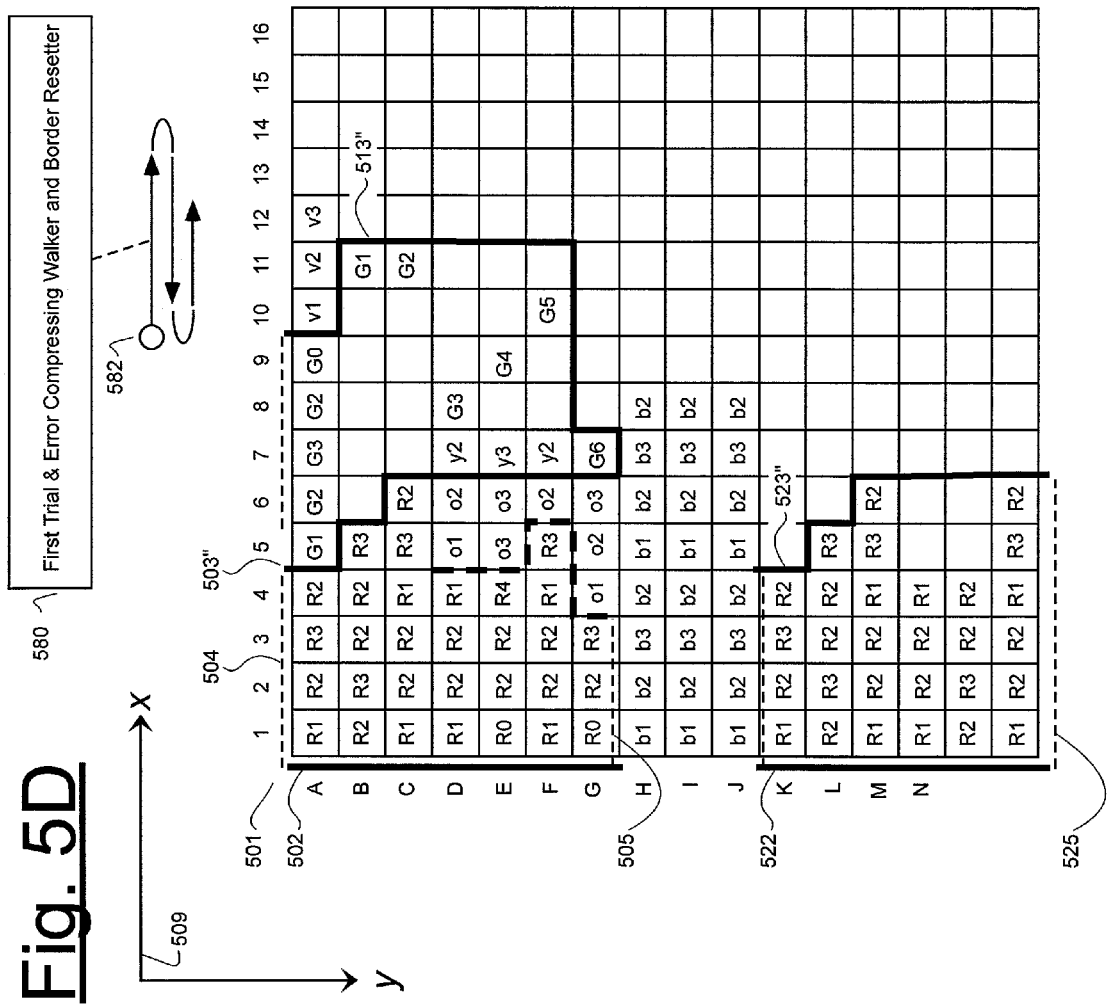

Consider however a vertical stack of nine 8×8 DCT matrices similar to 568*m*. Assume that the vertical stack of nine 8×8 DCT matrices (not shown, see FIG. 8C) are obtained by respective applications of discrete cosine transforms to a square array of nine YUV image matrices, each having an 8×8 structure. Consider more specifically a case where the vertical stack of nine 8×8 DCT matrices (not shown) are obtained from only the Y luminance component of each of the 64 YUV image matrices. Now drill down vertically from the 568*b* base harmonic position of the topmost DCT matrix (i.e., 568*m*) in the stack to the corresponding base harmonic position of the bottommost DCT matrix in the stack. The coefficient values seen along this drill through will seem remarkably similar, usually differing from each other by small deltas. This makes that symbol sequence a highly predictively alike one. Repeat the same for the second harmonic position (568*c*) and the same predictive alikeness of data values will often be seen for all the second harmonic values taken from a same segment area. Repeat the same for the 63rd harmonic position and usually a long run of just zeroes will seen. Such a long run of same low precision numbers is highly compressible. Repeat the same separately for the U and the V chrominance components of the YUV images and for the DCT's of those components and similar results will be seen. Drill again vertically down through the base harmonic positions of the DCT matrices stack (not shown) and distribute the found coefficients in tile 568 according to the corresponding positions of the nine original 8×8 YUV matrices from which the 8×8 DCT matrices were obtained. Perform in-tile fine walks through such distributed base harmonic values and a highly compressible sequence of predictively alike values will appear in the sample stream. Repeat the same for each of the 2nd through 63rd harmonic coefficients and similar results will be seen. When the so strung-together sequences of harmonic coefficients are separately fed to an adaptive predictor (260/270) or simultaneously fed to a respective set of plural parallel-wise executing adaptive predictors very good compression results can be obtained. More regarding this will be detailed below in conjunction with FIGS. 8A-8C.

FIG. 5D shows the same frame of image data 501 as was shown in FIG. 5A. However in FIG. 5D the original right side hard boundary 503 of FIG. 5A has been modified into a smoother stair-like boundary 503" which thereby defines a modified segment area 502-503" that is slightly different than original segment area 502-503 of FIG. 5A. The boundary smoothing operation was performed so that the number of data points needed for defining the new right side boundary 503" (FIG. 5D) is reduced relative to the number of data points needed for defining the often more agitated and original right boundary 503 appearing in FIG. 5A. Inspection of the new pixel data that is encompassed by the modified and smoother boundary 503" (FIG. 5D) will show that it mostly contains a few extra orange-like values such as o1, o2 in addition to the all reddish values R0-R4. The additional orange-like values are not that far deviated on the ROYGBIV color spectrum from the reddish colors originally provided inside the original segment area 502-503 of FIG. 5A. In hindsight, this observation should not be surprising for naturally-generated images because nature often abhors sudden discontinuities within a homogeneous object. Accordingly, it is often the case that even though the small amount of newly encompassed pixel data differs by more than the allowed variation limits of the scan taken by scanner 530 of FIG. 5A, the difference over the threshold will usually not be a big one. Accordingly, a compression engine (i.e., 260/270/271) will not have that much more of a difficult time in efficiently compressing these slightly out of bounds extra orange-like values (i.e., o1, o2) than it would have had with the original, reddish only values isolated by scanner 530.

Modification of the original, but often wildly meandering hard boundary 503 of FIG. 5A into the softened (less meandering) hard boundary 503" of FIG. 5D is undertaken with the aid of a trial and error compressing walker 580. In one embodiment, the goal is to cause the softened boundary 503" to be definable by one or more linear equations expressed for example in terms of the x and y coordinates 509 of the image frame 501. In the same or an alternate embodiment, the goal is to cause the softened boundary 503" to be definable by one or more simple and optionally nonlinear equations such those that define Bezier curves. More generally, the goal is try out a number of different compaction solutions (i.e., different segmentations, different walk patterns, different bit-strip-outs if any, different subtractions of perfectly-ordered sequences if any, etc.) and to determine from the trial and error attempts which of the tested solutions appears to provide the greatest degree of data compaction in an acceptable amount of time (T1 or less), which of the tested solutions appears to provide the shortest decompaction time (T2) and/or which of the tested solutions appears to provide an acceptable balance between shortening of decompaction time (T2) and increasing of degree of data compaction. The compressing walker 580 of FIG. 5D corresponds to the optimizer 280 of FIG. 2A. In one embodiment, they are part of the same apparatus. The compressing walker 580 of FIG. 5D first proposes a small smoothing modification to the right boundary (originally denoted as 503 and ultimately as 503") so as to make it more linear or otherwise conforming to a smooth boundary-defining curve, The compressing walker 580 temporarily makes that small modification and then takes U-turning compression walks 582 through the modified segment area 502-503" for the purpose of determining how badly compression efficiency will be hurt (or helped) by the proposed temporary smoothing of the right border definition 503, . . . , 503" into the form shown. If the result is within acceptable predefined tolerances, the small modification is kept and a next small modification to the right border definition 503, . . . , 503" is proposed and tested. If the storage size results of a trial and error compression are too big, in other words, outside the predefined acceptable tolerances, the first small modification is undone and a different modification is tried and tested. Eventually, original boundary 503 (FIG. 5A) takes on the less agitated shape of boundary 503" (FIG. 5D).

Referring to FIG. 2A, when the trial and error boundary modifications are tested by unit 580 (FIG. 5D), the amount of damage done to compression efficiency is determined with the aid of compression efficiency evaluator 290. The compression output provided for a given trial and error walk through a redefined segment area (i.e. 502-503" of FIG. 5D) is fed from encoder 271 and stored in memory 273. The efficiency evaluator 290 uses line 291 to determine the length of encoded output from memory 273 (e.g., in terms of number of bits, number of storage words or otherwise). The efficiency evaluator 290 uses line 262" to determine the length of unencoded input (e.g., in terms of number of bits, number of storage words, number of original symbols, etc.) that were encoded by encoder 271. By counting the number of symbols appearing on line 262" and dividing this number into the number of bytes read by line 291, the compression efficiency evaluator 290 can calculate the bits per character (BPC) metric for the modified segment area (e.g., 502-503") and feed the same via line 292 to the in-segment walker and bound optimizer 280. As a result, the in-segment walker and bound optimizer 280 can compare the BPC results (or other length of input versus length of encoded output calculations) obtained from an earlier segment area definition relative to BPC results obtained for a currently proposed refinement (i.e. FIG. 5D) of the definition of boundaries for the given segment area. This information is used by the in-segment walker and boundary optimizer 280 to determine how badly compression efficiency is hurt when unit 580 temporarily simplifies one or more boundaries (i.e. 503") of a given segment area (i.e. 502-503"). This amount of hurt (or benefit) is balanced against the benefit obtained from reducing the number of data points needed for defining the softened and modified boundary 503" and the benefit obtained from thereby simplifying and speeding up the counterpart data decompaction process. If less storage space is needed for storing the softened boundary 503" in combination with the slightly damaged compression results 273, then the in-segment walker and bound optimizer 280/580 will generally pick the latter solution as compared to the one where compression efficiency is very high but also a much larger number of data points are needed for defining the highly agitated boundary 503 of FIG. 5A and as a result the decompaction process is made more complicated and slower. A balance is found between the highest degree of compaction observed and the fastest speed of decompaction expected from among the solutions tested by trial and error means.

In addition to comparing compression efficiencies based on playing around with one or both of the left or right boundary curves 502-503 of a given segment area, the in-segment walker and bound optimizer 280/580 may also play around with different in-tile walk definitions to see if variations of those change compression efficiency and decompaction speed in a beneficial or hurtful way. If beneficial, the optimizer 280 may elect to store a different in-tile walk definition in memory 274 for use by the final in-segment path walker 240. The ultimately settled upon in-tile walk is passed to walker 240 by way of line 242. The ultimately settled upon segment area boundary definition(s) is/are passed to walker 240 by way of line 241. Hard boundaries, by the way, may be allowed to have vertices at the corners of any of the individual pixel areas as is suggested in FIG. 5D, or more generally, they may be allowed to have vertices only at the corners of the system-defined tiles (such as at the corners of the 3×3 tiles 561-563, 564, 566-568 shown in FIG. 5C).

Referring to FIG. 5D, irrespective of whether segment area boundary lines like 502 and 503" are defined to have optional vertices at corners of individual pixels or at corners of tiles, or only at corners of larger grouped sets of multiple tiles, a further data reducing step may be taken by approximating a softened boundary curve like 503" with a Bezier curve (i.e., 573) which cuts through the peripheral pixel areas or tiles of a given segment area (i.e., 502-503"). A center of gravity point is selected for each of the in-segment pixel areas or tiles or super tiles, for example the center of each such pixel or tile or super tile. If the defined center of gravity for the pixel, tile or super tile entity appears to the left of a given Bezier curve 573 then the entire pixel, tile or super tile area is deemed to be to the left of the boundary defined by the Bezier curve 573. If the pre-defined center of gravity is found to be to the right of the Bezier curve 573 then the entirety of the corresponding pixel or tile or super tile area is deemed to be to the right of the boundary. Those skilled in the art of Bezier curves will appreciate that highly complex Bezier curves can be defined with only a small number of anchor points (i.e. 573*a*, 573*b*) and a small number of corresponding and directed vectors (i.e., 574*a* and 574*b*). Use of Bezier curves to approximate the actual boundary of the pixel or tile areas or super tile areas that are to be bounded by the corresponding border can greatly reduce the number of data points needed for defining a given border. Other geometric constructs such as collections of straight line segments may alternatively or additionally be used to define border approximating curves. When an initial hard boundary such as 503 of FIG. 5A is softened to form the less agitated staircase boundary 503" of FIG. 5D, part of the consideration is that of automatically determining how simple the corresponding Bezier curve 573 would be given modifications being proposed for the original hard boundary curve 503 of FIG. 5A. Trial and error attempts are made by optimizer 280 (or 580 of FIG. 5D) to minimize the number of anchor points (e.g., 573*a* and 573*b*) that will be needed for defining a given Bezier curve 573. Although FIG. 5D shows a single Bezier curve 573 as constituting the approximating boundary for staircase border 503", it is within the contemplation of the disclosure to concatenate a series of straight lines and Bezier curves or other anchor-wise defined types of boundary approximating curves for thereby defining the right and/or left boundaries of a given segment area.

Referring to FIG. 6A, an example of a jump table 600 that may be formulated in accordance with the disclosure is shown. Column 601 of the jump table contains row numbers or index numbers each corresponding to a different segment area. Column 602 contains the coordinates (i.e. $x_1$, $y_1$) of the top left corner of the corresponding segment area of a given row. Column 603 contains a pointer to a single or to a concatenated multiplicity of definitions for border lines and curves (e.g., boundary approximating curves) defining the left side border of the given segment area. Column 604 contains coordinates (i.e. $x_2$, $y_2$) for the bottom right corner of the corresponding segment area. Column 605 contains a pointer to the right border definition(s) of the corresponding segment area. The right border definitions define a continuous border that passes through the bottom right corner coordinate defined in column 604. The left border definitions pointed to by the pointer in column 603 define a continuous border that passes through the top left corner coordinate of column 602. Although not fully shown, it is understood that pointers such as in columns 603 and 605 point to respective first and second recordings of corresponding first and second expressions that define corresponding first and second boundary approximating plots (e.g., 573 of FIG. 5D) that each extends across the data containing address space (e.g., image frame 501) where each of the first and second plots cuts through end tiles of two or more of segments specified in the address space and where each of the first and second plots further lays to one side or another or on a predefined reference point of each tile (or pixel) it cuts through and the positioning of the reference point relative to the first or second plot deterministically indicates in accordance with a predefined system convention whether the cut-through tile (or pixel) is to be deemed as being wholly disposed to one side or the other of a segmentation boundary represented by the respective first or second boundary approximating plot.

Column 606 of table 600 contains one or more segment area gravity coefficients. Examples of gravity coefficients include the average or a weighted average coloration for the pixels in the segment area (i.e. R00). Other examples of segment area gravity coefficients may be those that define a particular texture or frequency of change with the segment area. Averaged DCT coefficients for a segment area filled with 8×8 DCT matrices may constitute gravity coefficients for column 606. The specific gravity coefficient stored in each row entry may vary from application to application depending on the nature of the imagery, the nature of the way in which the imagery is encoded (i.e. RGB encoding, YUV encoding or other).

Column 607 of FIG. 6A contains an index pointer identifying the index (i.e., row number) of the next segment area to be jumped to after the current segment area has been exhausted by a compression walk or a decompression walk. For example the column 607 value for row 1 points to row 2. This corresponds to pointer 541 of FIG. 5B. The jump index pointer of row 2 points to row 5. This corresponds to pointer 547 of FIG. 5B. The jump entries that are placed into column 607 of jump table 600 may be altered by the trial and error walker and optimizer 280 as desired. When a segment area is modified (i.e., its boundaries are smoothed), its gravity coefficients may change. In that case it may make sense to also change the jump sequence from one segment area to the next based on the changed gravity coefficients. The compression efficiency evaluator 290 can be used to automatically determine which sequence of jumps provides a more improved compression than another one. Additionally or alternatively, the rows of jump tables 600 may be sorted according to one or more of the segment area gravity coefficients in column 606. Generally, segment areas that have the same or closely the same mean color values and mean texture values and/or other closely alike gravity coefficients will tend to be predicatively alike to one another. Accordingly it will be generally beneficial to jump from one segment area with a given set of gravity coefficients to a next segment area with approximately same gravity coefficients. A table-sort based definition of the jumps to be taken may be tweaked by the walk optimizer 280 with the aid of compression evaluator 290. The final jumps are stored into memory area 274 together with the final definitions of the segment area boundaries and the final definitions of the in-segment and in-tile walks. Although not specifically shown in FIG. 2A, it is to be understood when that when a jump is taken from a first segment of FIG. 6A to a next segment area, the starting coefficients (columns 602) for that next segment area are fed in as the new starter address to be output by walker 240 along bus 231 into the random access data window 230 immediately after the previous segment area is finished. Accordingly, the walked and/or masked data scan buffer 220 will receive an uninterrupted sequence of symbols that appear remarkably compressively alike to one another. It is further to be understood that compression efficiency evaluation 290 may be used in combination with optimizer 280 to test different types of bit sample masking operations performed by unit 233. With all of these variations, the stream of symbols that is fed from buffer 220 into the adaptive predictor 260/270 by way of sampling register 215 can be tweaked so as to spoon feed highly predicatively alike symbol sequences to the adaptive predictor.

Referring to FIG. 1F, it was mentioned a number of times above that the packing of appropriate data into the data window 230 of FIG. 2A is an important aspect of achieving high compression efficiency. Note again that interdependency icon 269 (FIG. 2A) couples the data within window 230 to the final in-segment walks taken by walker 240 and to the prediction model adaptively generated by modeling unit 270. FIG. 1F shows how composite files such as 165 may be dealt with in accordance with the disclosure. A composite file such as 165 may contain a wide variety of different types of data sequences positioned at different locations within the document. For example, the deflated FILE_1 shown at 165 includes a first graphics box noted as Graphic_1A and a second embedded image box denoted as Graphic_1B. These two graphic boxes need not be of the same type. For example, one may be a graphics box that is encoded as all JPEG data while the other box may be encoded as simpler RGB (bit mapped) data. Additionally, the actual images provided in the graphic boxes may be very different from one another. One could be a portrait of a person and the other a picture of a house.

Referring to magnification 165' shown to the right side of the magnifier glass for deflated File_1, it is seen that one of the graphic boxes 165c is that of a person's face while a second graphics box 165d is that of a building or a house. Additionally, there are different types of text runs enclosed within the given file having the name File_Name_4. A first stream of text 165a surrounds graphic box 165c and describes the face shown to the right. This text run is labeled as Text.1a. A second stream of text 165b surrounds the image of the house 165d, describes the house and is denoted as different text stream Text.1b. It is to be appreciated that different language flows are often used to describe a person (Text.1a) and to describe a house (Text.1b). Thus the symbol sequence statistics of Text.1a (165a) might be substantially different from that of Text.1b (165b). They may be substantially predictively unalike with respect to one another. It is to be appreciated that the various data streams, 165a-165d of File_Name_4 have respective positions in the coordinate frame 165xy of the document generated by File_Name_4.

In accordance with the disclosure, a file parsing operation 103 is automatically executed for each given file (i.e. 165) to identify the various different types of data streams (i.e., 165a-165d) contained within the composite file 165. The parsing operation is followed by a file fragmentation and routing operation 104 that routes the parsed and accordingly fragmented sets of data (i.e., 165a-165d) to different concatenation suitcases (i.e. 105a, 105b, 105c, 105d) depending on the type of data and the predictive alikeness of the parsed data relative to other data found in yet other files (166, ..., 167) of the same system. For example, a second file 166 is shown to also contain a plural number of graphic boxes 166.2c and 166.2d. The second file is also illustrated to contain surrounding text identified as 166.2a. Similarly third through Nth files (167) may be provided in the system having yet further text streams 167.Na and further graphic streams 167.Nc as indicated in FIG. 1F. The parser 103 automatically identifies the different types of data (e.g., text versus graphics and also the deflated symbol statistics of each) and designates a routing path to be taken by that data when being routed by router 104 into respective one of different concatenation suitcases (e.g., 105a-105d). For example a first group of predictively alike text runs from different files (text.1a, text.2a, ..., text.Na) is to be packed into first suitcase 105a and thereafter passed to a text-specific compressor 106a (i.e., a BWT-based compressor). Simultaneously the slightly different runs of text (text.1b, text.2b, ..., text.Nb) from the decomposed plurality of files is to be routed into second suitcase 105b which is later to be passed through text compressor 106a for forming (process 107b) compressed suitcase 166b. Similarly the face images found in files 165, 166, ... 167 are routed by router 104 for packing into a first suitcase 105c whose contained fragments are to substantially be comprised of predictively alike face images, Face_Image_1c through Face_Image_Nc. House images from the various files are separately routed into another image suitcase 105d. The contents of suitcases 105c and 105d are separately passed through a graphics-centric compressor such as 106b for formation (sequentially efficient compressions 107c, 107d) of the data packed and compressed in the corresponding deflated graphic suitcases 166c and 166d.

In accordance with the present disclosure the file parser 103 and the fragment router and concatenater 104 may be specialized to provide different routing paths 104ab (for text runs) and 104cd (for graphics frames) for respective text and graphic data sequences as well as yet further routing paths 104e for audio clips that are embedded in composite files 165, 166, ... 167. Yet another routing path 104f may be provided by router and concatenater 104 for routing video content (i.e. MPEG content) to a suitcase that specializes in packing video data and thereafter to a compressor (not shown) that specializes in compressing such video data. Similarly yet another routing path 104g may be provided for telemetry data that is passed to a telemetry specific suitcases and thereafter to telemetry specific compressors (not shown).

Figure 2C:
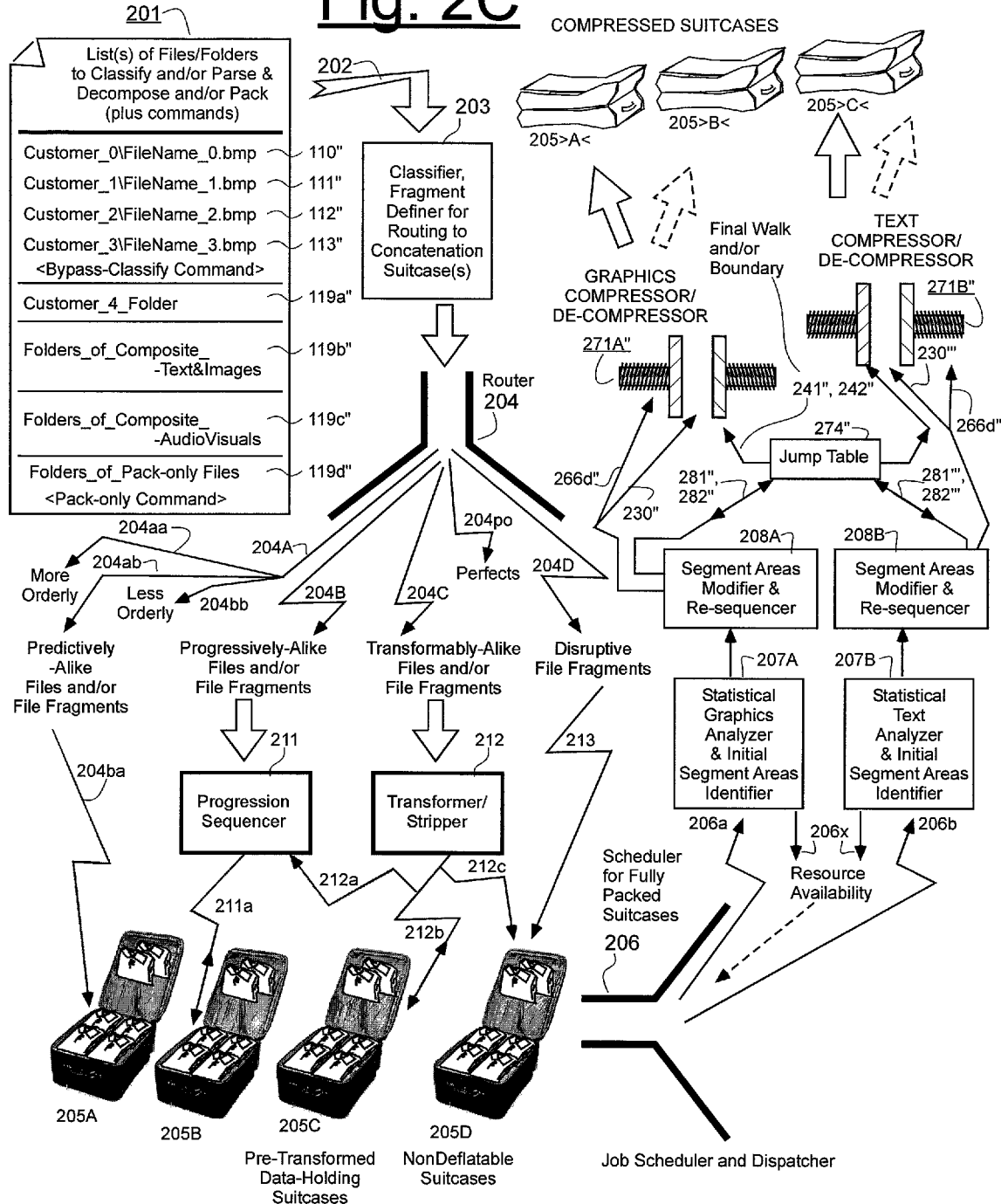
FIG. 2C is a schematic diagram of additional parts of a compression and decompression system that may be used in combination with parts such as shown in FIG. 2A.

Referring to FIG. 2C, the decision as to which files or file fragments are to be processed in a given time period by way of one or more processes such as those that decompose them and/or route them (204) into various deflated suitcases (205A-205D) or elsewhere (204po) and/or re-packing them (211) within the various deflated suitcases (205A-205D) and/or pre-transform (212) them prior to compression (217A", 271B") may be made by a first automated scheduler (not shown) that produces a job list 201. The job list 201 may list in ordered sequence, the names of files and/or folders which are intended to be classified and/or parsed and/or decomposed and/or packed into various suitcases. Although commands are not fully shown, the list 201 may include commands (i.e., the "bypass" of the classification step which is commanded under 110"-113") associated with each list item or group of list items and indicates whether the item(s) is/are to be only packed and not parsed or compressed or whether the item(s) is/are to be decomposed and packed and fully compressed. For example, item 119d' represents a set of folders containing relatively small files (e.g., less than 40 KB apiece) whose contents are merely to be packed into a suitcase and not compressed. Aside from files specifically identified in list 201 for packing only (119d"), a default program may run automatically in the background in a processing core of the system for locating all files that have a size of about 10 file storage blocks or less (e.g., less than 40 KB apiece) and are to be therefore at least considered for packing into a suitcase so as to reduce storage blocking slack if not to also be further sorted according to their predictive alikeness when being routed to and packed into respective suitcases and optionally compressed thereafter.

The job list 201 may include a presorted list of consecutive identifications of files which have already been classified as being predicatively alike to another and therefore as not requiring further classification or decomposition prior to being packed into a same suitcase. For example the bit-mapped files denoted as 110"-113" in FIG. 2C and corresponding to stream 118 of FIG. 1A are understood to be predicatively alike. These files 110"-113" have already been predetermined as containing portraits for example of women wearing the same feathered cap as shown in FIG. 1A. Further decomposition or reclassification is therefore not needed and a command to this effect may thus be included explicitly or implicitly in the job list 201 (i.e., below file identification 113").

By contrast, the identification of Customer_4_Folder at 119a" in FIG. 2C may implicitly or expressly include a command (not shown) for opening that folder and thereafter classifying the files found therein, so as to perhaps classify one of the found files (i.e., Customer_4\FileName_4.bmp) as belonging to the same suitcase as the files represented by identifications 110"-113". On the other hand, other files (not shown) within the Customer_4_Folder (119a") maybe classified as being predicatively alike to other different types of suitcases and/or as requiring decomposition and fragmentation before being routed and packed into various suitcases (205A-205D).

A next shown entry 119b" in job list 201 represents a folder containing a plurality of folders each having composite files including text and image items embedded in them. The command for processing this group of folders 119b" may be implicit or explicit and may command the processing system to classify the various files contained in the folders as being composite ones or simple ones and may further command the processing system to parse and decompose the composite files and route the respective fragments into different suitcases. Next item 119c" represents yet further folders which have composite files including perhaps audio visual material embedded into them and also requiring classification and/or parsing and decomposition into components that are for example text-only, motion-picture clips (e.g., MP3) and/or other forms of audio visual material. As mentioned above, the final item 119d" includes a command for packing the files found in these folders into nondeflatable suitcases such as 205D. Generally the identified files of entry 119d" will be small ones having the size equal to or substantially less than ten times the FSB value (i.e. 4 KB) of the given system.

Icon 202 represents opportunistic time slots during which job list 201 is scanned by one or more job processors and when one or more not-yet processed items listed in job list 201 are picked up by the opportunistic job processors and fed to a corresponding set of one or more file classifiers and fragmentors 203. If an item listed in job list 201 includes a command for bypassing classification and/or decomposition and/or compaction, then step 203 is bypassed and those process-bypassing files that need only packing are routed for example to suitcase 205D which suitcase will not be compressed but will still have redirection vectors (e.g., 146b of FIG. 1B) pointing to it. The one or more processor cores that perform operation 203 will respectively classify each of the files found in the listed object of job list 201 automatically and determine automatically whether that object is a composite one which needs to be decomposed into simpler portions such as text-only portions (see 104ab of FIG. 1F) or not. Moreover the processor cores of operation 203 will determine whether each of these decomposed objects needs to be fragmented into yet finer objects or not so as to become more predicatively alike to other objects already fragmented by the system. For example, in one embodiment image files such as 110' of FIG. 1B may be automatically fragmented into quadrants Q1-Q4 as shown and then each quadrant may be routed towards a different suitcase.

The routing decisions made by classifier 203 may generate explicit routing classifications that indicate whether a given file or its fragment or sub-fragment is deemed to be more orderly (204aa) or less orderly (204bb) than other predicatively alike fragments. The routing decisions made by classifier 203 may generate explicit routing classifications that indicate whether certain fragments of a classified filed are to be deemed as perfectly-ordered (204po) such that those fragments are to be reconstituted by filling in with all zeroes for example or by copying from a system retained boilerplate template (e.g., the company logo) rather than bothering to compress and later decompress such otherwise easily reproducible data fragments. The perfectly-ordered fragment data (204po) is to be understood as being routed to an automated programmer that programs a repetitive data sequencer (not shown) to generate the data of the perfectly-ordered fragment (204po) later when the original file is being recreated and the discarded perfectly-ordered data (204po) is to be back filled into its hole within the reconstituted file. The routing instructions may further generate indications as to whether a group of files or fragments are progressively-alike (204B) rather than all predicatively alike (204A) and therefore, due to the progressive alikeness of the files, extra work (211) needs to be done to properly re-sequence the positions of these files or fragments in a given suitcase (205B) so as to thereby produce a sequentially efficiently compressible progression (SECP) of such files or file fragments in the given suitcase (205B). Yet another routing decision may generate a machine-readable indication (204C) as to whether a group of files are not, in their present form, predicatively-alike or progressively-alike to other files or fragments but are nonetheless to be pre-transformed (212) so as to thereby become predicatively-alike or progressively-alike. Yet another routing command (204D) may indicate whether one or more files or file fragments are to be considered by the system as being highly disorderly and/or disruptive data and thus warranting routing into a nondeflatable suitcase 205D which will be only packed with disruptive data but not afterwards compressed.

Routing unit 204 complies with the routing instructions generated by classifier and/or fragmentor 203. Routing unit 204 routes the predicatively-alike files and/or file (sub)fragments along path 204A towards packing in corresponding suitcases such as 205A. The illustrated suitcase 205A is to be understood as representing a class of suitcases rather than just one where that class may be further divided according to whether the fragments contained within the respective suitcases are more orderly (having a much lower entropy level) 204aa or whether the files are comparatively less order (having a comparatively higher amount of entropy) 204bb or whether the files are comparatively medium 204ab in terms of the entropy possessed by the data sequences contained therein. Routing path 204A maybe therefore sub-divide the routing of files or file fragments flowing there along into much more finely result tributaries such as 204aa which is dedicated to packing highly orderly files or file fragments into a first suitcase containing predicatively-alike companions for those objects. Finer routing path 204bb may similarly direct its files or fragments to corresponding second suitcases that contain less orderly companions. Routing path 204ab may represent yet further files or fragments with an intermediate amount of disorderliness. The more orderly files or fragments 204aa can be compressed with great efficiency if they are not disrupted by the less orderly content of flows 204ab or 204bb. This is why the more orderly fragments of flow 204aa are routed into their own special suitcase rather than being intermixed with the less orderly content of paths 204ab and 204bb. However, in one embodiment, perfectly-ordered data fragments (204po) are not routed for compression, but rather for programming a sequential data generator (not shown, can be implemented in CPU 250 of FIG. 2A) that will later be called upon to generate the perfectly-ordered data fragment hen original file data is being reconstituted. Path 204ba generically represents one of the paths 204aa-204bb going to a generic suitcase 205A which receives corresponding predicatively-alike files or file fragments.

Files or fragments moving along routing path 204B are ones that may need re-sequencing after being initially placed within a given suitcase 205B so as to become more progressively alike relative to other files or file fragments placed in suitcase 205B. Accordingly these files or fragments are routed under control of a progression sequencer 211 which resorts them within suitcase 205B so as to produce a more efficiently compressible progression of such files in suitcase 205B. File location in a suitcase may be a function of other overriding system preferences however, such as those that provide for pre-fetch efficiency and/or shortened latency fetches. The operation of the progression re-sequencer 211 occurs in the background after files that are somewhat progressively alike files are first randomly thrown into suitcase 205B. Then progression re-sequencer 211 takes over and re-sequences the order in which the files or fragments are provided within suitcase 205B so as to produce a more efficiently compressible progressive packing of the suitcase.

The specific pre-compression transformations that are performed on files or fragments moving along routing path 204C may include simple strip out of noisy bits (or masking them with fixed patterns) and/or segmentation of their address spaces into different segment areas each containing internally-alike data and/or the formulation of jump tables (FIG. 6A) defining the progression of jumps to be taken between the formulated segment areas. Additionally or alternatively, the pre-compression transformation provided to files or fragments routing along path 204C may include remapping of symbols into an index table in accordance with FIG. 1E. Transforming/stripping unit 212 is put in charge for providing such pre-compression transformation operations to files or fragments arriving along path 204C. Originally all of the files or fragments of path 204C may be simply dumped into suitcase 205C. Then, afterwards, the transforming/stripping unit 212 reaches into the suitcase 205C and examines its contents to determine which parts need to have disruptive data stripped out from them or not. Appropriate inverse transformation instructions are formed and recorded at the time. This all occurs in the background as opportunistic time slots present themselves for accessing the storage devices that hold transformable suitcases like 205C. The stripped-out disruptive data, if any, is re-routed via path 212C and packed into a non-deflateable suitcase such as 205B. Redirection vectors and appropriate inverse transformation instructions are, of course, formed and recorded for the repacked data so that the original files can be reformed after decompression. The transforming/stripping unit 212 further analyzes remaining data within suitcase 205C to determine if resulting fragments after transformation require progression re-sequencing by unit 212 or not. If yes, those files or fragments are routed to progression sequencer 211 for placement into progressive suitcase 205B for re-sequencing of position. Once again, the redirection vectors are modified so that the original files can be recomposed during decompression. Finally, as mentioned files or fragments that have been already defined as being disruptive are simply routed via path 213 into a non-deflateable suitcase such as 205D. Once again the appropriate redirection vectors and appropriate inverse transformation instructions are formed and recorded so that these disruptive fragments may be filled back into their original positions during the data decompression and reconstitution process.

A compression job scheduler 206 may be provided in the system of FIG. 2C for watching the packing and/or reorganizing progress of respective suitcases 205A-205C and responsively determining when one of these suitcases is fully packed and ready for compression. The scheduler 206 also checks backflow reporting lines 206x for reports of available system resources (i.e., processor cores that have finished their previous tasks). Depending on availability of downstream compressing resources (e.g., 217A", 271B"), a fully packed suitcase such as 205A that contains graphics material may be routed via scheduling path 206a into a statistical graphics analyzer 207A. Alternatively, another suitcase from category 205A may be routed via scheduling route 206b to a processor core 207B that performs statistical analysis of text.

Unit 207A performs various statistical analyses on the graphic data within its supplied suitcase as time and storage bandwidth allows. The analyzer 207A may generate hard segment area boundaries such as 503 of FIG. 5A using the row by row scanning procedure mentioned above for scanner 530. Then the initial hard boundary results are passed downstream into unit 208A and also through there into the jump table 274" to define initial boundary and walk definitions 281", and 282" respectively. The segment areas modifier 208A proceeds to try to smooth out the hard boundaries and to perform trial and error compressions with the aid of graphics compressor 271A" all the while changing the boundary definitions recorded in the jump table 274" and optionally also the in-tile walk algorithms 282" when more optimal solutions are found via trial and error. When smooth boundaries (i.e. boundary approximating curves) have been finalized for the entire data window 230", the segment areas modifier 280A resorts the jump table 274" according to the finalized coefficients of gravity calculated for the respective, modified segment areas. The finalized boundary definitions 241" and in-tile walk definitions 242" are then fed from the jump table 274" to the graphics centric compressor 271A". Prediction model optimizing data 266d" that was learned by the segment areas modifier 208A during the trial and error segment modification runs is also fed to the graphics compressor 271A" as is the image frame 230". In response, the graphics compressor 271A" executes a sequence of compressions in accordance with the data stored with the jump table 274" and produces a correspondingly compressed suitcase such as 205>A< or 205>B<.

Similar processing may take place for suitcases that contain text strings rather than graphics images. Statistical analyzer 207B performs statistical analyses of the contained text and generates initial segment boundaries based on the statistical analyses. The initial segment boundaries may be modified if desired by segment modifier 208B. Definitions of jumps from one segment area of text to the next, as well as specific in-text walks 282'" may be stored in the jump table 274". The learned data is passed forward to a text-centric compressor 271B" such as a BWT based text compressor. The resulting compressed text may be stored in a deflated suitcase such as 205>C<.

The compression algorithms carried out by the compressors such as 271A" and 271B" are not limited to those that rely on an adaptive and/or non-adaptive predictor. Referring to FIG. 6B, LZ-type back pointing dictionary compressions may be employed in combination with prediction-based compressions. In one embodiment 650, a during-compression, addressing walk 648 is taken through a packed suitcase in accordance with a pre-defined walk (see for example FIG. 5C). The data stream 618 that is encountered during the walk is processed by a hatch window 652 of predefined length, for example 500 bytes or greater. A running hash window algorithm such as the Shah algorithm may be used for generating running hash values for each of the data words encountered along addressing walk 648. For each new data word, a corresponding hash value is stored in a temporary hash recording table 655. In one example where the input data window frame (i.e. 118 of FIG. 1B) is one megabyte long, a temporary hash recording table with 1 megabyte of entries is also created. This 1 megabyte hash memory 655 does not need to be recorded in permanent storage. It is used only temporarily for detecting (657) hash collisions. By way of example, let it be assumed that during a first span 616.1 of the encountered data stream 618, the hash window 652 generates a first hash and stores it in hash recording table 655. Let it be further assumed that later in the address walk 648 the running hash window (denoted as 653 now) encounters a second span of plaintext data 616.2 that is an exact duplicate of the plaintext span 616.1 earlier encountered by hash window 652. In such a case, the running hash window 653 generates a second hash value that is identical to the one earlier recorded in table 655. A hash collision detector 657 continuously tests the hash output from the current version 653 of the running hash window against the hash values that were earlier recorded in the temporary hash table 655. If two same values are detected, then the output 658 of the collision detector signals to a concurrent compression process 670 to temporarily stop receiving input data symbols from the input data 618 that is being read. A unique begin-of-skip delimiter 664 is instead written into the encoded output 662 of the compression engine and then a dictionary back-pointer 665 is inserted in the encoded output stream 662 of the compression engine. The back pointer 665 points back to the beginning of the first encounter of the duplicate plaintext 616.1. A second delimiter (optional 666) is then recorded after the back pointer 665 to indicate that compression of input symbols in stream 618 is to resume after the end of duplicate span 616.2. The collision detector 657 indicates to the compressor 650 to resume compressing with the plaintext input symbol immediately following the end of the second duplicate span of plan text 616.2. The compression engine 670 proceeds to do so as is indicated by the continued output of encoded data following skip over continuation point 666. When the collision detector 657 next detects another collision of identical hash values, the same process is repeated and yet another dictionary back pointer like 655 (not shown) is inserted at the appropriate position and a skip over is taken around the corresponding duplicate encounter of data and so on.

Referring to FIG. 1B, it should be noted that duplicate copies of data such as 616.1 and 616.2 of FIG. 6B are most likely to occur when very similar input files such as 110', 111' and 112" are packed one after the next in a same suitcase 118. Then as a compression walk 148 is taken through similar areas like 116.1, 116.2, etc., it is very likely that duplicate data will be encountered in region 116.2 that is the same as already compressed data that had been walk through during the system walk through in region 116.1. Rather than recompressing that same data again, the system 650 (FIG. 6B) bypasses the compression operation for that duplicate second data 116.2, inserts a back pointer like 665 and then proceeds with compressing non-duplicate data instead. Strain on system bandwidth is thereby reduced.

Later when a decompression operation 680 is carried out on compression output 662, the decompression walk 148*/648* receives the string of encoded data 163/662 that was produced by the original walk 148/648. As the walk along the code stream 662 proceeds (see graph 660 of FIG. 6B); when the encoded data 661 corresponding to the first span of duplicate plaintext 616.1 is encountered, a corresponding duplicate of the first encountered plaintext is produced in window span 616.1* in graph 651*. Decompression process 680 then continues along the encoded stream 662 until it encounters the unique back pointer delimiter 664. At that point the decompression algorithm 680 temporarily stops decoding the code stream 662 and instead interprets the next piece of data 665 in the code stream 662 as being a back pointer pointing to the beginning of the already decompressed first encounter of plan text 616.1*. In response, a forward copying operation 667 is carried which copies the data already produces in region 616.1* into the blank area of span 616.2*. Thereafter the decompression engine 680 picks up with encoded data 662 after delimiter 666 and begins to decode remaining data again. In this way it continues to render new data into the blank suitcase 118* following the location of span 616.2*. Very good compression results may be obtained with the illustrated combination (650) of prediction-based encoding 670 of the spoon-fed data 618 that had been made sequentially efficiently compressible (SEC) and with the use of the dictionary back point encoding 665 where very similar files have been packed into a same suitcase. The improved compression results have ramifications beyond that of merely reducing storage space in a storage bank.

Figure 7:
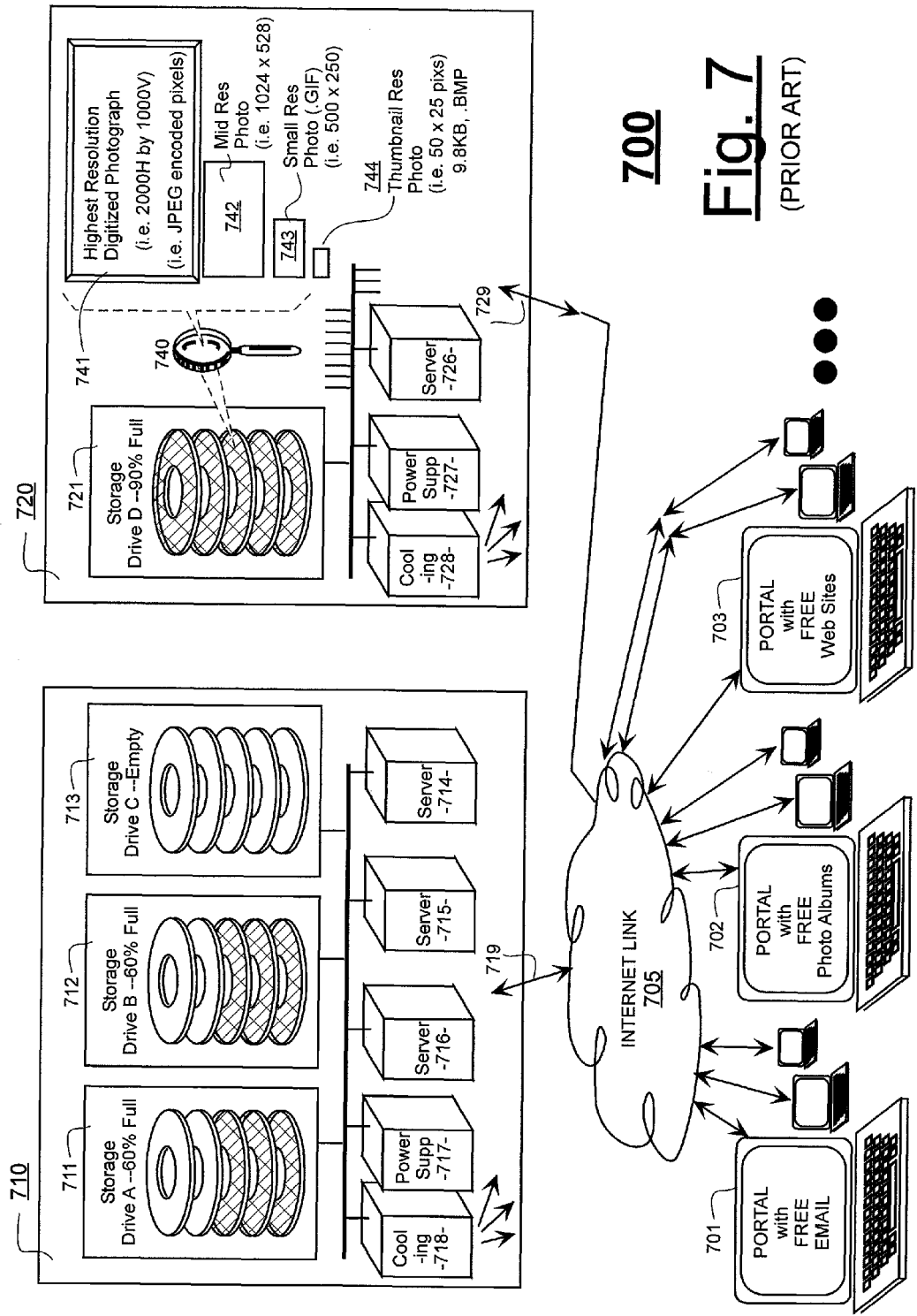
FIG. 7 illustrates two common aspects of internet web site hosting operations: (a) power wastage for spinning fragmented free space, and (b) storage consumed for hosting a same natural photograph as plural files of differing resolutions.

Referring to FIG. 7, a relatively conventional networked system 700 is shown comprised of a communications network 705 such as the Internet and a large plurality of client computers 701, 702, . . . , 703 coupled to that network 705 and a smaller plurality of server computers 714-716, 726- etc. and data storage units 711-713, 721 also coupled to that network 705 as shown.

Providers of so-called web services often provide free data storage to their clients in order to attract large numbers of such clients 701-703 into linking up with websites hosted by respective server computers (i.e. 714-716) of the web service providers. As indicated on the screen of exemplary client computer 701, a first operator of a first Internet portal site may provide all visiting clients with free email services. Often users of the free email services agree to be subjected to advertising banners while using the free email services. That's how the provider may obtain revenue despite the free offering of the email services to large numbers of potential users. A second operator of a second portal site may similarly provide clients with free photo album services (702). Yet a third portal operator may provide clients with free web site creating services (703) such allowing each user to have their own so-called blog for free.

The providing entities for such free network services often have large warehouses (710, 720) filled with large banks of data storage devices (711-713, 721- etc.) so as to meet the service demands of their respectively large populations of served clients (701-703). The data storage warehouses (710, 720) also include large numbers of high processing bandwidth server computers 714-716, 726 operatively coupled to the storage devices 711-713, 721 of the local warehouse for managing data traffic 719, 729 between the network 705 and the respective data storage banks 711-713, 721-etc. The high end servers 714-716, 726-etc. and massive data storage banks 711-713, 721-etc. need to be powered by correspondingly large electrical power supplies, i.e., 717, 727, etc. Additionally, because the high performance servers 714-716, 726-etc. as well as the massive storage banks 711-713, 721-etc. often generate enormous amounts of heat, large air conditioning or other cooling systems 718, 728-etc. must be provided within the warehouses 710, 720, etc. These cooling systems 718, 728, etc. may draw power from the power systems 717, 727, etc. just as do each of the rotating storage drives 711-713, 721-etc.

Because the portal operators never know when a large population of new or existing clients 701-703 may suddenly link up simultaneously via the network 705 and simultaneously request dumps of large amounts of new data into the free (or paid for) storage facilities 711-713, 721-etc., the operators (e.g. 710, 720) often maintain relatively large quantities of empty storage bandwidth (i.e., drive 713) actively spinning and immediately ready for receiving peak load deluges of new data for storage therein. As a result, it is not uncommon for the following situation to develop. A first storage drive A (711) has its hard drive platters filled to 60% of full capacity with user data while 40% of the theoretically available capacity for storing additional, small amounts of new data are homogeneously distributed as fragmented free spaces intermingled with the 60% of sectors (or of FSB's) filled with user data. A second hard drive B (712) similarly has 60% of its platters filled with user data and approximately 40% of free space that is scattered throughout the drive 712 in fragmented form (despite that which is schematically shown in boxes 711 and 712.) The amount of user data stored in respective drives A and B is too much (60%+60%=120%) to be fully migrated into a single third drive (i.e. empty drive 713). As a consequence, the operator of the portal site 710 suffers the costs for powering (717, 727) and cooling (718, 728) the spinning of the fragmented 40% free space storage on disk drives 711 and 712 even though these fragmented free spaces cannot be effectively used for absorbing large amounts of incoming new traffic from the clients 701-703. Accordingly, the operator of the portal site 710 suffers the costs for powering (717) and cooling (718) the spinning of the unfragmented 100% (or almost 100%) free space storage on disk drive 713 for absorbing large amounts of incoming new traffic from clients 701-703. Actual numbers may vary. This is just an illustrative example.

Figure 8A:
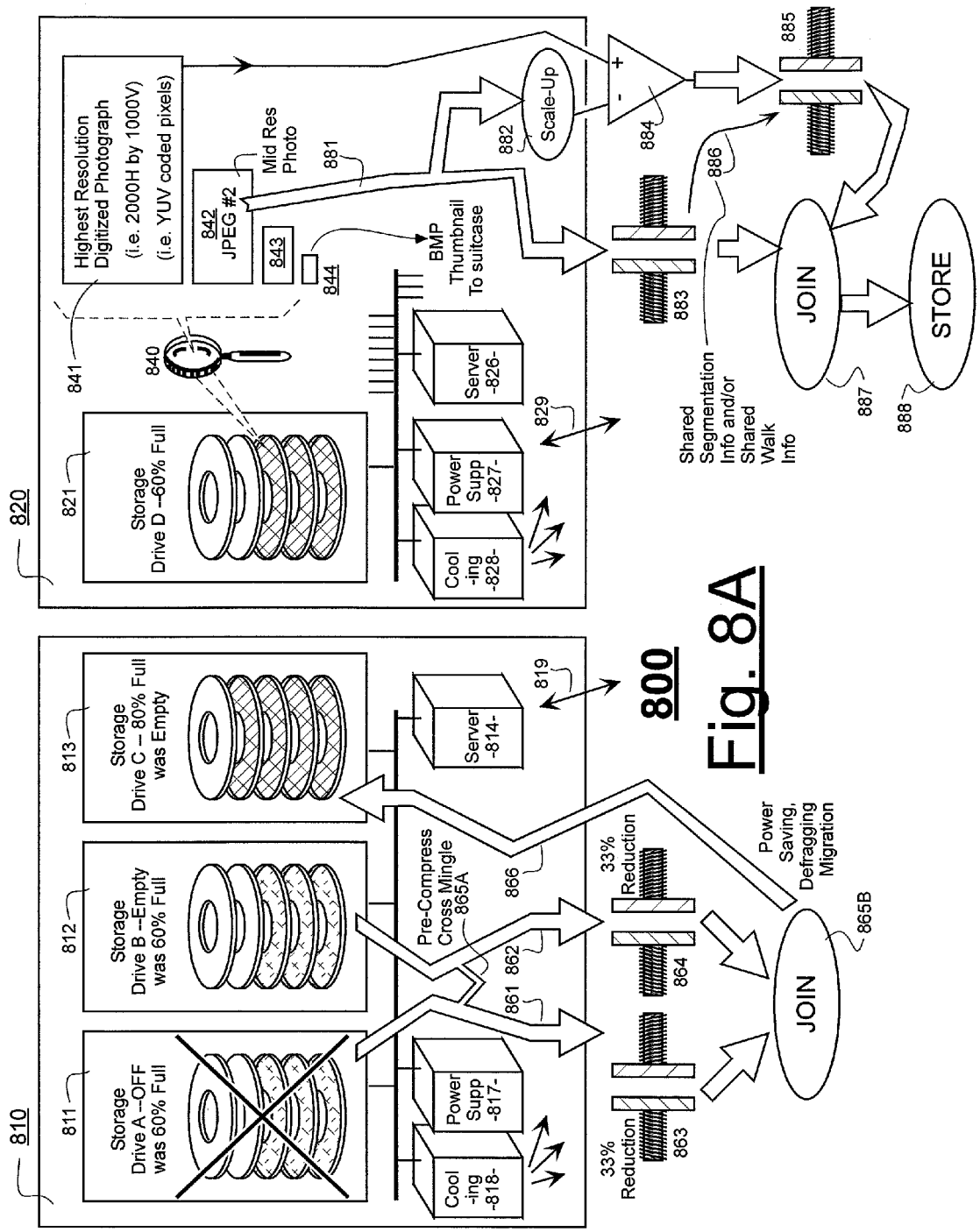
FIG. 8A diagrams two aspects of the present disclosure as may be applied to internet web site hosting operations: (a) reducing power wastage due to spinning fragmented free space, and (b) reducing storage consumed for hosting a same natural photograph as plural files of differing resolutions.

Referring to FIG. 8A a networked system 800 in accordance with the present disclosure is shown. The system 800 includes first and second compression means, 863 and 864 each capable of providing at least about 33% compression to the data stored in respective drives 811 and 812. When such approximately 33% reduction of storage size is applied to the data of storage area 811 by use of compression means 863, the original 60% of capacity data is reduced to 40% of capacity. Similarly when such approximately 33% reduction is applied to the data of storage drive 812 by use of compression means 864, its user data is reduced from occupying about 60% of capacity down to 40% of full capacity. The 40% of capacity amount of compressed data that is output from compression means 863 is joined (865B) with the 40% compression result from compression means 864 to produce an output result 866 which occupies about 80% of full capacity. This 80% amount of data is migrated into the previously empty disk drive 813 (Drive-C) while storage drive 812 (Drive-B) is converted into a substantially empty drive (close to 0%) by portion 862 of the compress-and-migrate step 866. Storage drive 811 (Drive-A) is converted into an essentially empty drive by portion 861 of the compress-and-migrate step 866. Given the storage drive 812 (Drive-B) is sufficiently empty for absorbing expected large amounts of new data from clients (701-703) during peak upload times, there is no need to keep yet substantially empty drive 811 (Drive-A) up and running and thus consuming power (817) as well as placing demand on system cooling resources (818). Therefore, in accordance with the disclosure, storage drive 811 (Drive-A) is completely turned off at least for the short term so as to thereby save approximately 33% of the cooling and power otherwise needed for running all of storage drives 811-813. Actual numbers may vary. This is just an illustrative example. The numbers of storage drives 811-813 may vary and they don't all have to be of equal capacities or speeds. The actual amounts of required, unfragmented free space may vary and does not need to occupy an otherwise empty drive (i.e., 812).

However, compression means such as 863 and 864 of FIG. 8A each includes a first means (not explicitly shown in FIG. 8A, see instead 175 of FIG. 1G, 240/233 of FIG. 2A and/or 203-204, 211-212 of FIG. 2C) for automatically formulating sequentially efficiently compressible (SEC) streams of data from the data sequences originally stored in drives such as 811-812 and a second means (i.e., 206 of FIG. 2C) for supplying these SEC streams (e.g., in the form of packed suitcases like 205A-205C of FIG. 2C) to a third means, namely, a prediction based compressor (see 260/270/271 of FIG. 2A) for corresponding compression therein. In other words, each of compression means 863 and 864 includes a prediction-based compressing engine that can benefit from the sequentially efficiently compressible (SEC) data streams formed from the original data found in drives 811-812 and can accordingly compress the information found in drives 811-812 efficiently in accordance with one or more of the storage reduction techniques disclosed herein.

In accordance with one aspect of the disclosure, corresponding SEC data segments from the different drives (e.g., 811, 812) are at times cross mingled into common suitcases (this being represented by commingling icon 865A) prior to compression so that the most alike data from the different drives 811-812 are packed into same suitcases prior to presentation of the concatenated segments to respective compression engines 863-864. The decision as to whether or not to cross mingle (865A) input data streams from different source drives into a same suitcase and/or whether to migrate the resulting compacted suitcase to a third drive (813) or leave the compaction result in the drive of origin of the majority of its source data is left to a system supervising process. Different system situations may call for different solutions.

The combination of the efficient storage reductions such as performed by 863-864 (including the concatenation 865A of alike segments from different drives into same suitcases) and the free-space reducing migrations such as performed by operation 866 allows operators of sites such as 810 to substantially reduce the amount of cooling (818) and/or power (817) required in their warehouses (i.e., 810). The amount of power reduction can be approximately 33% in a case like that shown in FIG. 8A where compression means 863 and 864 can provide at least approximately 33% size reduction for the information originally stored on drives 811 and 812. Such power reduction can significantly lower the operating costs of the network servicing center 810. Moreover, although not shown, such approximately 33% or greater size reduction can reduce time needed for data backup operations and thus enhance the client servicing productivity of the network servicing center 810. Of course the amount of compression actually achieved by compression means such as 863 and 864 can be highly dependent on the type of symbol sequences that are stored in storage drives 811 and 812. If the original data in drives 811 and 812 is highly disorderly (e.g., essentially random noise), then of course, compressors 863-864 will not be able to do much with such highly disordered, high entropy data. However, it is more often the case for the client-supplied data that is stored in drives 811-812 to be fairly ordered at one or more levels. If that is the case, the storage reduction techniques disclosed herein can significantly improve the amount of compression or other storage reduction (e.g., storage block slack reduction) achieved by compression means such as 863 and 864.

With regard to the probable similarity and/or orderliness of client provided data originally stored in units 811-812, momentary reference is made back to FIG. 7. The one or more web service providers that provide free email services (701) will probably have large numbers of storage drives that store large quantities of text streams where many of those text streams have similar data (i.e. an oft repeated "subject" line, an oft repeated "from" line, an oft repeated closing salutation such as "sincerely yours", etc.). Similarly many of the web sites which provide free photo album services (702) will have photographs stored thereat of similar types content (i.e. photographs of beautiful sunsets, photographs of mountains and trees, photographs of family members posing in front of a common tourist landmark, etc.). Although the various photographs belong to different clients 701-703, they can be repacked so that all photographs showing a same common tourist landmark and/or a substantially same beautiful sunset at the beach and/or substantially same tranquil nature scenes are respectively packed into suitcases of alike photographs with appropriate redirection vectors (see 146b, 146b' of FIG. 1B) being provided for fetching of such in-suitcase content by specific clients. With such repacking of similar photographs into suitcases with predictively alike other photographs, increased compression may be achieved in accordance with the disclosure provided herein.

Referring now to storage center 720 of FIG. 7, one common configuration used by many web sites that provide free photo album services (702) is that of providing multiple copies of a same image provided across a spectrum of possible resolutions and number of pixels per side (different sizes). Magnifier icon 740 shows one common configuration in which a corresponding storage drive 721 stores a collection of four or more photographs 741-744 of a same natural scene. A first, 741 of the digitized photographs is rendered at a highest resolution (i.e. 2000 horizontal pixels by 1000 vertical pixels) among the different resolutions of the rendered copies 741-744. This highest resolution photograph 741 is often stored in the form of JPEG encoded pixels. A second or medium copy 742 of the same scene is also usually also stored as a JPEG image however with usually ½ to ⅓ as many pixels in the respective horizontal and vertical directions. A 50% reduction of number of pixels per side of course produces a 75% reduction in number of pixels over the area of the picture. Yet a third or so called "small" version of the same scene 743 may be stored with a slightly different encoding algorithm, say GIF. Finally a so called thumbnail version of the photograph has a very small number of pixels in the horizontal and vertical direction (e.g., 50×25=1250 pixels total or about 9.8 KB if 8 bits per pixel) and is often encoded as a bitmap image of substantially less than about 40 KB of data.

It should be clear from the disclosure provided earlier above that the storage of thumbnail resolution photographs having a size (i.e., 9.8 KB) that is not just under an integer multiple of the standard file storage block size (i.e. 4 KB) used by the operating system wastes storage space due to FSB slack (i.e., 12 KB−9.8 KB=2.2 KB of slack). Additionally it should be clear from the above that the multitudes of clients 701-703 who wish to store digitized high resolution photographs in the storage facility 721 of service center 720 will generally have photographs of natural phenomena such as beautiful sunsets, forests filled with tranquil trees and family members huddled around popular tourist attractions rather than artificially-generated computer pictures in need of storage. Accordingly compression of such naturally sourced images is more difficult than compression of computer generated images. The various techniques disclosed herein for producing sequentially efficiently compressible (SEC) data can greatly help in reducing the amount of storage space 721 needed for storing the information of such multi resolution photographs 741-744.

A brute force compression scheme (not shown) may take only the highest resolution image 741, compress that first image 741 (to the extent possible) and then store that compressed version alone in unit 721. Then, when a client (i.e. 702) requests a medium or small resolution copy 742-743 of the same photograph, the system decompresses the highest resolution compressed version 741* (not explicitly shown) and then scales down the decompression result to provide the user with the desired resolution. However, this brute force approach can create significant latency problems and result in much wastage of system resources. The number of pixels in the highest resolution image 741 of the example is about four times larger than the number of pixels in the 50% scaled down version 742. About 75% of the decompression work done to reconstitute the highest resolution image 741 is thrown away when the 50% scaled down version 742 is instead presented to the user. The waste is even greater when the user asks only for say the 75% scaled down version 743.

FIG. 8A illustrates an alternate method 881-888 that can provide significantly improved results. Rather than compressing the highest resolved one 841 of the originally stored plurality of photographs 841-844, the system 800 picks a medium resolution photograph for compression by compression means 883. The above described tricks for generating sequentially efficiently compressible (SEC) data streams from the selected source image 842 are of course used by compression means 883. Those tricks may include the machine-implemented generation of segment area boundary definitions and/or machine-implemented generation of compression walk definitions in accordance with the present disclosure. In accordance with this disclosure, segmentation information and/or walk defining information 886 that is produced by compression means 883 is scaled and shared with soon-described, other compression means 886. This sharing of information can greatly enhance the compression efficiency of the compression means 886. It has been found that picking the medium resolution photograph 842 with its number of pixels per horizontal and/or vertical sides being roughly ½ to ⅓ that of the corresponding horizontal and vertical number of pixels in the highest resolution image 841 generally provides good results. Image fetching process 881 passes an inflated copy of the medium sized photograph 842 to a scaling unit 882. The scaling unit 882 scales the size of inflated image 842 upwards (e.g., by vector scaling) to match the number of pixels horizontally and vertically of the highest resolution photograph 841 although, of course, the scaling up process 882 does not actually improve the resolution of the fetched photograph 842. Instead, it often merely causes the number of same-way defined pixels to be multiplied by an appropriate scaling factor. A difference calculating unit 884 automatically generates a stream of delta values representing the differences between the individual pixels of the inflated version of the high resolution image 841 and the individual pixels of the scaled up version of the medium resolution photograph 842. These delta values are fed to the other compression engine 885. At the same time, the segmentation information and/or walk information 886 that had been generated by compression engine 883 is scaled upwards by an appropriate factor and forwarded to compression engine 885. Compression engine 885 uses the shared information 886 to enhance its abilities to compress the deltas data generated by unit 884. Detailed examples will be given in FIGS. 8B-8D. The results of first compression 883 and second compression 885 are joined by unit 887 to define a composite representation of both the medium resolution photograph 842 and the high resolution photograph 841. This composite version is stored in step 888 into the local storage drive 821 of the service site 820 in place of the original data 841-843.

In a first case; where a user wishes to see only the medium resolution photograph 842, the stored version of 842 is decomposed out of the joined version 888 and passed through an inverse compression means corresponding to means 883 to thereby reproduce the medium resolution photograph 842. 100% of the work performed in supplying the medium resolution photograph 842 is used. (Contrast this with the case where the highest resolution photograph 841 was compressed, decompressed and then 75% of the work thrown away.)

In a second case; where a user (i.e. 702) instead requests a copy of the high resolution photograph 841, an inverse to compression operation 885 is also executed. The difference values produced from that decompression (885\* not explicitly shown) are added to a scaled up version (produced by unit 882) of the reproduced medium resolution photograph 842. This in turn reproduces the high resolution pixels of original image 841. It has been found that the compressed and joint outputs 887 of this process often consume less storage space 888 than do individual compressions of photographs 841 and 842 taken alone. With regard to thumbnail photographs such as 844, these are not compressed at all but rather stored as is (i.e. in bitmap format) into corresponding packing suitcases. The packing of the bitmap thumbnails into suitcases helps to significantly reduce FSB-induced slack and thereby reduces storage space needed for such thumbnail pictures. If a small resolution photograph such as 843 is desired, the medium version 842 is decompressed and then scaled down to produce the smaller version 843.

Figure 8C:
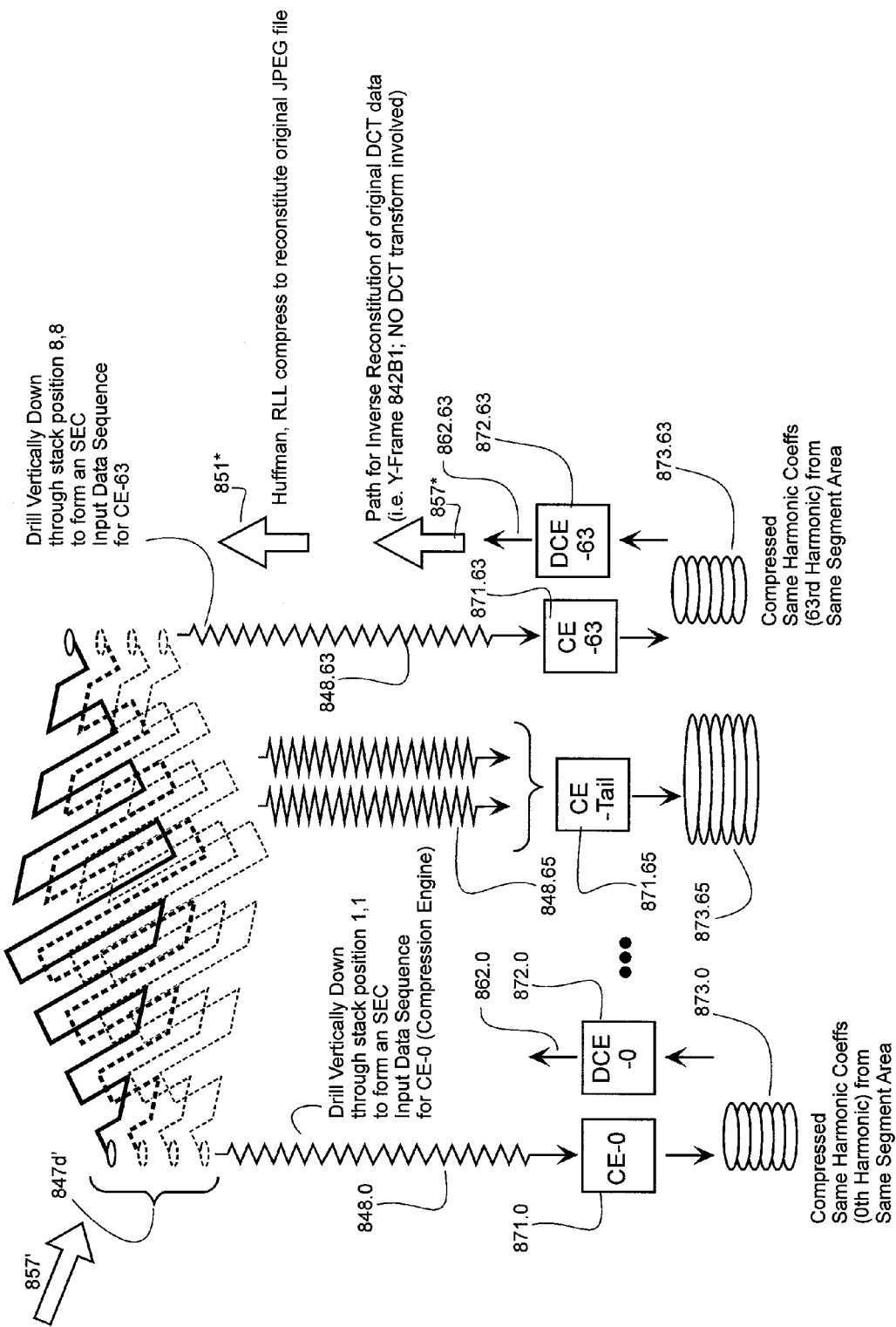
FIG. 8C explains the drill-down sampling operation taken through a stack of DCT zig-zags grouped from a same segment area.

Referring to FIG. 8B, a specific set of processes 850 for efficiently compressing JPEG encoded photographs is detailed. Item 842A (top left) is a JPEG encoded file corresponding to item 742 of FIG. 7. It is to be understood that one or more of the specific set of processes 850 detailed in FIGS. 8B-8D are automatically carried out by corresponding ones of elements 881-888 in FIG. 8A. In a first step 851, the compressed DCTC information in the JPEG encoded file 842A is decompressed by conventional JPEG decompression means to thereby produce three planes 842B1-842B3 respectively each filled with a plurality of 8-by-8 matrices (8×8 matrices) of DCT coefficient data (discrete cosine transform coefficients). The Y, U and V planes 842B1-842B3 of DCTC data are collectively referenced here as group 842B. Magnifier icon 852 shows an exploded view of one of the 8×8 DCT matrix data structures, namely, matrix 842B.xy which is found at a given x, y position in the Y plane 842B1 of group 842B. In accordance with industry standard JPEG specifications, there are 64 discrete cosine transform coefficients (DCTC's) distributed in a zig-zag fashion (568z') about the 8×8 data structure. (The illustrated zig-zag 568z' may not be a perfect rendition of the JPEG standard. Readers are directed to publications by the Joint Photographic Experts Group standards group (www(dot)jpeg(dot)org) for more precise layouts of the JPEG standard zig-zag and the distribution of DCTC's there-along.) A head portion of the zig-zag 568z' will contain the base harmonic DCT coefficient, 568B', the second harmonic coefficient 568c', and so forth. The tail end of the zig-zag will contain the $63^{rd}$ harmonic coefficient at position 568d'. Typically, because the $63^{rd}$ harmonic coefficient 568d' is usually a zero (0) or another small number (i.e. +1 one or −1) due to quantization effects, and because the most others of the tail portion are small numbers for the same reason, a run length limited (RLE) compression technique is used in file 842A for compressively representing the $63^{rd}$ harmonic as well as earlier ones of the high frequency harmonics that are contained within a tail portion of the zig-zag 568z'. Huffman encoding is used for compressively representing the base harmonic and other DCTC's in the head portion and/or middle portions of the zig-zag. Use of Huffman and RLE encoding for representing the DCT coefficients in original file 842A is known to those skilled in the JPEG arts. Readers are directed to publications by the Joint Photographic Experts Group standards group (www(dot)jpeg(dot)org) for more precise descriptions of the specific encoding and decoding specifications.

After the DCTC frames group 842B is formed in step 851 by use of Huffman and RLE decoding of original file 842A, the DCTC frames group 842B is subjected in step 853 to an inverse DCT transform 853. The inverse transform is executable individually on each of the 8×8 DCT matrices (i.e., on 842B1.xy). More specifically, when individual inverse transform 853.xy is performed on the 8-by-8 Y-plane DCTC matrix, 842B1.xy, the result is an 8-by-8 matrix 843Y.xy filled with luminance components Y1, Y2, Y3, etc. corresponding to the same x, y position in the YUV coded image frame 843yuv of the picture represented by original file 842A and corresponding to the same x, y position in the DCTC coded frame 842B. Magnifier icon 854 focuses on the x, y position of plane 843Y and magnifier icon 852 focuses on the same corresponding x, y position of plane 842B1 to thereby indicate the geographic commonality between DCDT 8×8 matrix 842B1.xy and Y components 8×8 matrix 843Y.xy.

Recall that individual inverse transform 853.xy is part of a larger scale inverse transform 853 that is carried out on each of the DCTC matrices 842B1-842B3 to thereby create corresponding Y, U, and V component matrices, namely, 843Y, 843U and 843V each containing respective luminance and chrominance components of the image represented originally by JPEG-encoded file 842A.

In accordance with the present disclosure, each of the pixel component planes 843Y-843V is processed by a segment-area isolating operation 855 such as for example the one shown in FIGS. 5A-5D to thereby create respective segment area boundary definitions (i.e., 845y) overlaying the respective Y, U and V planes as is indicated at 843Y' 843U' and 843V' (hereafter also the overlaid YUV planes group, 843y'u'v'). Segmentation of each of the planes 843Y, 843U, 843V, into tessellated segment areas may be done on a plane-by-plane individual basis or collectively for all three of the planes at once. In the latter case, each of the overlaid or segmented planes 843Y'-843V' will have a same set of tessellated segmented areas (i.e., 845y) overlaid on it. In other words, the shape of segment area 845y projects vertically down through the stack 843y'u'v'. On the other hand, if segmentation 855 is performed on a plane-by-plane individual basis, the boundaries definition of segment area 845y may not necessarily be shared in lower planes 843U' and 843V'.

In a next machine-implemented step 856, the segment area boundaries definition created by segmentation step 855 is copied over using a 1:1 scaling factor to overlay the corresponding DCT frames of group 842B thereby the stack of plaintext DCTC frames and the overlaid segment area boundaries shown at 842Y'-842V' (hereafter also the 1:1 overlaid YUV planes group, 842B'). It is acceptable to copy the segment area boundaries of the Y, U and V filled planes 843Y'-843D' directly over to the DCTC filled planes 842Y'-842V' using a 1:1 scaling factor because each of the 8×8 matrices in the YUV domain has a same x,y location as its corresponding 8×8 DCT zig-zag matrix in the DCT domain. See again the individual inverse transform relationship 853$xy$ between the exemplary DCTC matrix 842B1.$xy$ and the luminance matrix 843Y.$xy$ shown at the top of FIG. 8B.

For purpose of further illustration, consider segment area 845$y$ of the luminance plane 843Y'. Segmentation process 855 has assured, to one extent or another, that all or a substantial fraction (i.e., 50%, 75%, etc.) of the luminance (Y) components bounded inside segment area 845$y$ will define an SEC data stream when a correspondingly predefined sampling walk (not shown, could be a U-turning walk) is taken through the address space of segment area 845$y$. The predefined walk may include U-turning major walks such as 543-546 shown in FIG. 5C as well as in-tile minor walks such as shown in 561-564; where for the latter case, each sub-tile area may include data extracted from a corresponding 8×8 matrix (i.e., 843Y.$xy$) of the respective x, y coordinate. Magnifier icon 846 of FIG. 5C, incidentally, does not show this concept of sampling through predictively alike Y luminance values. Instead, this concept could be constituted by a tile such as 568 containing the Y1 component of a first 8×8 matrix (i.e., 843Y.$x1y1$) in a first subtile area, followed by the Y1 (not Y2) component of a next 8×8 matrix (i.e., 843Y.$x2y2$) in its next abutting subtile area (area of 568), and so forth, where $x1y1$ corresponds to a first coordinate in the Y-frame 843Y' and $x2y2$ corresponds to an immediately adjacent coordinate in frame 843Y' and both of $x1y1$ and $x2y2$ are inside segment area 845$y$.

Because an SEC-stream spoon-feeding walk as described immediately above and taken in segment area 845$y$ will generally produce an SEC data stream in the luminance domain, a similar walk can be taken in corresponding segment area 845$d$ of the DCTC domain to also produce an SEC-stream of data, where this time (in 845$d$) the streamed data represents a sequence of DCT coefficients. The reason that an SEC stream will generally result is because there is a one for one positional correspondence between the 8×8 matrices in the Y-frame 843Y' and the 8×8 matrices in the DCTC filled frame 843Y'. However, the SEC nature of the data stored in segment 845$d$ is not apparent on first blush. Examination of the DCTC data stored along the zig-zags (i.e. 568$z'$) of its 8×8 matrices (i.e. 842B1.$xy$) will reveal relatively large magnitude values such as +360, or −359, etc. at or near the head end portion of the zig-zag and relatively small values such as −1, +1, 0, 0, etc. near the tail end (568$d'$) of the zig-zag. The sequence of data values found moving along a single zig-zag is not inherently SEC. In accordance with the disclosure, the DCT zig-zags of segment area 845$d$ are considered as being stacked vertically one above the other as is shown at 847$d$ (this is a virtual stacking and need not be done physically). Based on this consideration, it may be understood that a vertical drill-down and sampling through the positions of all the base harmonic positions (DC coefficient position 568$b'$) in the stack 847$d$ will often produce a sequence of very similar base harmonic coefficient values (i.e., +360, +359, +360, +358, +361, . . . ). Similarly a vertical drill down through all the second harmonic positions (568$c'$) of the zig-zags stack 847$d$ will also produce an SEC stream of data values (i.e., +24, +22, +24, +25, +23, . . . ).

Referring to FIG. 8C, step 857' represents the submission of the vertical drill down samplings as respective data streams (i.e., 848.0 through 848.63) to respective, prediction-based compression engines (i.e., 871.0 through 871.63). More specifically, and by way of example, a first drill down through the base harmonic positions of zig-zag stack 847$d'$ forms the sequence 848.0 of base harmonic DCTC's which is submitted to a first compression engine CE-0 (engine 871.0). The encoded output 873.0 of engine CE-0 will be a very efficiently compressed sequence because its input data stream 848.0 was caused to be a substantially SEC data stream by the drill down sampling process 857' and by the preceding segmentation step 855 and boundaries copying step 856 (see FIG. 8B). Unit 872.0 represents the inverse operating unit to compression unit 871.0. (In one embodiment, 871.0 corresponds to encoder 271 of FIG. 2A and 872.0 corresponds to decoder 272.) To recreate the original stack 847$d'$ of zig-zags from the output 873.0 produced by compression engine 871.0, the encoded data 873.0 is passed through decoding unit 872.0 to produce reconstituted data stream 862.0 which is the same as the input stream 848.0 earlier provided to the compression engine, CE-0. Reproduced data stream 862.0 is streamed up and dropped in sample-wise to thereby re-fill the respective zero harmonic positions 568$b'$ in zig-zag stack 847$d'$ which originally resided there at the time of drill-down sampling step 857' to thereby reconstitute that vertical column portion 568$b'$ of the stack of zig-zags 847$d'$. It is to be understood that at the beginning of reconstitution that all positions in the zig-zag stack 847$d'$ are empty because the original data of original file 842A, of decompressed group 842B and its overlaid counterpart 842B' had been erased from storage and replaced by the much more compact, encoder output 873.0. However, the definition of segment area 845$d$ has been preserved in storage (where that definition can be by way of boundary approximating curves—see 573 of FIG. 5D). Also a representation that defines the addressing walk taken during compression within segment area 845$d$ has been preserved in storage (where that definition can be wholly or partly an implicit one if the system calls for U-turning major walks that always start in the top left corner of each segment area and/or for in-tile minor walks that comport for example with what is shown in FIG. 5C). Thus by recreating the boundaries of segment area 845$d$ on a blank plane that will become DCTC-filled plane 842Y' and by taking the predefined addressing walk inside the recreated segment area 845$d$ and dropping in the data of reconstituted stack 847$d'$ (zig-zags) accordingly, plane 842Y' will be recreated.

Still referring to FIG. 8C, just as the sampling drill down was taken during compression and afterwards during decompression through the base harmonic positions 568$b'$ of stack 847$d'$, similar vertical drill downs are performed (in one embodiment) through each of the other individual matrix positions (568$c'$ through 568$d'$) of stack 847$d'$ to thereby generate with each drill-down, a corresponding stream of substantially SEC stream of data for respective input into compression engines CE1 through CE-63 (not all shown) and later output from respective decompression engines DCE-1 through DCE-63 (not all shown). For sake of illustrative brevity, only the last such compressing drill down is shown in FIG. 8C as generating the substantially SEC data sequence 848.63 which is supplied to compression engine 871.63 to thereby generate encoded (and much more compact) stream 873.63. The later encoded stream 873.63 may later be passed through decompression engine 872.63 to reproduce the SEC stream as output 862.63. Then inverse process 857* finishes filling the last vertical column of DCTC data into position 568$c'$ of stack 847$d'$, repeats the same for all other stacks formed from all other segment areas (only two shown) of planes group 842B' and thereby completes the reconstitution of the original DCT domain frames 842B1, 842B2, and 842B3. Note that no DCT transform or inverse DCT transform (i.e., 853) has been required in the reconstitution process. Thus the reconstitution process can proceed very quickly even if the original compression process (steps 851, 853, 855, 856, 857, methods of units 871.0-871.63) took a much longer time. Inverse process 857* is followed by an inverse step 851* (the counterpart to 851) which performs a Huffman compression and RLE compression to thereby reconstitute the original JPEG file 842A. The reconstituted JPEG file 842A is then presented to the user transparently without the user knowing that the file had been instead compressed and saved as encoded stacks 873.0 through 873.63 plus their segment area boundary definitions.

It is not necessary to perform 64 individual compressions and 64 individual decompressions per the above initial explanation of FIG. 8C. In an alternate embodiment, groups of predicatively alike DCT coefficients from alike positions on the zig-zag (e.g., the highest harmonic coefficients) are grouped together and presented to a single compression engine to form a combined stack. More specifically, the higher frequency harmonics of each zig-zag tend to be compressively alike and constituted of small values between say, $-2$ and $+2$; more often than not with their being simple zeroes. Accordingly, a tail portion of the stack of zig-zags is combined as SEC data sequence 848.65 and presented in unison to a shared engine 871.65 to thereby generate a compressed stack 873.65 representing multiple positions along the tail portion of the stack of zig-zags 847d'. The same concept may be used for predictively alike upper and lower halves of the middle portion of the zig-zag stack if such are present. The predictively alikeness of different drill downs through the zig-zag positions 568b'-568d' may vary from application to application. Individualized compression engines such as 871.0 may still be used for the lowest frequency harmonics of the zig-zag stack 847D', especially for the base and second harmonic coefficients.

Referring back to FIG. 8B, numerous extensions of the basic method may be practiced for purpose ways of compressing the higher resolution JPEG file, 841A. At least three different permutations 858A-858C will now be described. In all three of the different methods, the original JPEG file 841A is first decompressed 860 to undo the Huffman and RLE encoding of its represented DCT coefficients. This produces a corresponding set of DCT planes, 841Y', 841U' and 841V' as shown (hereafter also the to-be-overlaid DCT planes group, 841B and the post-overlay DCT planes group, 841B'). Then, in accordance with a first, 858A of the numerous possibilities, a copy of the segment area definitions generated by segmentation operation 855 (i.e. boundaries definition 845y) is obtained and appropriately scaled upwardly (1:n*m) to a larger size that corresponds with the scaling up from medium resolution JPEG image 842A to higher resolution image 841A. In general, the original high resolution JPEG photograph 841A has n times m (n*m) as many DCT coefficients in it as does the middle resolution photographs 842A; where n and m are the horizontal and vertical scaling coefficients (each usually greater than unity) for transitioning from the resolution/size of the middle resolution photograph 842A to that of the highest and biggest resolution photograph 841A. Techniques for vector-based scaling of boundary definitions in accordance with horizontal and vertical scaling factors (n and m) are known in the art. The scaled up copy 845dx of the boundary definition for segment area 845d is overlaid on plane 841Y' to thereby encompass approximately n times m as many DCT coefficients as encompassed by the smaller segment area 845d overlaid over planes 842Y' on the left side of FIG. 8B. It is to be understood that the values of the greater number of DCT coefficients in segment area 845dx will usually be slightly different than those found in smaller segment area 845d. However the differences tend to be relatively small.

In accordance with a next step 844a of first process 858A, a copy of segment area 845d and more particularly its enclosed DCT coefficients is scaled up according to a 1:(n*m) scaling factor to match the size of segment area 45dx. In the scale up process 882A, the DCT values found in smaller area 845d are duplicated approximately (n−1) times horizontally and (m−1) times vertically to thereby fill in the additional number of matrix slots found in the scaled up version of small segment area 845d. The scaled up DCTC's (882A) are applied to a negative input of subtractor 884A while the corresponding DCT coefficients from the higher resolution and counterpart segment area 845dx are applied to a positive terminal of subtractor 884A. The resulting delta values 884B are stacked according to the schematically illustrated stack 847ddx (where "ddx" indicates the deltas obtained from the coefficients found in segment area 845dx minus the coefficients found in the 1:(n*m) scaled up version of area 845d. Without going into further details here, it may be appreciated that vertical stack 847ddx may be processed in a substantially same way as stack 847d was processed in FIG. 8C, namely, by vertically drilling down each of the matrix positions in the stack of zig-zags to thereby generate SEC data streams and thereafter supply them to one or more prediction-based compression engines (i.e., those with adaptive predictors). The subtractor 884A tends to generate relatively small difference values due to the closeness of values between the DCTC's in the low resolution segment area 845d and the corresponding DCTC's in the high resolution counterpart segment area 845dx. Such relatively small difference values 884B are easier to compress then the original large magnitudes that may often be found for example in the large DCT image frames 841Y-841V output by decompression process 860. In compressing the vertical drill down outputs of zig-zags stack 847ddx, the same technique of combining tail sections and mid sections as was used in FIG. 8C may also be used for zig-zag stack 847ddx. Reconstitution also follows a similar path except that a counterpart addition unit (not shown) is of course provided to provide the inverse transformation for subtractor 884A and that group 842B' is first reconstituted from compressed streams 873.0-873.63/65 before group 841B' can be reconstituted from its respective streams of compression code (not shown).

To recap, the described first method, 858A of FIG. 8B relied on a sharing of segment area boundary definitions (i.e., 845d) between the first compression process (that used in drill down process 857) and the second compression (that used in the drill down through the scaled differences-containing stack 847ddx). Referring to FIG. 8D, it will now be shown how address space walking information generated by a first data re-sequencing process 857B (reordering process 857B) may be copied (and optionally scaled) and then shared for use in walking the DCT storing address space of high resolution frames 841Y'-841V' (group 841B"). Operation 857B saves the DCTC's of frames 842Y'-842V' (group 842B") into sortable table 874 together with their corresponding coordinates, (i.e., x, y coordinates). Then the table 874 is sorted with keying on the DCTC values so as to thereby generate a highly ordered sequence of DCTC magnitudes (either highest first or lowest first) when traversing sequentially down the sorted table 874'. A corresponding sequence of the respective coordinates (x, y) of the sorted DCTC magnitudes is provided by the post-sort table 874'. By walking along the addressing sequence defined by the x, y coordinates in post-sort table 874', one would find a highly predictable sequence of corresponding DCTC values along that walk. If the same sequence of coordinates x, y in the post sorting table 874' are copied, scaled, and applied (858B') to the larger DCT matrices 841Y'-841V', the data produced by such a walk will also be generally highly ordered, although usually not as exactly ordered as that of the DCTC values in sorted table 874'. Nonetheless, the DCTC magnitudes 858BB' output from taking the scaled up walk 858B' will be relatively well ordered and thus will constitute SEC data that can be applied to compression engine CE-M. The compressed DCT coefficient stream 873.66 that is generated by compression engine CE-M may be reversed by way of a counterpart decompression engine DCE-M and a same taken walk to thereby reform (857B\*) the original stream of DCTC values 858B'. The original, high resolution DCT group 841B" is thereby reconstituted and then Huffman and RLE compressions 860\* are performed to thereby recreate the original high resolution JPEG file 841A. The reconstituted JPEG file 841A is then presented to the user transparently without the user knowing that the file had been instead compressed and saved as encoded stacks 873.0 through 873.63, 873.66, plus their segment area boundary definitions.

In yet a third variation 858C on the basic theme, a subtractor 884C is used to generate DCTC deltas between a scaled and walked copy 882C of post-sort table 874' and DCTC's 858BB' obtained from the same walk through high resolution frames 841Y'-841V'. The output 858C' of the subtractor forms an SEC data sequence which is fed to compression engine CE-N. The corresponding compression output is shown as code stream 873.67. Reverse decompression and reconstitution is performed by adding the post-decompressions deltas (858C') to the DCTC coefficients of the scaled version 882C of sorted table 874' while performing the same sorted walk 858B'. This reproduces frames 841Y'-841V'. Thereafter, process 860\* performs the standard Huffman and RLE compressions to reproduce the original high resolution JPEG file 841A. Various other permutations on this idea of sharing same walk information (i.e., 858B') between compression engines or sharing same segmentation area boundary definitions (858A) may be devised by those skilled in the art after appreciating the present disclosure. For example, sort table 874 may contain center of gravity coefficients of segment areas rather than individual DCTC's and information sharing step 858B' may then constitute a sharing of both scaled-up segment area definitions and the jump sequence between the scaled-up segment area definitions.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

By way of example, it is understood that the configuring of one or more storage reducing and data re-inflating machines (e.g., 140 of FIG. 1A, 200 of FIG. 2A, 814 and/or 826 of FIG. 8A) in accordance with the disclosure can include use of a computer-readable medium (e.g., 143 of FIG. 1A) or another form of a software conveying product or a machine-instructing means (including but not limited to, a hard disk, a compact disk, a flash memory stick, a downloading of manufactured instructing signals over a network (e.g., via links 819, 829) for instructing an instructable machine (e.g., 819, 829) to carry out one or more of the various storage reducing and/or data re-inflating activities described herein or equivalents thereof, where such activities (e.g., FIGS. 1F, 1G, 2C) can include: classifying of files for thereby grouping together sequentially efficiently compressible (SEC) one of the classified files are SEC fragments decomposed out of those files, routing classified files and/or fragments to different concatenation suitcases (e.g., 205A-205D of FIG. 2C); pre-transforming data from files or file fragments (e.g., 212) so as to thereby produce sequentially efficiently compressible (SEC) data streams; segmenting the data of files or file fragments to define segment areas containing predictively alike collections of symbols; defining U-turning or other continuum based walks through segment areas; defining jump tables (i.e., 274") for jumping from one segment area to a next predictively most-alike segment area; transmitting segmentation boundary information, walk definition information and/or prediction model information to a compression engine; generating redirection vectors (e.g., **146*b*, 146*b'* of FIG. 1B**) and so on.

Reservation of Extra-Patent Rights, Resolution of Conflicts, and Interpretation of Terms After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and to other otherwise-protectable subject matter included herein or otherwise derivable herefrom.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Unless expressly stated otherwise herein, ordinary terms have their corresponding ordinary meanings within the respective contexts of their presentations, and ordinary terms of art have their corresponding regular meanings within the relevant technical arts and within the respective contexts of their presentations herein.

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications including those filed pursuant to 35 U.S.C. §120 and/or 35 U.S.C. §251.

What is claimed is:

1. A mechanism for reducing storage size needed for information represented by input data present in a randomly accessible memory window, the mechanism comprising:
   (a) a prediction-based entropy encoder operatively coupled to receive an input data stream sourced from the memory window;
   (b) a walk generator operatively coupled to the memory window for defining a sequence of address signals supplied to the memory window;
   (c) a compression efficiency evaluator operatively coupled to measure a length of encoded output produced by the entropy encoder in response to an input data stream received from the memory window for a given sequence of address signals defined by said walk generator and operatively coupled to measure a length of input data stream supplied to the entropy encoder in response to the given sequence of address signals; the compression efficiency evaluator calculating a corresponding compression efficiency value as a function of said measured lengths of encoded output and length of input data stream; and
   (d) a walk modifier operatively coupled to the compression efficiency evaluator and to the walk generator and structured to supply two or more different walk definitions to the walk generator and structured to determine, by trial and error operation of the walk generator and of the encoder, which of the two or more walk definitions causes the compression efficiency evaluator to calculate a superior compression efficiency value.

2. The storage size reducing mechanism of claim 1 wherein:
   (c.1) said length of encoded output is measured so as to indicate number of bits of encoded output.

3. The storage size reducing mechanism of claim 1 wherein:
   (c.1) said length of encoded output is measured so as to indicate number of storage words consumed by the encoded output.

4. The storage size reducing mechanism of claim 1 wherein:
   (c.1) said length of input data stream is measured so as to indicate number of bits of plaintext input.

5. The storage size reducing mechanism of claim 1 wherein:
   (c.1) said length of input data stream is measured so as to indicate number of symbol of plaintext input where the symbols are those of a predefined alphabet.

6. The storage size reducing mechanism of claim 1 wherein:
   (c.1) said length of input data stream is measured so as to indicate number of storage words consumed by the input data stream.

7. The storage size reducing mechanism of claim 1 and further comprising:
   (e) a walk definition storage for storing at least a walk definition that has been determined to be a currently used one, the walk definition storage being operatively coupled to the walk generator for causing the walk generator to trace along one or more walk definitions stored therein.

8. The storage size reducing mechanism of claim 7 and further comprising:
   (f) a variable bit sampler operatively coupled to the memory window for defining subsets of bits to be optionally excluded from the input data stream received by the entropy encoder.

9. The storage size reducing mechanism of claim 1 wherein:
   (a.1) the prediction-based entropy encoder includes an adaptive predictor that maintains a variable prediction model corresponding to a history of received data received in the input data stream, where the predictor outputs a forecast upon which the encoder relies when performing its encoding operations; and
   (b.1) the walk generator is structured to cause sequences of address signals to be supplied to the memory window so that sequentially efficiently compressible (SEC) data sequences will be supplied to the entropy encoder as the input data stream received from the memory window.

10. The storage size reducing mechanism of claim 9 wherein:
    (b.2) the walk generator is structured to generate U-turning address walks within predefined segment areas of the memory window.

11. The storage size reducing mechanism of claim 10 wherein:
    (b.3) the U-turning address walks are major walks that step from one predefined memory tile area to a next adjacent memory tile area; and
    (b.4) the walk generator is structured to generate in-tile minor address walks within the memory tile areas where each in-tile minor address walk steps from a first subarea of its respective tile area to a touching next subarea of the respective tile area.

12. The storage size reducing mechanism of claim 11 wherein:
    (b.5) the walk generator is structured to generate different in-tile minor address walks depending on direction of stepping of the major walk from one predefined memory tile area to the next.

13. The storage size reducing mechanism of claim 12 wherein:
    (a.2) the adaptive predictor is responsive at least to the direction of the current major walk when generating a current probabilities forecast for use by the encoder.

14. The storage size reducing mechanism of claim 4 wherein:
    (b.1) the walk generator is structured to generate jumping address walks between spaced apart ones of predefined segment areas of the memory window.

15. The storage size reducing mechanism of claim 1 and further comprising:
    (e) a pre-compression data definer operatively coupled to the memory window for defining data contained in the memory window prior to a supplying of a given input data stream from the memory window and towards the entropy encoder.

16. The storage size reducing mechanism of claim 15 wherein:
    (e.1) said defining of data contained in the memory window prior to a supplying includes packing into the memory window fragments from different files where the packed in file fragments are perfectly-alike and/or are predictively alike with respect to one another.

17. The storage size reducing mechanism of claim 15 wherein:
    (e.1) said defining of data contained in the memory window prior to a supplying includes packing into the memory window different files where the packed in files are perfectly-alike and/or are predictively alike with respect to one another.

18. The storage size reducing mechanism of claim 15 wherein:

(e.1) said defining of data contained in the memory window prior to a supplying includes packing into the memory window fragments from different files where the packed in file fragments are sequenced so as to be progressively-alike with respect to one another.

19. The storage size reducing mechanism of claim 15 wherein:
(e.1) said defining of data contained in the memory window prior to a supplying includes packing into the memory window different files where the packed in files are sequenced by the pre-compression data definer so as to be progressively-alike with respect to one another.

20. The storage size reducing mechanism of claim 15 wherein:
(e.1) said defining of data contained in the memory window prior to a supplying includes causing a first intercept vector to point to data placed within the memory window.

21. The storage size reducing mechanism of claim 15 wherein:
(e.1) said defining of data contained in the memory window prior to a supplying includes fixing predefined insignificant bits within data words of the memory window to zero or another predefined pattern.

22. The storage size reducing mechanism of claim 15 wherein:
(e.1) said defining of data contained in the memory window prior to a supplying includes subtracting a predefined DC bias from data words of the memory window that belong to one or more segments identified for such removal of a DC bias.

23. The storage size reducing mechanism of claim 15 wherein:
(e.1) said defining of data contained in the memory window prior to a supplying includes subtracting a predefined perfectly-ordered sequence from a corresponding sequence of data words of the memory window that belong to one or more segments identified for such removal of a perfectly-ordered sequence.

24. The storage size reducing mechanism of claim 15 wherein:
(e.1) said defining of data contained in the memory window prior to a supplying includes replacing data values found in one or more identified segments of the memory window with index values obtained from a predefined substitution table where said one or more identified segments are pre-identified for such value substitution.

25. The storage size reducing mechanism of claim 1 wherein:
(d.1) said walk modifier is configured to automatically smooth out boundaries of initially defined segment areas that respectively identify groups of data sequence segments within the memory window.

26. The storage size reducing mechanism of claim 25 wherein:
(d.1a) said automatic smooth out produces boundary definitions that are expressible as one or more linear equations.

27. The storage size reducing mechanism of claim 25 wherein:
(d.1a) said automatic smooth out produces boundary definitions that are expressible as one or more Bezier curves.

28. The storage size reducing mechanism of claim 25 wherein:
(d.2) after said automatic smooth out, the walk modifier submits the corresponding modified walk definition to the walk generator and the walk modifier determines by trial and error operation of the walk generator and of the encoder with use of the modified walk definition, whether the modified walk definition reduces compression efficiency by more than a predefined percentage or amount relative to a compression efficiency earlier calculated by the compression efficiency evaluator for a predefined pre-modification walk.

29. The storage size reducing mechanism of claim 1 wherein:
(a.1) said entropy encoder includes an arithmetic encoder.

30. The storage size reducing mechanism of claim 1 wherein:
(a.1) said entropy encoder implements a Burrows-Wheeler Transform (BWT).

31. The storage size reducing mechanism of claim 1 wherein:
(a.1) said entropy encoder implements a Move To Front process.

32. The storage size reducing mechanism of claim 1 wherein:
(a.1) said entropy encoder includes a Run Length encoder.

33. The storage size reducing mechanism of claim 1 wherein:
(a.1) said entropy encoder includes a Huffman encoder.

* * * * *